United States Patent [19]

Inoue et al.

[11] Patent Number: 5,504,758
[45] Date of Patent: Apr. 2, 1996

[54] ERROR-CORRECTING APPARATUS

[75] Inventors: Sadayuki Inoue; Junko Ishimoto, both of Nagaokakyo; Takahiko Nakamura, Kamakura; Makoto Kumano, Nagaokakyo, all of Japan

[73] Assignee: Mitsubishi Denki Kabushiki Kaisha, Kyoto, Japan

[21] Appl. No.: 53,497

[22] Filed: Apr. 28, 1993

[30] Foreign Application Priority Data

Apr. 28, 1992 [JP] Japan ................................. 4-109402
Jul. 10, 1992 [JP] Japan ................................. 4-183742

[51] Int. Cl.[6] ................................................. G06F 11/10
[52] U.S. Cl. ............................................. 371/37.1; 371/37.6
[58] Field of Search ........................... 271/37.1, 37.2, 271/37.6, 37.7, 38.1, 39.1

[56] References Cited

U.S. PATENT DOCUMENTS

| | | | |
|---|---|---|---|
| 4,597,083 | 6/1986 | Stenerson | 371/37.1 |
| 4,747,103 | 5/1988 | Iwamura et al. | 371/37.1 |
| 5,099,483 | 5/1992 | Kadokawa | 371/37.1 |

FOREIGN PATENT DOCUMENTS

| | | |
|---|---|---|
| 63-157530 | 6/1988 | Japan . |
| 63-167527 | 7/1988 | Japan . |
| 1236735 | 9/1989 | Japan . |
| 1276825 | 11/1989 | Japan . |
| 363973 | 3/1991 | Japan . |
| 3172027 | 7/1991 | Japan . |

OTHER PUBLICATIONS

*Code Theory*, by Hideki Imai, pp. 115-115, 165-166, Electronic Data Transmssion Society.

"An Experimental Home–Use Digital VCR with Three Dimensional DCT and Superimposed Error Correction Coding", IEEE Transactions on Consumer Electronics, vol. 37, No. 3, Aug. 1991.

Controller for Optical Disk Apparatus: Real–time Error Correction Conducting Hardware Processing, Nikkei Electronics, pp. 167–177, May 1, 1989.

*Primary Examiner*—Roy N. Envall, Jr.
*Assistant Examiner*—Thomas E. Brown

[57] ABSTRACT

In an error-correcting apparatus for correcting errors included in reproduced data which are stored in a RAM, a syndrome generation circuit, a polynomial calculation circuit for calculating an error position polynomial and an error value polynomial, and a position calculation circuit for calculating an error position are operated in parallel. A divider section of the error-correcting apparatus has a divider for performing the division of highest-degree coefficients of two polynomials, a multiplier for multiplying the coefficient of the polynomial set in the divisor side of the divider by the output of the divider, and an adder for adding the output of the multiplier and the coefficient of the polynomial set in the dividend side of the divider. The divider section executes the division over a Galois field while sequentially shifting the contents of registers which store the coefficient data of the dividend polynomial.

13 Claims, 37 Drawing Sheets

( ) : GAUSS' NOTATION

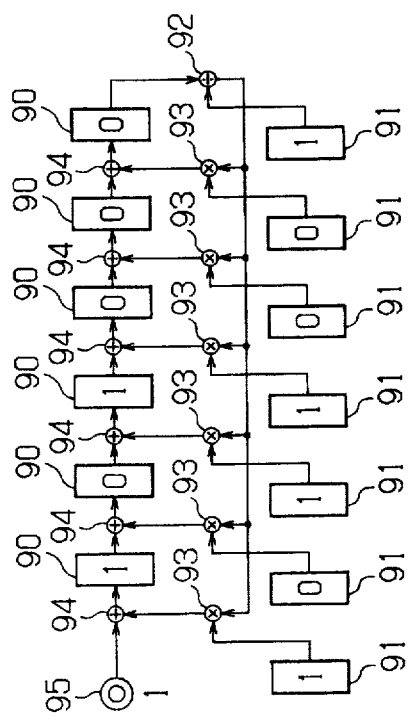
Fig. 14(c) Prior Art
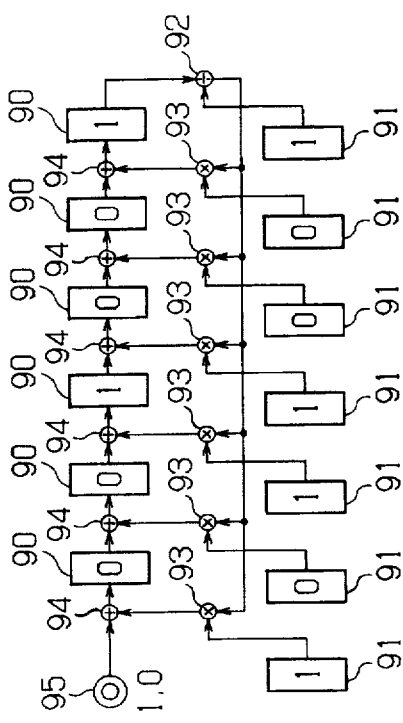
Fig. 14(d) Prior Art
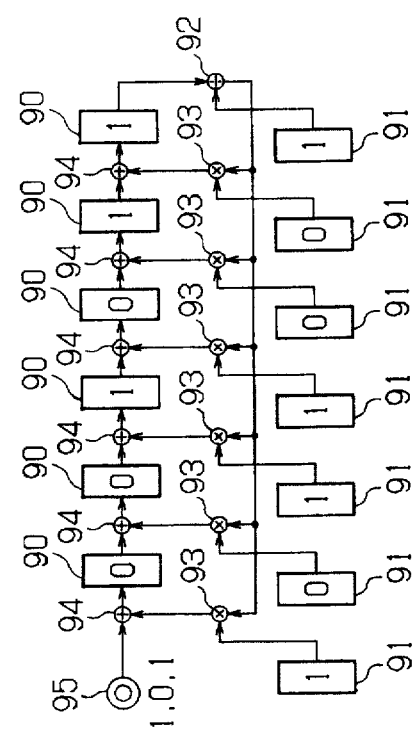
Fig. 14(a) Prior Art
Fig. 14(b) Prior Art

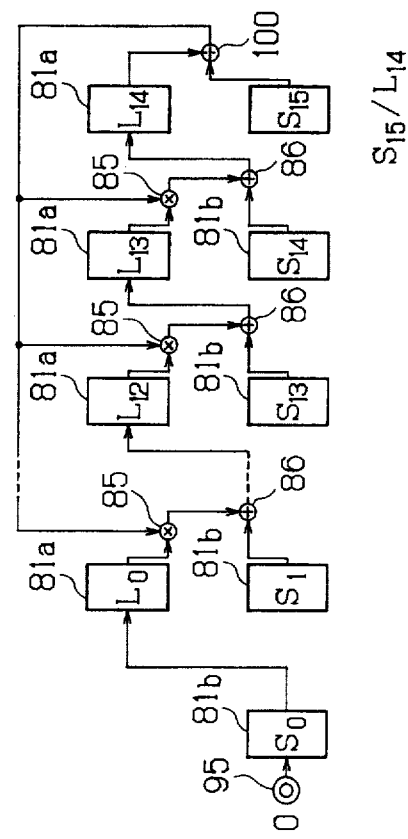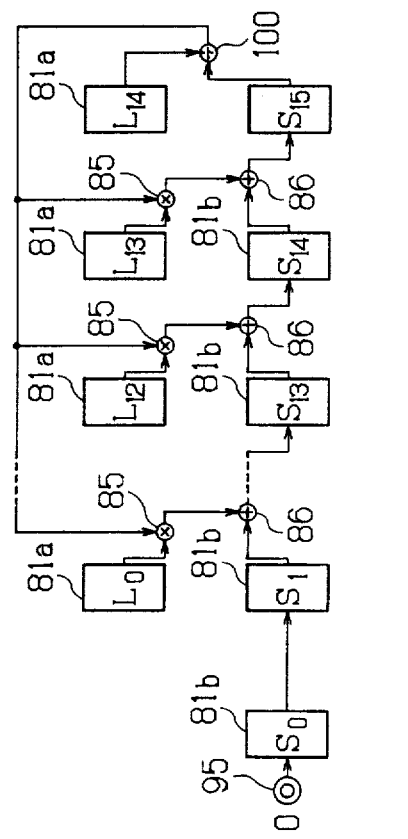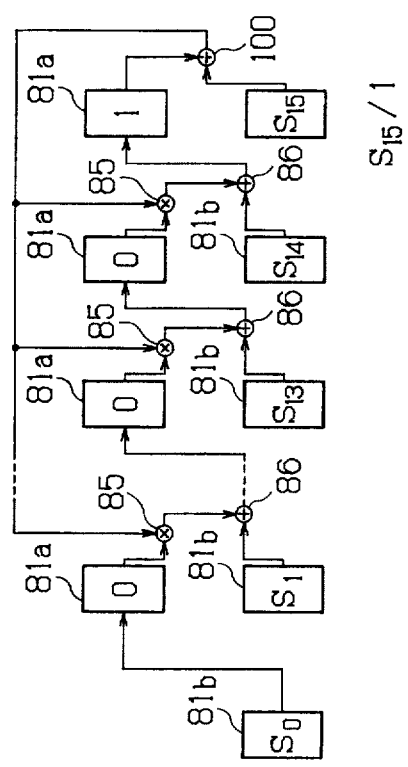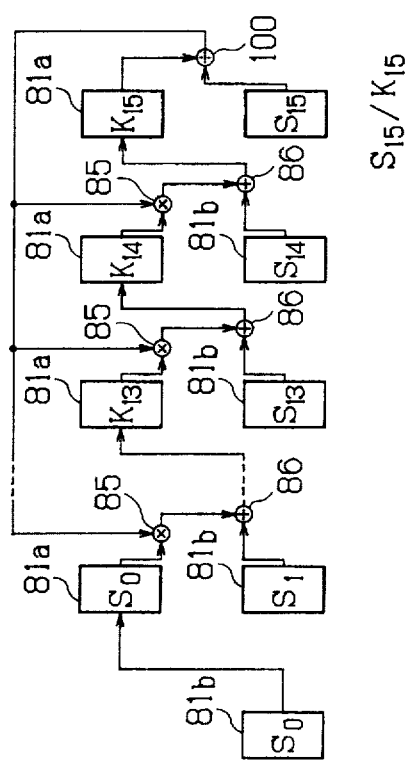

ERROR-CORRECTING APPARATUS

BACKGROUND OF THE INVENTION

1. Field of the Invention

This invention relates to an error-correcting apparatus for correcting errors occurring in data which are coded using error-correcting codes, and particularly to an error-correcting apparatus for rapidly correcting errors occurring in reproduced or received digital signals in a compact disk player (hereinafter, referred to as "CD"), a digital audio player (hereinafter, referred to as "DAT"), a digital video signal record/reproduction apparatus (hereinafter, referred to as "digital VTR"), etc.

2. Description of the Related Art

In PCM (Pulse Code Modulation) recording and reproduction having typical examples such as a CD, DAT and digital VTR, an error correction using error-correcting codes is performed, Hereinafter, an error-correcting apparatus for performing an error correction will be described in which a Reed-Solomon code defined over a Galois field GF(q) is used as an error-correcting code which is actually used in a CD, DAT and digital VTR., When multiple words are to be subjected to an error correction using a Reed-Solomon code, it is necessary to generate a syndrome from received data and obtain coefficients of an error position polynomial and error value polynomial. As examples of the method of obtaining coefficients of polynomials, known are the Euclidean algorithm, the Barlekamp's algorithm, etc. For example, the Euclidean algorithm is an algorithm of obtaining the greatest common polynomial of two given polynomials. That is, in the Euclidean algorithm, a division of polynomials using elements of a Galois field GF(q) as coefficients is performed to obtain an error position polynomial and error value polynomial. The Euclidean algorithm will be described in detail later.

Hereinafter, a description of a sequence of an error-correcting decoding of multiple words according to a Reed-Solomon code will be given. Generally, a Reed-Solomon code is decoded in the following sequence:

(1) A syndrome $S_i$ is obtained from received data (syndrome generation).

(2) An error position polynomial $\sigma(z)$ and an error value polynomial $\omega(z)$ are obtained from the obtained syndrome $S_i$ (using the Euclidean algorithm, the Barlekamp's algorithm or the like).

(3) An error position is obtained from the error position polynomial $\sigma(z)$ (chain search).

(4) An error value is obtained from the error position and the error value polynomial $\omega(z)$.

(5) An error of the received data is corrected on the basis of the error position and the error value (error correction).

Hereinafter, a method of decoding a Reed-Solomon code defined over a Galois field $GF(2^8)$ will be described.

When a received polynomial is represented by X(z) and a generator polynomial by G(z), a syndrome S is given by the following equation:

$$S(z) = X(z) \bmod G(z)$$
$$= S_0 + S_1 \times z + \ldots + S_k \times z^k$$

In the description of the prior art, the case where a Reed-Solomon code having a code length of n is decoded will be described.

Next, an error position polynomial $\sigma(z)$ and an error value polynomial $\omega(z)$ are obtained from the syndrome S (S(z)). Hereinafter, a method of calculating the error position polynomial and error value polynomial according to the Euclidean algorithm will be briefly described. The Euclidean algorithm consists of a repetition of divisions of polynomials defined over a Galois field, and can be expressed as follows. That is, in the Euclidean algorithm, divisions of two polynomials A(z) and B(z) defined over a Galois field, A(z) /B(z)=$Q_0$(z) (quotient) . . . $R_0$(z) (remainder)

B(z) /$R_0$(z)=$Q_1$(z) (quotient.) . . . $R_1$(z) (remainder)

$R_0$(z)/$R_1$(z)=$Q_2$(z) (quotient) . . . $R_2$(z) (remainder)

are repeated until predetermined conditions are satisfied.

In an error-correcting code used in an optical disk, for example, a Reed-Solomon code having the minimum Hamming distance of 17 is employed, and therefore two polynomials are expressed as follows:

$$\begin{aligned} A(z) &= z^{16} \\ B(z) &= S(z) \\ &= S_0 + S_1 \times z + \ldots S_{15} \times z^{15} \end{aligned}$$

The divisions are repealed until the degree of the remainder polynomial is reduced to 7 or less. (In this example, the erasure is not considered.)

FIG. 1 is a flowchart of the process of obtaining solutions (error position polynomial and error value polynomial) of a basic equation according to the Euclidean algorithm. Initially, in step S1, each values are set to their respective initial values. The calculations illustrated in steps S2 and S3 are executed. If the judgment in step S4 is NO, the polynomials are set as illustrated in step S5, and the process returns to step S2. If the judgment in step S4 is YES, an error position polynomial $\sigma(z)$ and an error value polynomial $\omega(z)$ are obtained in step S6. In the figure, the symbol $\diamond$ represents the Gauss' notation.

According to the Euclidean algorithm, therefore, an error position polynomial $\sigma(z)$ and an error value polynomial $\omega(z)$ can be obtained from a Reed-Solomon code having the minimum Hamming distance of 17, by performing divisions of polynomials over a Galois field eight times at the maximum.

An error position is obtained from the error position polynomial $\sigma(z)$ obtained according to the Euclidean algorithm. For this purpose, a method which is called a chain search is usually employed. In this method, powers $\alpha^i$ (i=0, 1, 2, . . . , n−1) of $\alpha$ (which is an element over a Galois field $GF(2^8)$) are sequentially substituted in the error position polynomial $\sigma(z)$, thereby obtaining the root $\alpha^i$ (corresponding to the error position) of $\sigma(z)$ in which $\sigma(\alpha^i)$ is 0. In the above, n represents the code length.

According to this method, in order to calculate an error position, an n number of ($\alpha^0$ to $\alpha^{n-1}$) over $GF(2^8)$ corresponding to the code length are sequentially substituted in the error position polynomial $\sigma(z)$ to calculate $\alpha^i$ (corresponding to the error position) in which $\sigma(z)$ =0. Therefore, the step number of the calculation is n (code length).

Next, a prior art error-correcting apparatus will be described. FIG. 2 is a block diagram schematically showing the configuration of a prior art error-correcting apparatus for decoding a Reed-Solomon code. In the figure, 1 designates a RAM for storing data which are to be subjected to the error correction, 2 designates a syndrome generator for generating a syndrome from a received word, 3 designates an error-correcting arithmetic circuit for performing the error correction on the basis of a received syndrome from the syndrome generator 2, and 4 designates an error-correcting controller for controlling the entire the error-correcting apparatus.

FIG. 3 shows a specific circuit configuration of the syndrome generator 2. The reference numeral 10 designates registers for temporarily storing input data, 11 designates multipliers in which coefficients of the generator polynomial of a Reed-Solomon code are used as a multipliers, and 12 designates adders. The registers 10, the multipliers 11 and the adders 12 constitute the syndrome generator 2.

FIG. 4 shows a specific circuit configuration of the error-correcting arithmetic circuit 3. The reference numeral 20 designates a Euclidean arithmetic circuit for calculating an error position polynomial $\sigma$ (z) and an error value polynomial $\omega$ (z) in accordance with the Euclidean algorithm shown in FIG. 1, 21 designates a chain search circuit for calculating an error position from coefficient data of the error position polynomial $\sigma$ (z) output from the Euclidean arithmetic circuit 20, and 22 designates an error-correcting circuit For calculating an error value on the basis of coefficient data of the error value polynomial $\omega$ (z) output from the Euclidean arithmetic circuit 20 and error position data output from the chain search circuit 21, and for performing an error correction. The Euclidean arithmetic circuit 20, the chain search circuit 21 and the error-correcting circuit 22 constitute the error-correcting arithmetic circuit 3.

FIG. 5 is a block diagram of a divider section of the Euclidean arithmetic circuit 20 which performs a division on the polynomials over a Galois field. In the figure, 50 and 51 designate input terminals, 52a and 52b designate registers for storing coefficient data of divisor and dividend polynomials, 53 designates selectors, 54 designates multipliers, and 55 designates adders. The registers 52a and 52b, the selectors 53, the multipliers 54 and the adders 55 constitute the divider section for a division of the polynomials over a Galois field in the Euclidean arithmetic circuit 20.

FIG. 6 shows a specific circuit configuration of the chain search circuit 21. The reference numeral 31 designates feedback registers to which setting coefficient data of the error position polynomial $\sigma$ (z) are set at the start of a chain search, and thereafter outputs of sequential multipliers 32 are sequentially set, 32 designates multipliers, 33 designates an adder, 34 designates a judging circuit for judging whether the output of the adder 33 is 0 or not, 35 designates a coefficient counter for counting the number of feedback operations performed by the feedback registers 31, and 36 designates a register for storing the contents of the coefficient counter 35 in response to the 0-judgment output from the judging circuit 34. The Feedback registers 31, the multipliers 32, the adder 33, the judging circuit 34, the coefficient counter 35 and the register 36 constitute the chain search circuit 21.

With reference to FIGS. 2 to 6, the operation of error-correcting apparatus will be described. When an error correction is started, received or reproduced data which are stored in the RAM 1 and include errors occurring during the receiving or reproduction process are read out from the RAM 1 in order to generate a syndrome in the syndrome generator 2. In the syndrome generator 2, the data read out from the RAM 1 (in the form of a received polynomial) is divided by a generator polynomial to generate a syndrome. The address from which the received data are read out and the reading control signal are supplied from the error-correcting controller 4.

The syndrome generator 2 having the circuit configuration shown in FIG. 3 consists of the registers 10 arranged in the form of a shift, register, the multipliers 11 in which input data (feedback data) are multiplied by coefficient data corresponding to the terms of the generator polynomial, and the adders 12. In the syndrome generator 2, input data are shifted while sequentially calculating them in the arithmetic circuits, thereby executing the division of polynomials over a Galois Field. Accordingly, the execution of the arithmetic requires steps the number of which corresponds to the code length (i.e., n steps), The detail of the syndrome generator 2 is described by "Code Theory" pp. 115–118, written by Hideki Imai, published by electronic data transmission society.

The syndrome generated by the syndrome generator 2 in the manner described above is output together with a syndrome generation end signal to the error-correcting arithmetic circuit 3 and the error-correcting controller 4. The error-correcting controller 4 generates a Euclidean arithmetic start signal in response to the syndrome generation end signal, and supplies it to the error-correcting arithmetic circuit 3. In the error-correcting arithmetic circuit 3 which receives the Euclidean arithmetic start signal, the Euclidean arithmetic circuit 20 calculates an error position polynomial $\sigma$ (z) and an error value polynomial $\omega$ (z) on the basis of the syndrome output from the syndrome generator 2.

Next, the operation of the divider section of the Euclidean arithmetic circuit 20 which is shown in FIG. 5 will be described. When a syndrome generation end signal is input, the registers 52 are set to the respective initial values. More specifically, $Z^{2t}$ is set in the upper registers 52a, and the coefficients of the syndrome polynomial calculated by the syndrome generator 2 are set in the lower registers 52b. While shifting the data of the dividend side (initially, the upper registers 52a in which the data of $Z^{2t}$ are set), divisions of polynomials over a Galois field are executed. The divisions are repeated until the degree of the polynomial of the dividend side is reduced to a value less than that of the polynomial of the divisor side. In FIG. 5, the divider section is so configured that the selectors 53 connected to the registers 52 of the dividend side select the outputs of the respective adders 55, and that the selectors 53 connected to the registers 52 of the divisor side select the outputs of the respective registers 52. As a result, the data in the registers 52 of the dividend side are shifted and a division is executed.

As a result of the division, the registers of the dividend side store the remainder of this division. Thereafter, a further division is performed while setting the polynomial stored in the divisor registers as the dividend, and the remainder of this division as the divisor. This exchange of the dividend and the divisor is done by switching the outputs of the selectors 53. This operation is repeated until the termination conditions shown in FIG. 1 are satisfied. When the conditions are satisfied, the Euclidean arithmetic circuit 20 calculates coefficient data of the error position polynomial and error value polynomial, and outputs the calculated coefficient data together with a Euclidean arithmetic end signal to the chain search circuit, 21 and the error-correcting controller 4. The divider section of the Euclidean arithmetic circuit 20 is described in Japanese Patent Application Laid-Open No. HEI1-276,825 (1989).

The error-correcting controller 4 outputs a chain search start signal for starting the operation of the chain search circuit 21, in response to the Euclidean arithmetic end signal from the Euclidean arithmetic circuit 20. Upon receiving the chain search start signal, the chain search circuit 21 calculates the error position on the basis of the coefficient data of the error position polynomial $\sigma$ (z) calculated by the Euclidean arithmetic circuit 20. Referring to FIG. 6, the operation of the chain search circuit 21 will be specifically described. In the chain search circuit 21, when the chain search start signal is input, the coefficient counter 35 is set to 0, and the feedback registers 31 are respectively set to the coefficient data of the error position polynomial σ (z) calculated by the Euclidean arithmetic circuit 20. The outputs of the feedback registers 31 are respectively multiplied by the multipliers which are previously set in the multipliers 32, and then latched again in the feedback registers 31.

In the adder 33, the outputs of the feedback registers 31 are added with each other. The judging circuit 34 checks the result of this addition to judge whether it is 0 or not. If the result is 0, the value of the coefficient counter 35 is written into the register 36 (this counter value corresponds to the error position). For the completion of the chain search, n steps are required. The chain search circuit 21, is described in detail in the above-mentioned "Code Theory" pp. 165–166.

In the error-correcting circuit 22, on the basis of the error position data from the chain search circuit 21, erroneous data stored in the RAM 1 are at first read out. At the same time, the error-correcting circuit 22 obtains error values on the basis of the error value polynomial ω (z) from the Euclidean arithmetic circuit 20 and the error position data from the chain search circuit 21. The erroneous data read out from the RAM 1 are added with the above-mentioned error values to be subjected to an error correction. The data which have been subjected to an error correction are replaced with the erroneous data in the RAM 1. Hereinafter, data which has been subjected to an error correction is referred to as "error-corrected data".

FIG. 7 shows a simple flow of encoding and decoding processes in the error-correcting apparatus which is applied to a digital VTR. In FIG. 7, data which have been input, to the error-correcting apparatus are divided into a plurality of unit data blocks. Generally, error-correcting codes are double-encoded. In this case, plural one of the unit data blocks are arranged two-dimensionally as shown in FIG. 8. To the arranged blocks, an error-correcting encoder adds error-correcting codes in the vertical direction (C2 codes), and then error-correcting codes in the recording direction (C1 codes). The code configuration shown in FIG. 8 is described in "AN EXPERIMENTAL HOME-USE VCR WITH THREE DIMENSIONAL DCT AND SUPERIMPOSED CORRECTION CODING", IEEE TRANSACTIONS ON CONSUMER ELECTRONICS, Aug. 1991, Vol. 37, No. 3, as an example of an error-correcting code which is used in a home-use digital VTR. FIG. 9 shows a code configuration of one line in the recording direction shown in FIG. 8. In a digital VTR, data added with error-correcting codes are recorded on a recording medium, or, in a communication unit, transmitted to a communication channel. Data reproduced From the recording medium are subjected to an error-correcting process in order to correct errors which occurred in the reproduction process. In the error-correcting process, errors included in the reproduced data are corrected or detected. The error-corrected data are sent to the process of the next step.

Next, the signal process timing of each portion of the prior art error-correcting apparatus in which the data of one line shown in FIG. 9 are to be decoded will be described with reference to a timing chart shown in FIG. 10. FIG. 10 illustrates various control signals output From the error-correcting controller 4 (a syndrome generation start signal, the Euclidean arithmetic start signal, the chain search start signal, and an error correction start signal), operation timings of the circuits (the syndrome generation timing of the syndrome generator 2, the arithmetic timing of the Euclidean arithmetic circuit 20, the arithmetic timing of the chain search circuit 21, and the error correction timing of the error-correcting circuit 22), and the data access state of the RAM 1. When an error correction is started, the error-correcting controller 4 outputs the syndrome generation start signal to the syndrome generator 2, and generates addresses of the RAM 1 from which reproduced data including errors caused in the reproduction process are to be read out, and also control signals. Upon receiving the syndrome generation start signal, the syndrome generator 2 sets the values of the registers 10 to 0, and performs a predetermined arithmetic (division) process on the data read out from the RAM 1. As described above, in the syndrome generation, the number of steps required for the completion of the arithmetic corresponds to the code length, or 241 steps are required. This arithmetic time is indicated by portions labeled SY in FIG. 10.

After the syndrome generation is ended, the syndrome generator 2 outputs the syndrome generation end signal. In response to the syndrome generation end signal, the error-correcting controller 4 outputs the Euclidean arithmetic start signal. The Euclidean arithmetic circuit 20 which receives the Euclidean arithmetic start signal performs the division of the polynomials over a Galois field $GF(2^8)$ in the manner described above, and calculates an error position polynomial σ (z) and an error value polynomial ω (z). When a Reed-Solomon code having the minimum distance of 17 used in this prior art example is to be decoded using the Euclidean algorithm (or the error position polynomial σ (z) and error value polynomial ω (z) are to be calculated), the calculation can be completed by repeating the division of the polynomials eight times at the maximum. This arithmetic time is indicated by portions labeled EU in FIG. 10. The number of steps required in this process varies depending on the whole circuit configuration of the Euclidean arithmetic circuit 20. The process of calculating the error position polynomial σ (z) and error value polynomial ω (z) from the Reed-Solomon code having the minimum distance of 17 shown in FIG. 9 with using the Euclidean algorithm can be realized by about 120 steps. The detailed description of the operation of the circuit is omitted. The decoding time in the Euclidean arithmetic circuit 20 requires about 120 steps in order to perform the operations including: the division operations in the divider; the operation of setting data; the generation of the control signals; the calculation of the error position polynomial σ (z) and error value polynomial ω (z); and the calculation of a modified syndrome in the case that an erasure is done (this operation is omitted in this example).

When the Euclidean arithmetic is ended, the Euclidean arithmetic circuit 20 outputs the Euclidean arithmetic end signal. In response to the Euclidean arithmetic end signal, the error-correcting controller 4 outputs the chain search start signal. In the chain search circuit 21 which receives the chain search start signal, the coefficient counter 35 is set to 0, and the feedback registers 31 are respectively sets to the coefficient data of the error position polynomial σ (z) calculated by the Euclidean arithmetic circuit 20. The outputs of the feedback registers 31 are respectively multiplied by the multipliers which are previously set in the multipliers 32, and then latched again in the feedback registers 31. The coefficient counter 35 counts the number of feedback operations performed by the feedback registers 31. In the adder 33, the outputs of the feedback registers 31 are added with each other. The judging circuit 34 checks the result of this addition to judge whether it, is 0 or not. If the result is 0, the value of the coefficient counter 35 is written into the register 36. As described above, in the chain search circuit 21, the maximum number of steps required for the calculation of an error position corresponds to the code length, or 241 steps. This arithmetic time is indicated by portions labeled CH in FIG. 10.

When the chain search is ended, the chain search circuit 21 outputs a chain search end signal. In response to the chain search end signal, the error-correcting controller 4 outputs the error correction start signal. A detailed timing chart of the error-correcting circuit 22 is shown in FIG. 11. Upon receiving the error correction start signal, the error-correcting circuit 22 calculates an error value, using the error value polynomial ω (z) and the error position data from the chain search circuit 21. On the other hand, the error-correcting controller 4 reads out erroneous data from the RAM 1 on the basis of the error position data. The erroneous data read out, from the RAM 1 is added with the error value at the timing off the next clock pulse, to be subjected to the error correction. The error-corrected data is written again into the RAM 1 at the next clock pulse. Therefore, the process of executing the error correction of one symbol in the error-correcting circuit 22 requires a period of at least 3 clock pulses, resulting in error correction of eight symbols which requires at least 24 steps.

An error-correcting apparatus is an essential apparatus for a process of correcting errors occurring in signals reproduced in a CD, DAT or digital VTR or in a transmitted signal. However, a prior art error-correcting apparatus has the following problems. One of the problems is that the decoding time required for performing an error correction on one line in a prior art error-correcting apparatus is very long as shown in FIG. 10. In the prior art example, although circuit architecture for a high speed arithmetic is employed in the divider section of the Euclidean arithmetic circuit 20, the process of decoding the C1 block of one line shown in FIG. 9 requires the decoding time of 626 steps (241+120+241+24=626). Several kinds of circuit architecture for increasing the operation speed of the Euclidean arithmetic circuit 20 shown in FIG. 5 are disclosed in several Japanese Patent Applications. Even when the arithmetic time of the Euclidean arithmetic circuit 20 is shortened, however, the process times of the syndrome generation, the chain search, etc. cannot be shortened, with the result that the required process time may not be maintained in an apparatus such as a digital VTR which needs a real time and high speed signal processing.

A circuit configuration for increasing the operation speed of an error-correcting apparatus is proposed in Japanese Patent Application Laid-Open No. HEI3-63,973 (1991). In this configuration, the syndrome generator 2 and error-correcting arithmetic circuit 3 shown in FIG. 4 are operated in parallel. Referring to a timing chart of FIG. 12, the operation of the proposed error-correcting apparatus will be described. Upon receiving a parallel operation start signal, the syndrome generator 2 starts the syndrome generation. At the same time, the Euclidean arithmetic circuit 20 of the error-correcting arithmetic circuit 3 calculates in the above-mentioned manner the error position polynomial σ (z) and an error value polynomial ω (z), according to the Euclidean algorithm. When the arithmetic in the Euclidean arithmetic circuit 20 is completed, the chain search circuit 21 calculates an error position on the basis of the coefficient data of the error position polynomial. After the calculation of the error position in the chain search circuit 21, the error-correcting circuit 22 performs the error correction. The syndrome generator 2, the Euclidean arithmetic circuit 20, the chain search circuit 21 and the error-correcting circuit 22 operate in the same manner as the above-described prior art example, and therefore the detailed description of their operation is omitted. The number of arithmetic steps in each of the circuits is shown in FIG. 12. FIG. 12 shows also the timings of various control signals output from the error-correcting controller 4 in the same manner as those in the above-mentioned prior art example, the operation timing of each circuit, and the data access state of the RAM 1. The parallel operation of the syndrome generator 2 and the error-correcting arithmetic circuit 3 reduces the minimum number of steps required for performing the error correction on the C1 block of one line shown in FIG. 9, to 385 steps.

Also in this prior art example, however, when a Reed-Solomon code having the form of a product code such as shown in FIG. 8 is to be decoded, the error correction according to C2 codes is performed after the completion of the error correction according to C1 codes. This requires a large number of decoding steps, resulting in that the decoding process cannot be conducted in real time. Furthermore, since the C2 decoding is performed on data which have been subjected to the C1 decoding, data must be read out again from the same RAM. As a result, a countermeasure such as that error-correcting apparatus are connected in parallel to perform a concurrent processing must be taken, thereby arising problems such as that the circuit scale is enlarged.

As shown in FIGS. 3 and 6, in the syndrome generator 2 and the chain search circuit 21, the outputs of the registers are connected in series or parallel with the multipliers and adders in which the outputs are multiplied or added by a constant over a Galois Field. From the view point of hardware, this means that signals must pass through four stages of EX-OR gates at the maximum. By contrast, in the Euclidean arithmetic circuit 20, signals must pass through about seven stages of EX-OR gates and several selectors (these stage numbers may vary depending on the hardware configuration), thereby arising another problem in that it is difficult to increase the operation speed of the Euclidean arithmetic circuit 20 as compared with the syndrome generator 2 and the chain search circuit 21. There is a further problem in that the circuit scale of the Euclidean arithmetic circuit 20 is larger than that needed. Furthermore, the error correction oaf one symbol in the error-correcting circuit 22 requires at least 3 steps, thereby causing a problem in acceleration of the operation speed.

Recently, various companies are developing a digital VTR, and therefore the subject of increasing the operation speed of an error-correcting apparatus becomes important. FIG. 13 is a block diagram of a prior art divider section (hereinafter, referred to as "core circuit") for polynomials defined over a Galois field in the Euclidean arithmetic. The core circuit is disclosed in Japanese Patent Application Laid-Open No. HEI3-172,027 (1991). In the following description, it is assumed that the adders, multipliers and dividers described below are those for respectively executing the addition, multiplication and division operations over a Galois Field.

In the figure, 81a and 81b designate registers for storing coefficient data of a dividend polynomial and a divisor polynomial, 82 and 83 designate selectors which select either of the outputs of the registers 81a and 81b, 84 designates a divider, 85 designates multipliers, 86 designates adders, 95 designates an input terminal, and 87 and 88 designate degree detection circuits for detecting the degrees of polynomials stored in the registers 81a and 81b. The reference numeral 89 designates a Euclidean arithmetic controller which controls the entire operation. More specifically, the controller 89 controls the selectors 82 and 83, judges the termination conditions of the Euclidean algorithm on the basis of degree judgments output from the degree detection circuits 87 and 88, and performs other operations. The registers 81a and 81b, the selectors 82 and 83, the divider 84, the multipliers 85, the adders 86, the degree detection circuits 87 and 88, and the Euclidean arithmetic controller 89 constitute the divider section (core circuit) for polynomials defined over a Galois field in the Euclidean arithmetic circuit. This prior art example is so configured that registers closer to the right end store the highest-degree coefficient of polynomials.

Next, the operation principle of the divider which has the above-mentioned configuration and executes a division will be briefly described. A dividend polynomial and a divisor polynomial are expressed as follows:

Dividend polynomial: $M1(Z) = A_n Z^n + A_{n-1} Z^{n-1} + \ldots + A_1 Z^1 + A_c$ Divisor polynomial: $M2(Z) = B_m Z^m + B_{m-1} Z^{m-1} + \ldots + B_1 Z^1 + B_c$ where n>m. A longhand calculation procedure of the division is shown in Eq. 1 below.

$$\begin{array}{r} \dfrac{A_n}{B_m} Z^{n-m} + \left(A_{n-1} + \dfrac{A_n}{B_m} B_{m-1}\right) \dfrac{1}{B_m} Z^{n-m-1} \ldots \\ \hline B_m Z^m + B_{m-1} Z^{m-1} + \ldots B_1 Z + B_0 \Big) A_n Z^n + A_{n-1} Z^{n-1} + \ldots + A_1 Z + A_0 \\ A_n Z^n + \dfrac{A_n}{B_m} B_{m-1} Z^{n-1} + \ldots + \dfrac{A_n}{B_m} B_1 Z^{n-m+1} + \dfrac{A_n}{B_m} B_0 Z^{n-m} \\ \left(A_{n-1} + \dfrac{A_n}{B_m} B_{m-1}\right) Z^{n-1} + \ldots + \left(A_{n-m+1} + \dfrac{A_n}{B_m} B_1\right) Z^{n-m+1} + \left(A_{n-m} + \dfrac{A_n}{B_m} B_0\right) Z^{n-m} + \ldots + A_1 Z + A_0 \\ \left(A_{n-1} + \dfrac{A_n}{B_m} B_{m-1}\right) Z^{n-1} + \ldots + \dfrac{B_1}{B_m} \left(A_{n-1} + \dfrac{A_n}{B_m} B_{m-1}\right) Z^{n-m} + \dfrac{B_0}{B_m} \left(A_{n-1} + \dfrac{A_n}{B_m} B_{m-1}\right) Z^{n-m-1} \\ \vdots \\ \hline C_{m-1} Z^{m-1} + C_{m-2} Z^{m-2} + \ldots + C_1 Z + C_0 \end{array}$$ [Eq. 1]

$C_i$: Coefficient of remainder polynomial

As shown in Eq. 1, the calculation is repeated until the degree of the remainder of the dividend polynomial becomes smaller than the degree of the divisor polynomial. In Eq. 1, $$\begin{array}{r} \dfrac{B_m}{C_{m-1}} Z + \dfrac{1}{C_{m-1}} \left(B_{m-1} + \dfrac{B_m}{C_{m-1}} C_{m-2}\right) \\ \hline C_{m-1} Z^{m-1} + C_{m-2} Z^{m-2} + \ldots C_1 Z + C_0 \Big) B_m Z^m + B_{m-1} Z^{m-1} + \ldots + B_1 Z + B_0 \\ B_m Z^m + \dfrac{B_m}{C_{m-1}} C_{m-2} Z^{m-1} + \ldots + \dfrac{B_m}{C_{m-1}} C_1 Z^2 + \dfrac{B_m}{C_{m-1}} C_0 Z \\ \left(B_{m-1} + \dfrac{B_m}{C_{m-1}} C_{m-2}\right) Z^{m-1} + \ldots + \left(B_2 + \dfrac{B_m}{C_{m-1}} C_1\right) Z^2 + \left(B_1 + \dfrac{B_m}{C_{m-1}} C_0\right) Z + B_0 \\ \left(B_{m-1} + \dfrac{B_m}{C_{m-1}} C_{m-2}\right) Z^{m-1} + \ldots + \left(B_{m-1} + \dfrac{B_m}{C_{m-1}} C_{m-2}\right) \dfrac{C_2}{C_{m-1}} Z^2 + \left(B_{m-1} + \dfrac{B_m}{C_{m-1}} C_{m-2}\right) \dfrac{C_1}{C_{m-1}} Z + \left(B_{m-1} + \dfrac{B_m}{C_{m-1}} C_{m-2}\right) \dfrac{C_0}{C_{m-1}} \\ \hline D_{m-2} Z^{m-2} + D_{m-3} \end{array}$$ [Eq. 2]

$D_i$: Coefficient of remainder Polynomial the coefficient data of the last remainder polynomial are represented by $C_i (i=0, 1, 2, \ldots, m-1)$.

In the Euclidean algorithm shown in FIG. 1, when the degree of the remainder polynomial:

$R(Z) = C_{m-1} Z^{m-1} + C_{m-2} Z^{m-2} + C_1 + Z + C_0$ fails to satisfy the predetermined conditions, the division is repeated while setting the divisor polynomial M2(Z) as the dividend polynomial, and the remainder polynomial R(Z) as the divisor polynomial. In the divider of FIG. 13, the exchange of the divisor polynomial and the dividend polynomial is conducted by switching the selectors 82 and 83. This exchange operation will be described in detail later.

Similarly, Eq. 2 shows the calculation procedure of dividing M2(Z) by R(Z).

In this longhand calculation, for the sake of convenience, it is assumed that the highest degree $C_{m-1}$ of the remainder polynomial R(Z) is not 0. (When the highest degree is 0, generally, the degree detection circuits 87 and 88 shown in FIG. 13 judge the degrees of the dividend polynomial and divisor polynomial, the coefficient data of the dividend polynomial and divisor polynomial are shifted until the highest degrees of the dividend polynomial and the divisor polynomial are not 0, and thereafter the division is executed. Also when the highest degree of the remainder polynomial during the division becomes 0, similarly, the division is executed after the coefficient data of the remainder polynomial are shifted until the highest degree of the remainder polynomial is not 0.) In a similar manner as Eq. 1, the division operation is repeated until the degree of the remainder of the dividend polynomial becomes smaller than that of the divisor polynomial.

The coefficient data of the resultant remainder polynomial (indicated by R' (Z)) are represented by $D_i$(i=0, 1, 2, ..., m−2). When the degree of R' (Z) fails to satisfy the conditions shown in FIG. 1, the division is repeated while setting R(Z) as the dividend polynomial, and R' (Z) as the divisor polynomial. In the divider circuit, the exchange of the divisor polynomial and the dividend polynomial is conducted by switching the selectors 82 and 83 in the same manner as the above. This operation is executed until the termination conditions of the Euclidean algorithm are satisfied.

FIG. 14 is a diagram illustrating the operation principle of the circuit for performing the division of polynomials over a Galois field in the prior art example. In FIG. 14, 90 designates registers for storing coefficient data of the dividend polynomial, 91 designates registers for storing coefficient data of the divisor polynomial, 92 designates a divider, 93 designates multipliers, 94 designates adders, and 95 designates an input terminal. The registers 90 and 91, the divider 92, the multipliers 93 and the adders 94 constitute the divider for polynomials over a Galois field. Since FIG. 14 illustrates only the operation of dividing polynomials over a Galois field, some means such as exchange means for the Euclidean algorithm are not shown. In order to simplify the illustration, the degree detection circuit is omitted.

Next, the operation of performing a division of polynomials over a Galois field in the divider having the shift register of FIG. 14 will be described. The description deals with a division of the following dividend and divisor polynomials in the configuration of the divider shown in FIG. 14:

Dividend polynomial: $A(Z)=Z^8+Z^7+Z^5+Z^2+1$

Divisor polynomial: $B(Z)=Z^6+Z^3+Z^2+1$

In this prior art example, the coefficients of the dividend polynomial A(Z) are set in the registers 90, and the coefficient data of the divisor polynomial B(Z) in the registers 91. The division of the polynomials over a Galois field is executed by performing the arithmetic while sequentially shifting the contents of the registers 90 to the right in which the coefficient data of the dividend polynomial A(Z) and which are arranged in the form of a shift register. FIG. 14 shows also the contents of the coefficient data stored in the registers in the case that the dividend polynomial A(Z) is divided by the divisor polynomial B(Z).

Initially, as shown in FIG. 14(a), the coefficients of the dividend polynomial A(Z) are set in the registers 90, and the coefficient data of the divisor polynomial B(Z) in the registers 91. In this prior art example, the highest-degree coefficient is set in the right end register. The numerals in the boxes representing the registers and shown in the figure indicate the coefficient data which are set in the respective registers. While the arithmetic is performed in the state shown in FIG. 14(a) on each coefficient in the divider 92, multipliers 93 and adders 94, the coefficients of the dividend polynomial are shifted one place to the right, with the result that the contents of the registers are changed as shown in FIG. 14(b). The divider 92 are constructed so that the highest-degree coefficient of the dividend polynomial side is divided by the highest-degree coefficient of the divisor polynomial side.

The state of each coefficient is represented by a numeral. That is, in the registers 90 for storing the coefficient data of the dividend polynomial, a remainder obtained by dividing the dividend polynomial by the divisor polynomial and reducing the degree of the dividend polynomial by one is automatically set. This remainder is used as the dividend polynomial in the next division. After the second division is conducted in the same manner, the remainder is set in the registers 90 as shown in FIG. 14(c). The result of the third division conducted in the same manner is shown in FIG. 14(d). This division operation is repeated until the degree of the dividend polynomial becomes smaller than that of the divisor polynomial. In this prior art example, since the difference between the degree of the dividend polynomial A(Z) and that of the divisor polynomial B(Z) is two, the division operation is repeated three times.

The above process will be ascertained by long hand calculation. The procedure of longhand calculation in which the division of the polynomials over a Galois field (the above-mentioned division of A(Z)/B(Z)) is conducted is shown in Eq. 3 below.

$$\begin{array}{r}
Z^2+Z \phantom{aaaaaaaaaa} \\
Z^6+Z^3+Z^2+1 \overline{)\, Z^8+Z^7+Z^5+Z^2+1 \leftarrow (a)} \\
\underline{Z^8+Z^5+Z^4+Z^2} \phantom{aaaaa} \\
Z^7+Z^4+1 \phantom{aa} \leftarrow (b) \\
\underline{Z^7+Z^4+Z^3+Z} \phantom{aa} \\
Z^3+Z+1 \phantom{aaa} \leftarrow (c),(d)
\end{array}$$

[Eq. 3]

As seen from Eq. 3, the remainders of the division steps correspond to the states of FIGS. 14(a) to 14(d), respectively. In this case, the data stored in the registers 90 are the coefficient data of the remainder polynomial which is obtained by dividing the dividend polynomial by the divisor polynomial. Therefore, the employment of the divider in the form of a shift register as shown in FIG. 14 allows a division of polynomials over a Galois field to be performed for each polynomial.

Next, the operation of the divider section for the Euclidean arithmetic of the error-correcting apparatus for decoding a Reed-Solomon code in accordance with the Euclidean algorithm shown in FIG. 1 will be described with reference to FIG. 13. In the prior art example, a Reed-Solomon code having the minimum Hamming distance of 17 which is employed in an optical disk or the like is decoded. A syndrome polynomial S(Z) generated from a reproduced signal is expressed by $$S(Z)=S_{15}Z^{15}+S_{14}Z^{14}+S_{13}Z^{13}+S_1Z+S_c$$

When the Euclidean arithmetic is started, in response to the Euclidean arithmetic start signal from the Euclidean arithmetic controller 89, the coefficients of the dividend polynomial $Z^{2t}$(in this example, it is $Z^{16}$ because the code has the minimum Hamming distance of 17) which is the initial value are stored in the registers 81a, and the coefficient data of the syndrome polynomial S(Z) which is the divisor polynomial are stored in the registers 81b. In the counters of the degree detection circuits 87 and 88, the values of 16 and 15 which are the initial values of the respective degrees are set, respectively. The degree detection circuits 87 and 88 are constructed so that their count values are decremented by one each time the contents of the registers 81a and 81b storing the coefficient data of the dividend polynomial are shifted.

In this prior art example, registers closer to the right end store the coefficient data of the highest degree. At the same time, the degree detection circuit 88 checks the syndrome polynomial which is the divisor polynomial to judge whether tile coefficient data of the highest degree is 0 or not. When the coefficient data of the highest degree of the divisor polynomial (syndrome polynomial) detected in the degree detection circuit 88 is 0, the Euclidean arithmetic controller 89 controls the registers 81b storing the coefficient data of the divisor polynomial, so that the contents of the registers are shifted and this shifting operation is repeated until the data of the highest degree is not 0. In this case, the count value of the degree counter of the degree detection circuit 88 is decremented. When this operation is completed, the selectors 82 are controlled so as to select the outputs of the registers 81a, and the selectors 83 are controlled so as to select the outputs of the registers 81b.

The registers 81a which store the coefficient data of the dividend polynomial latch the output of the respective adder 86 when the clock signal is input. The registers 81b which store the coefficient data of the divisor polynomial retain the coefficient data. Although the specific control circuit is not shown in FIG. 13, the configuration for retaining the coefficient data of the divisor polynomial in the registers is realized by inhibiting the clock signals (clock 1 and clock 2) which are to be respectively supplied to the registers 81a and 81b, from being supplied to the registers which store the coefficient data of the divisor side. Alternatively, the configuration may be realized by connecting a selector before each of the registers 81a and 81b so that the selectors connected to the registers storing the coefficients of the dividend side select the outputs of the adders 86 and the registers storing the coefficients of the divisor side latch the outputs of themselves. The arithmetic circuits (the divider 84, the multipliers 85 and the adders 86) shown in the figure perform the arithmetic defined over a Galois field.

Hereinafter, referring to FIG. 15, the operation of the divider in the prior art Euclidean arithmetic circuit will be described. FIG. 15(a) shows the state where $Z^{16}$ which is the initial value is set as the dividend polynomial in the registers 81a and the syndrome polynomial S(Z) is set as the divisor polynomial in the registers 81b. The numerals and symbols in the boxes representing the registers indicate the coefficient data stored in the respective registers. In order to simplify the description, it is assumed that, in this prior art example, the highest-degree coefficient of the syndrome polynomial is not 0, and that coefficient data of the highest degree of the polynomials stored in the registers are positioned at the right end. In the figure, for the sake of the illustration of the operation, the outputs of the registers 81a and 81b are directly connected to the divider 84, the multipliers 85 and the adders 86 which are selected by the selectors 82 and 83, respectively.

The divider of FIG. 15 has the same configuration as that of the divider of FIG. 14, and performs the division by repeating the shift operation until the degree of the remainder of the dividend polynomial becomes smaller than the degree of the divisor polynomial. The end of the division is determined by the Euclidean arithmetic controller 89 on the basis of information indicative of the degrees and output from the degree detection circuits 87 and 88. FIG. 15(b) shows the state of the coefficient data stored in the registers 81a and 81b at the completion of the division operation. In the figure, $H_{14}$ to $H_c$ stored in the registers 81a are the coefficient data of the remainder polynomial.

Then, when the conditions (in this example, the degree of the remainder polynomial is 7 or less) for terminating the Euclidean arithmetic are satisfied judging from information indicative of the degree of the remainder polynomial which is output from the degree detection circuit 87 (or 88), the Euclidean arithmetic controller 89 terminates the Euclidean arithmetic. When the termination conditions are not satisfied, the controller 89 performs the arithmetic while the polynomial which is the divisor polynomial in the previous arithmetic is set as the dividend polynomial and the remainder polynomial as the divisor polynomial. At this time, the divider section (core circuit) in the Euclidean arithmetic circuit of FIG. 13 judges whether the highest degree of the divisor polynomial (the remainder polynomial) is 0 or not. If 0, the contents of the registers 81a are shifted until the highest degree of the divisor polynomial (the remainder polynomial) is not 0, and control signals for switching the outputs of the selectors 82 and 83 are thereafter produced so that the selectors 82 select the outputs of the registers 81b and the selectors 83 select the outputs of the registers 81a.

This connecting state is shown in FIG. 15(c). As shown in the figure, the exchange of the dividend and divisor polynomials is executed by changing the connections to the arithmetic circuits by the selectors 82 and 83. (The configuration of the circuit is the same as that of the divider of FIG. 14. ) In the same manner as the above-described example, the division is executed by repeating the shift operation while performing the arithmetic on the contents of the registers storing the coefficient data of the dividend polynomial, until the degree of the remainder of the dividend polynomial becomes smaller than the degree of the divisor polynomial. FIG. 15(d) shows the state of the coefficient data stored in the registers 81a and 81b at the completion of the division. In the figure, $I_{13}$ to $I_c$ stored in the registers 81b are the coefficient data of the remainder polynomial.

Then, the degree of the remainder polynomial is checked to judge whether or not the predetermined conditions are satisfied. If not, the connection states of the selectors 82 and 83 are changed, and the division operation in accordance with the Euclidean algorithm is conducted again. This division operation is repeated until the degree of the remainder polynomial is 7 or less. When a Reed-Solomon code is to be decoded, therefore, the division of polynomials over a Galois field in accordance with the Euclidean algorithm can be conducted for each polynomial, thereby improving the speed of the error-correcting process.

In order to accelerate the speed of the Euclidean arithmetic, the divider section (core circuit) for polynomials defined over a Galois field in the Euclidean arithmetic circuit of the prior art error-correcting apparatus is configured as described above. When the Euclidean arithmetic is to be performed, however, the outputs of the registers are connected to the selectors in order to exchange polynomials. In the case that, a code having the minimum Hamming distance of 17 which is employed in an optical disk is to be decoded as described in the prior art example, therefore, selectors must be provided for each of the registers and the control of these selectors must be performed. This causes the circuit to be enlarged to a scale larger than needed, and further requires a selector control circuit for controlling the selectors, and a bus for control signals. In other words, the divider (core circuit) for polynomials defined over a Galois field in the Euclidean arithmetic process which circuit is disclosed in Japanese Patent Application Laid-Open No. HEI3-172, 027 (1991) can perform the division of the polynomials, but has problems in that the circuit scale is unnecessarily enlarged and tidal the control is complicated.

SUMMARY OF THE INVENTION

It is an object of the invention to provide an error-correcting correcting apparatus which can operate rapidly.

It is another object of the invention to provide an error-correcting apparatus which can operate rapidly without necessitating the circuit scale to be enlarged.

It is a further object of the invention to provide an error-correcting apparatus which does not require extra controls.

A first error-correcting apparatus of the invention is an error-correcting apparatus for performing the error correction using an error-correcting code which is a linear code added to an input signal, and has: syndrome generation means for generating a syndrome from the input signal; error position/value polynomial arithmetic means for calculating an error position polynomial σ (z) and an error value polynomial nominal ω (z) on the basis of the generated syndrome; error position calculation means for calculating an error position on the basis of the calculated error position polynomial σ (z); and error correction means for performing the error correction on erroneous data stored in a RAM on the basis of the calculated error value polynomial ω (z) and the error position data. The error-correcting apparatus is constructed so as to perform in parallel at least three process operations including the process operations of the syndrome generation means, the error position/value polynomial arithmetic means and the error position calculation means, during the error correction. The decoding time for performing the error correction on one error correction block shown in FIG. 9 can be shortened to half or less. Furthermore, the data access between the error-correcting apparatus and the RAM which causes a bottleneck of the acceleration of the decoding operation in the prior art is always conducted. Therefore, the error-correcting apparatus can perform the decoding operation in a shortest decoding time.

In the first error-correcting apparatus, the frequency of a clock signal for driving the syndrome generation means and the error position calculation means may be higher than that of a clock signal for driving the error position/value polynomial arithmetic means. In this apparatus, the decoding time for performing the error correction on one error correction block can be further shortened so as to increase the process speed.

In the first error-correcting apparatus, the number of decoding steps of the error position/value polynomial arithmetic means in which the circuit scale is almost decided by the number of steps for decoding may be increased so as to be substantially equal to the number of decoding steps of the syndrome generation means and error position calculation means, thereby reducing the circuit scale and increasing the operation speed.

The First error-correcting apparatus may be configured so that, when the error correction means performs the error correction on data stored in the RAM, an operation in which at least two erroneous data based on the error position data from the error position calculation means are successively read out from the RAM and the error-corrected data are thereafter sequentially replaced with the erroneous data in the RAM is repeated until all of the data from which an error position has been detected are corrected. The process of executing the error correction of one symbol which requires in the prior art at least 3 steps (the readout of data from the RAM, the error correction and the writing of data to the RAM) can be performed in 2 steps, thereby increasing the operation speed of the error-correcting apparatus. Particularly, in the case where the access time of a RAM is a critical point, this configuration is effective because it can shorten the access time of the RAM and increase the operation speed.

A second error-correcting apparatus of the invention is an error-correcting apparatus for performing the error correction process using a Reed-Solomon code and including a process of the Euclidean algorithm wherein an operation in which a predetermined dividend polynomial is divided by a divisor polynomial and the division is further performed while setting the remainder as the divisor polynomial and that divisor polynomial as the dividend polynomial is repeated until the degree of the remainder polynomial satisfies certain conditions. In the error-correcting apparatus, registers for storing coefficient data of the dividend polynomial and divisor polynomial are arranged in the form of a shift register, and the error-correcting apparatus has: a divider for performing the division of the highest-degree coefficients of the two polynomials; multipliers for multiplying the coefficient data of a polynomial set in the divisor side of the divider by the output of the divider; and adders for adding the outputs of the multipliers and the coefficient data of a polynomial set in the dividend side of the divider, and is configured so that, when the division over a Galois field is to be executed, the division based on the Euclidean algorithm process is executed by sequentially shifting the contents of registers in which the coefficient data of the dividend polynomial are stored. Since the Euclidean algorithm process can be executed without providing selectors for exchanging the coefficient data of polynomials, the circuit scale can be reduced, and the control of such selectors is not required so that the circuit is simplified.

In the second error-correcting apparatus, the multipliers may be provided for registers in which the initial value $Z^{2t}$ in the Euclidean algorithm process is set, so that the number of multipliers for performing the division operation can be reduced by one, thereby reducing the circuit scale.

In the second error-correcting apparatus, when the highest-degree coefficient of the polynomial input as the divisor is 0, the divider may be configured so that the output is 1. Even when the highest-degree coefficient of the dividend polynomial or divisor polynomial is 0, a Euclidean arithmetic controller can execute the arithmetic of polynomials over a Galois field in the Euclidean algorithm process, without increasing the circuit scale. Therefore, the configuration of the controller can be simplified.

In the second error-correcting apparatus, when an error position polynomial σ (Z) is to be calculated using a division result output from the divider, the calculation method is switched depending on whether the coefficient data of the highest degree of the dividend polynomial input to the divider is treated as the divisor or the dividend. As a result, an error position polynomial can be correctly calculated, and the number of decoding steps can be reduced.

The second error-correcting apparatus may have: first selection means for selecting the output of the divider and error position data; second selection means for selecting the output of storage means for storing coefficient data of the polynomial in the divisor side of the divider, and the output of storage means for storing coefficient data of the polynomial in the dividend side of the divider; third selection means for selecting a coefficient of the polynomial the divisor side of the divider, and another coefficient of the polynomial in the divisor side of the divider, the degree of the other coefficient being higher than that of the coefficient by one; multiplication means for multiplying the output of the first selection means by the output of the third selection means; and addition means for adding the output of the multiplication means and the output of the second selection means. The second error-correcting apparatus may be configured so that, when a modified syndrome polynomial is to be calculated in the erasure correction, the first, second and third selection means select the error position data, the coefficient of the polynomial in the divisor side of the divider and the coefficient of the polynomial which is higher in degree by one, respectively. Therefore, the configuration for calculating a modified syndrome polynomial which is to be calculated in the erasure correction can be realized only by adding a selector circuit, whereby the error-correcting apparatus is allowed to cope with the erasure correction while suppressing the increase of the circuit scale as much as possible.

The above and further objects and features of the invention will more fully be apparent from the following detailed description with accompanying drawings.

BRIEF DESCRIPTION OF THE DRAWINGS

FIG. 14($a$)–($d$) are diagrams illustrating the operation of the divider for performing the division of polynomials over a Galois Field in the prior art;

DESCRIPTION OF THE PREFERRED EMBODIMENTS

Hereinafter, the invention will be described in detail with reference to the drawings illustrating embodiments.

First embodiment

Figure 2:
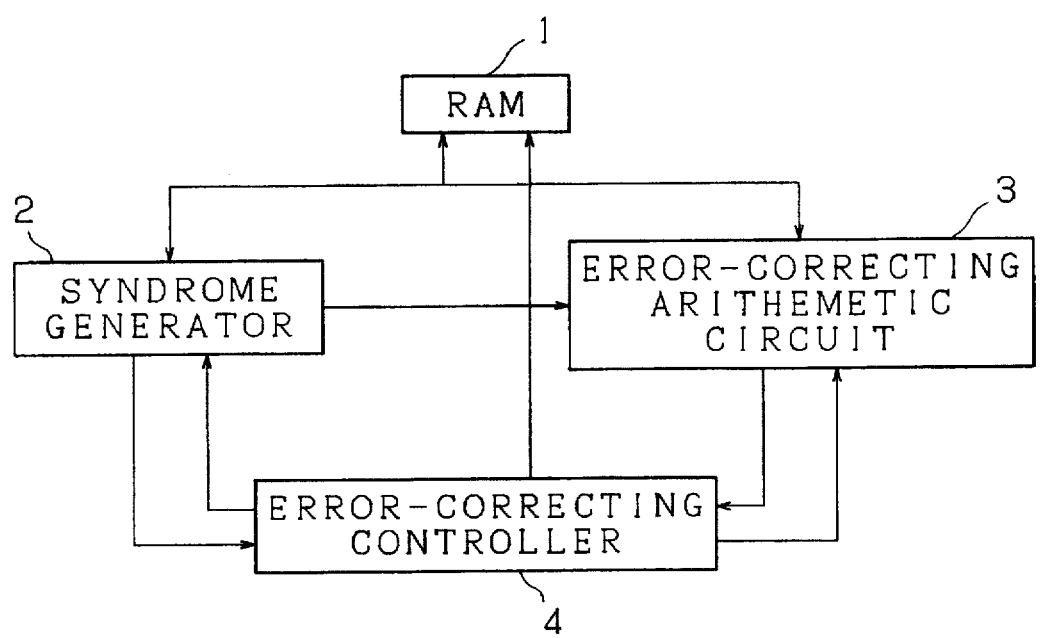
FIG. 2 is a block diagram showing the configuration of a prior art error-correcting apparatus.
Figure 16:
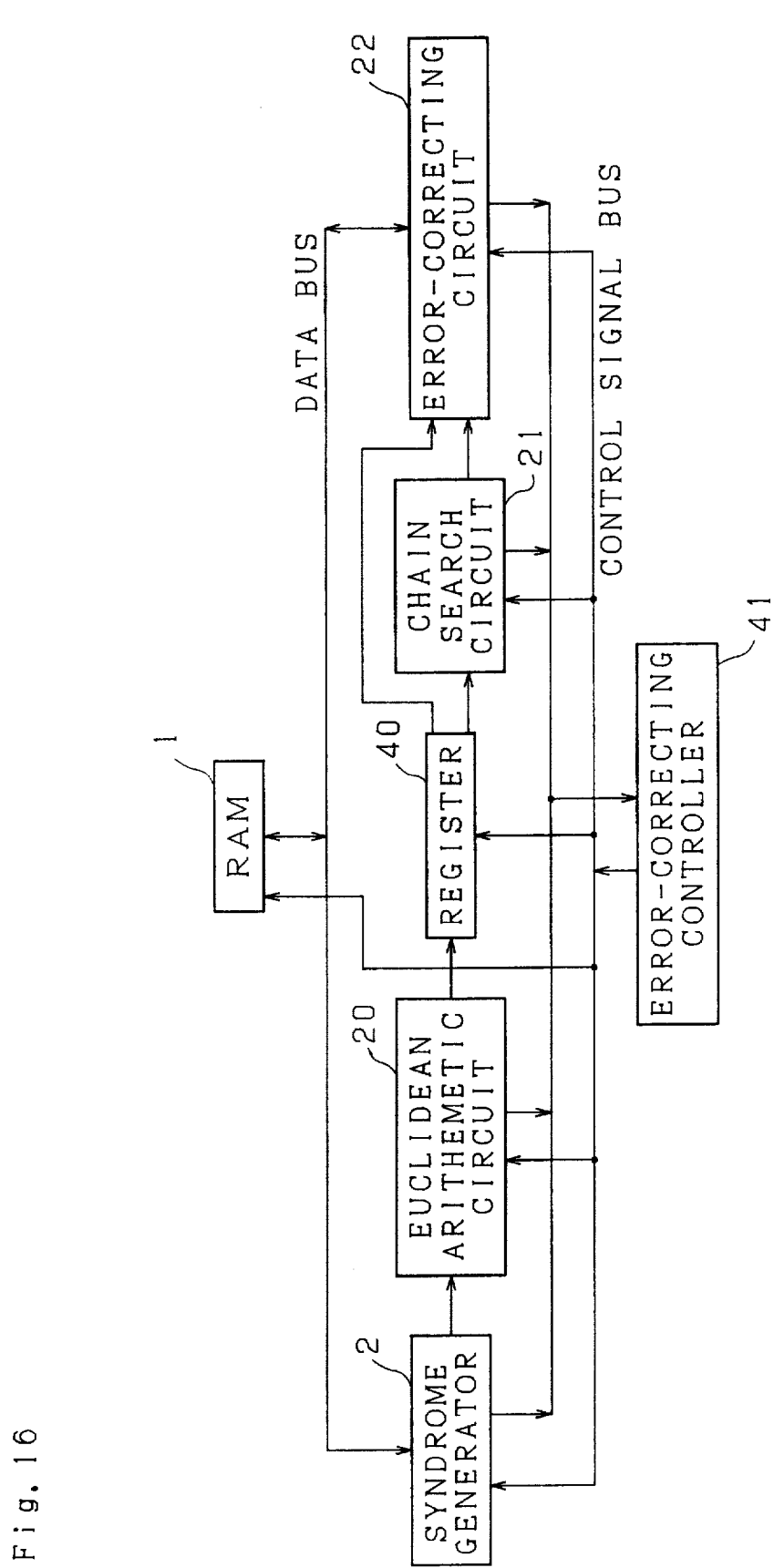
FIG. 16 is a block diagram showing the configuration of an error-correcting apparatus according to the invention.

FIG. 16 is a block diagram showing the configuration of an error-correcting apparatus which is a first embodiment of the invention. In the figure, 1, 2 and 20 to 22 designate the same components as those shown FIGS. 2 and 4, and therefore their description is omitted. The reference numeral 40 designates a register for storing coefficient data of an error position polynomial and an error value polynomial output from the Euclidean arithmetic circuit 20, and designates an error-correcting controller for controlling the syndrome generator 2, the register 40, the chain search circuit 21 and the error-correcting circuit 22, and for controlling the writing and reading operation of the RAM 1. The syndrome generator 2, the divider section for polynomials over a Galois field in the Euclidean arithmetic circuit 20, and the chain search circuit 21 respectively have the same circuit configurations as those shown in FIGS. 3, 5 and 6. Hence, their description is omitted.

Figure 9:
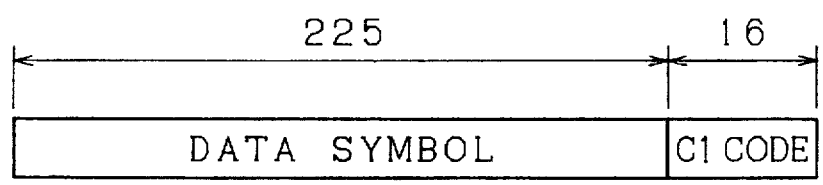
FIG. 9 is a diagram showing a code configuration of one line in the recording direction of the error-correction code shown in FIG. 8.
Figure 10:
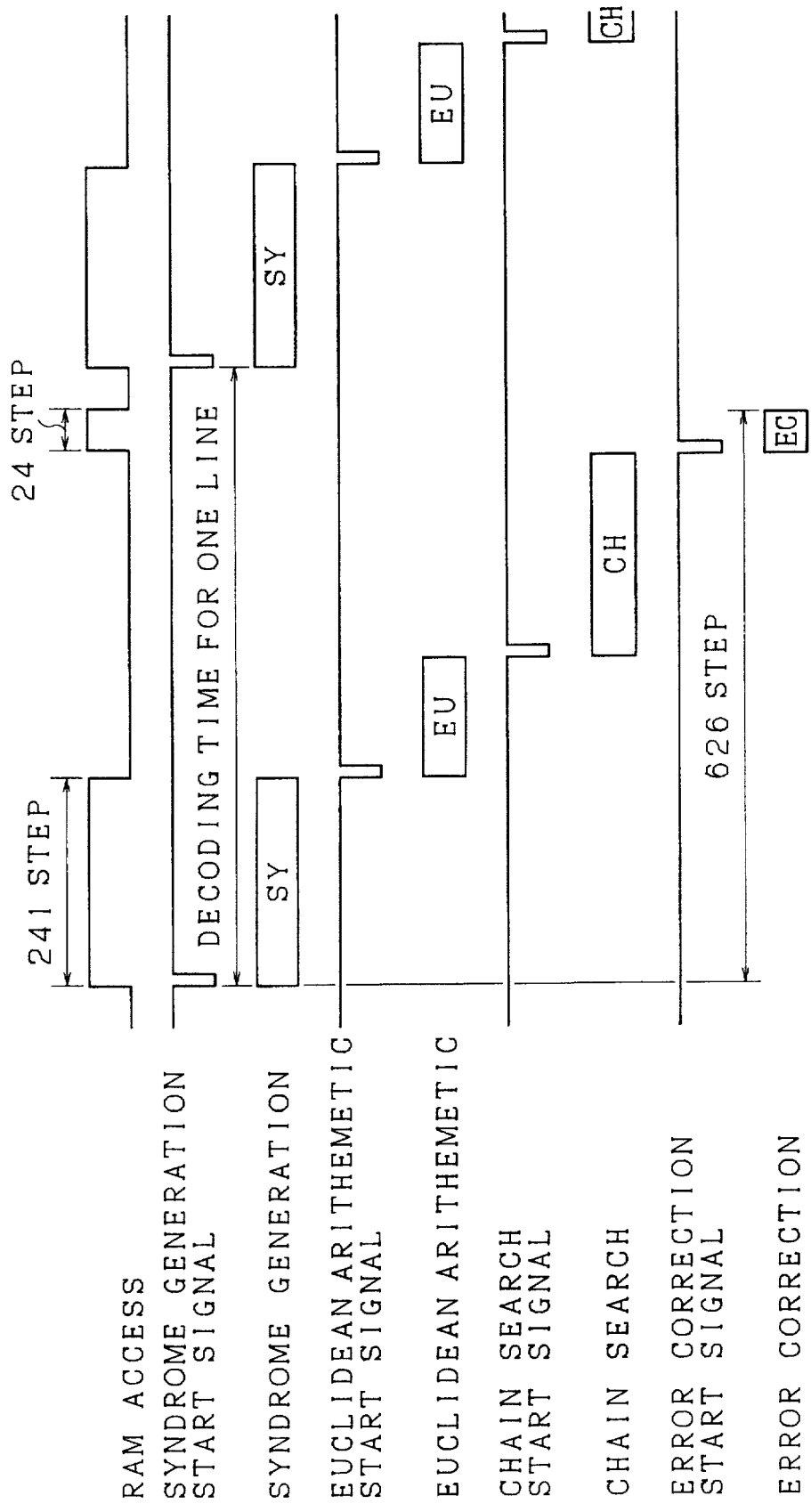
FIG. 10 is a timing chart illustrating the operation of the prior art error-correcting apparatus.
Figure 11:
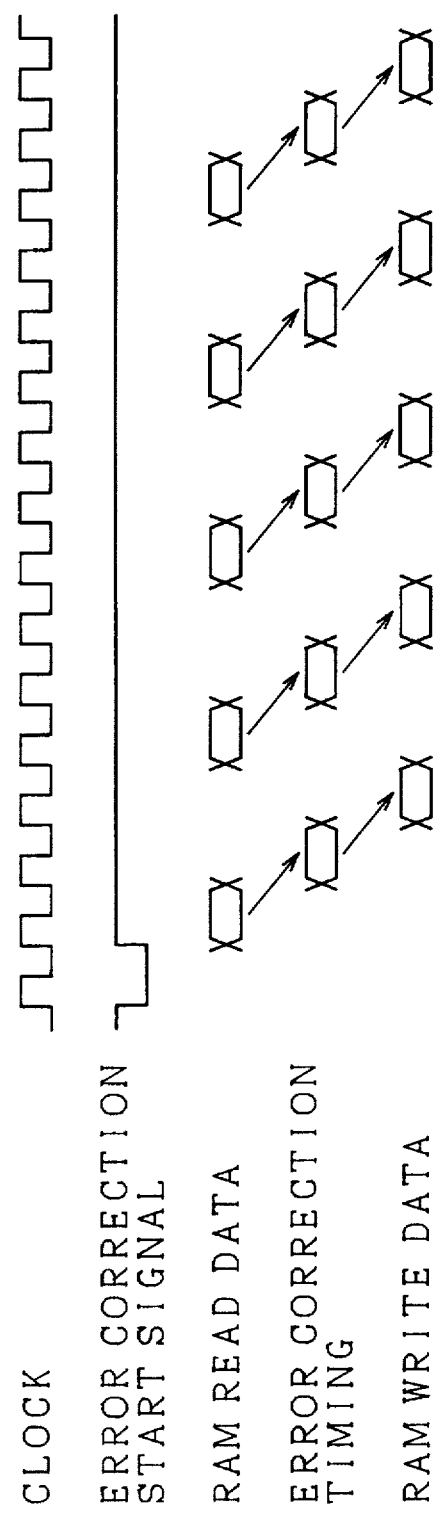
FIG. 11 is a timing chart illustrating the circuit operation of the prior art error-correcting apparatus.
Figure 12:
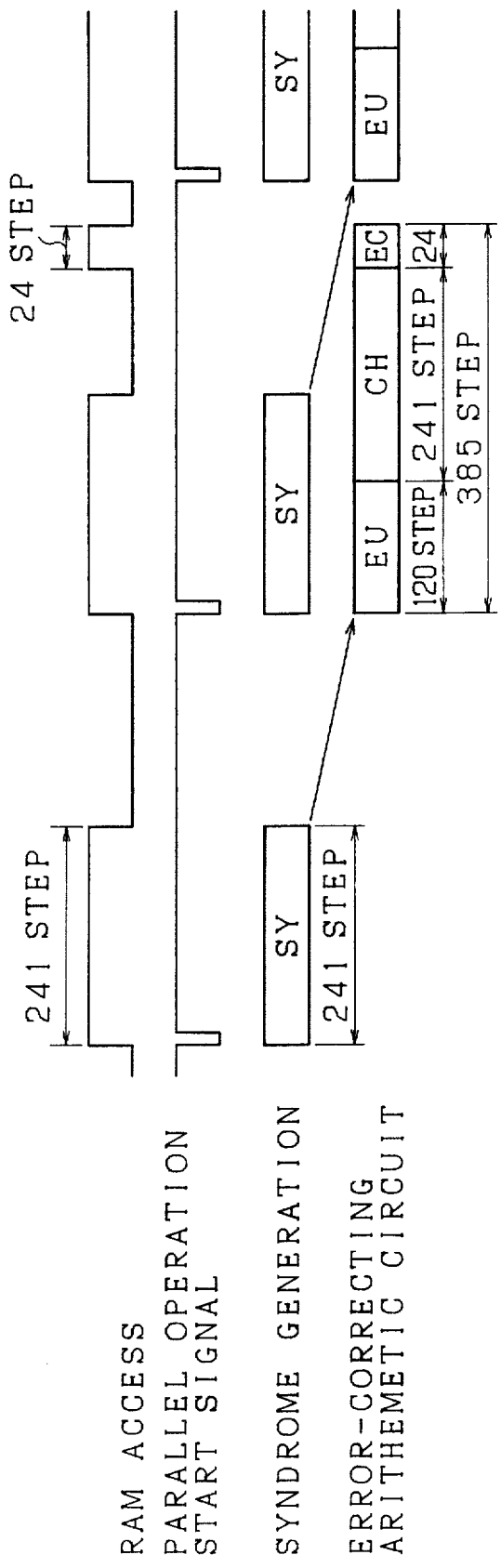
FIG. 12 is a timing chart illustrating the operation of the prior art error-correcting apparatus.

The operation of the error-correcting apparatus which is the first embodiment of the invention will be described. In this embodiment, just like the prior art example, C1 codes which are in the recording direction and have the minimum distance of 17 as shown in FIG. 9 are decoded. When the error correction is started, received or reproduced data which are previously stored in the RAM 1 and include errors occurring during the receiving or reproduction process are read out from the RAM 1 in the unit of a C1 block (unit data block). The reading of the reproduced data from the RAM 1 is conducted according to the readout addresses and reading control signal which are generated in synchronization with the system start signal which is output from the error-correcting controller 41. The data read out from the RAM 1 are supplied to the syndrome generator 2. In response to the system start signal from the error-correcting controller 41, the syndrome generator 2 sets the registers 10 to be 0. The registers 10 are arranged in the form of a shift register. In the same manner as the prior art example, data read out, from the RAM 1 are shifted while sequentially calculating them, thereby executing the division operation. The generation of a syndrome requires 241 steps in a similar fashion as the prior art. The syndrome generated in the syndrome generator 2 is supplied together with a syndrome generation end signal to the Euclidean arithmetic circuit 20. The syndrome generation end signal is supplied also to the error-correcting controller 41. On the basis of the syndrome generation end signal from the syndrome generator 2, the Euclidean arithmetic circuit 20 sets the initial value for the arithmetic process which is to be performed therein. When the arithmetic operation of the Euclidean arithmetic circuit 20 has not yet been completed, the initial value for the arithmetic process will be set at the same time as the completion of the arithmetic operation.

Figure 5:
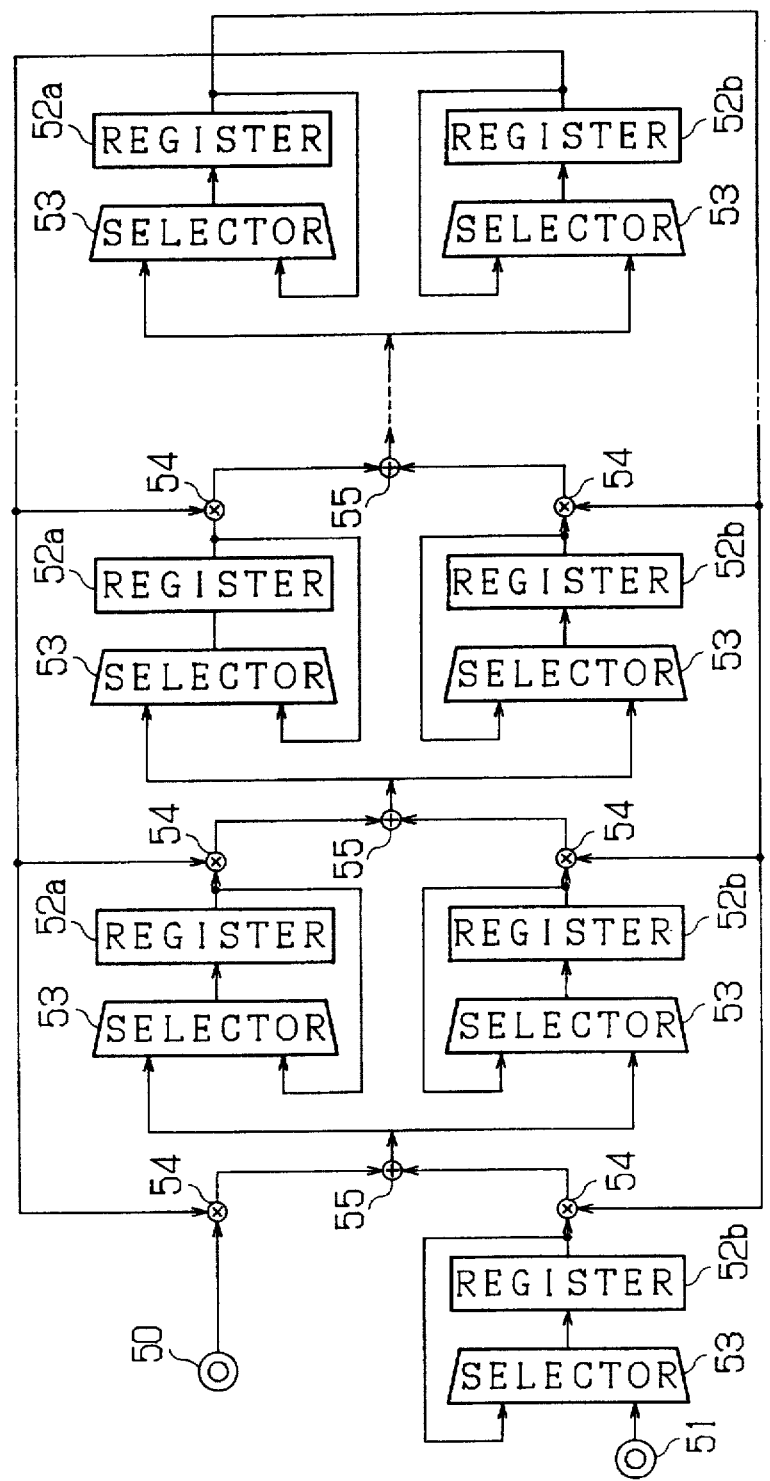
FIG. 5 is a block diagram showing the configuration of a divider for polynomials over a Galois field in the prior art Euclidean arithmetic circuit.

On the other hand, in response to the system start signal from the error-correcting controller 41, the Euclidean arithmetic circuit 20 starts the Euclidean arithmetic using the initial value which is previously set at the completion of the syndrome generation. In the same way as the prior art example, the Euclidean arithmetic circuit 20 calculates an error position polynomial $\sigma(z)$ and error value polynomial $\omega(z)$, by repeating the division of polynomials over a Galois field in accordance with the Euclidean algorithm shown in FIG. 1. Referring to FIG. 5, the circuit operation of the Euclidean arithmetic circuit 20 will be described. Upon receiving the syndrome generation end signal, the registers 52a and 52b are set to the respective initial values. More specifically, $Z^{2t}$ is set in the upper registers 52a, and the coefficient data of the syndrome polynomial calculated by the syndrome generator 2 are set in the lower registers 52b. In response to the system start signal, the divisions of the polynomials over a Galois field are executed while shifting the data of the dividend side (initially, the upper registers 52a in which the data of Z are set). The divisions are repeated until the degree of the polynomial of the dividend side is reduced to a value less than that of the polynomial of the divisor side. The division operation will be described specifically. In FIG. 5, the divider section is so configured that the selectors 53 connected to the registers 52 of the dividend side select the outputs of the respective adders 55, and that the selectors 53 connected to the registers 52 of the divisor side select the outputs of the respective registers 52.

As a result, the data of the divisor side are retained in the registers 52, the data in the registers 52 of the dividend side are shifted, and the divisions are executed.

Figure 1:
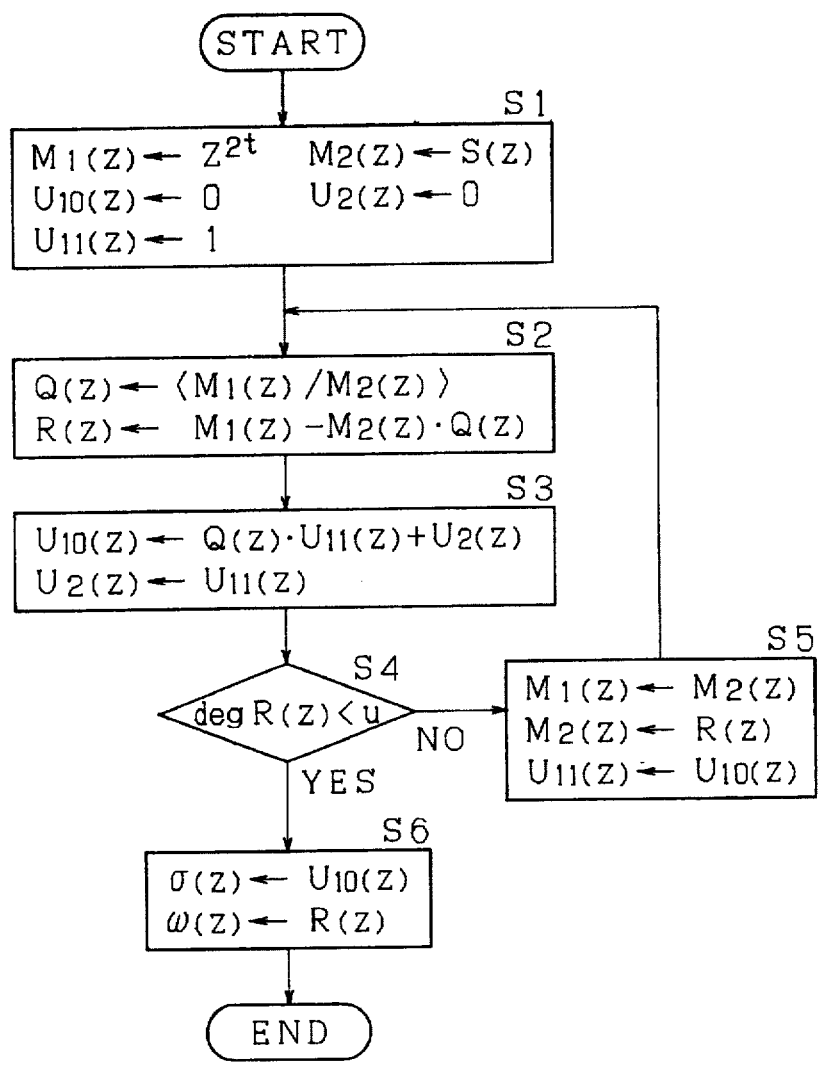
FIG. 1 is a flowchart illustrating the operation of a Euclidean algorithm.

As a result of the division, the registers of the dividend side store the remainder of the division. Thereafter, a further division is performed while setting the polynomial stored in the divisor registers as the dividend, and the remainder of this division as the divisor. This exchange of the dividend and divisor is done by switching the output of the selectors 53. This operation is repeated until the termination conditions shown in FIG. 1 are satisfied. When the conditions are satisfied, the Euclidean arithmetic circuit 20 calculates coefficient data of the error position polynomial and error value polynomial. The calculated coefficient data are temporarily stored in the register 40. When the Euclidean arithmetic is ended, the Euclidean arithmetic circuit 20 outputs a Euclidean arithmetic end signal to the error-correcting controller 41.

Similarly, on the basis of the system start signal from the error-correcting controller 41, the chain search circuit 21 sets the coefficient data of the error position polynomial stored in the register 40, to the feedback registers 31, and set the count value of the coefficient counter 35 to be 0. The outputs of the feedback registers 31 are respectively multiplied in the same way as the prior art by the multipliers which are previously set in the multipliers 32, and then latched again in the feedback registers 31. The coefficient counter 35 counts the number of feedbacks to the feedback registers 31.

In the adder 33, the outputs of the feedback registers 31 are added with each other. The judging circuit 34 checks the result of this addition to judge whether it is 0 or not. If the result is 0, the value of the coefficient counter 35 is written into the register 36. Just like the prior art, this counter value corresponds to the error position. In the chain search, the feedback registers 31 are operated 241 times which correspond to the code length, to calculate the error position. When the chain search is completed, the chain search end signal is output to the error-correcting controller 41. On the basis of the chain search end signal, the Euclidean arithmetic end signal and the syndrome generation end signal, the error-correcting controller 41 outputs the error correction start signal to the error-correcting circuit 22.

Figure 24:
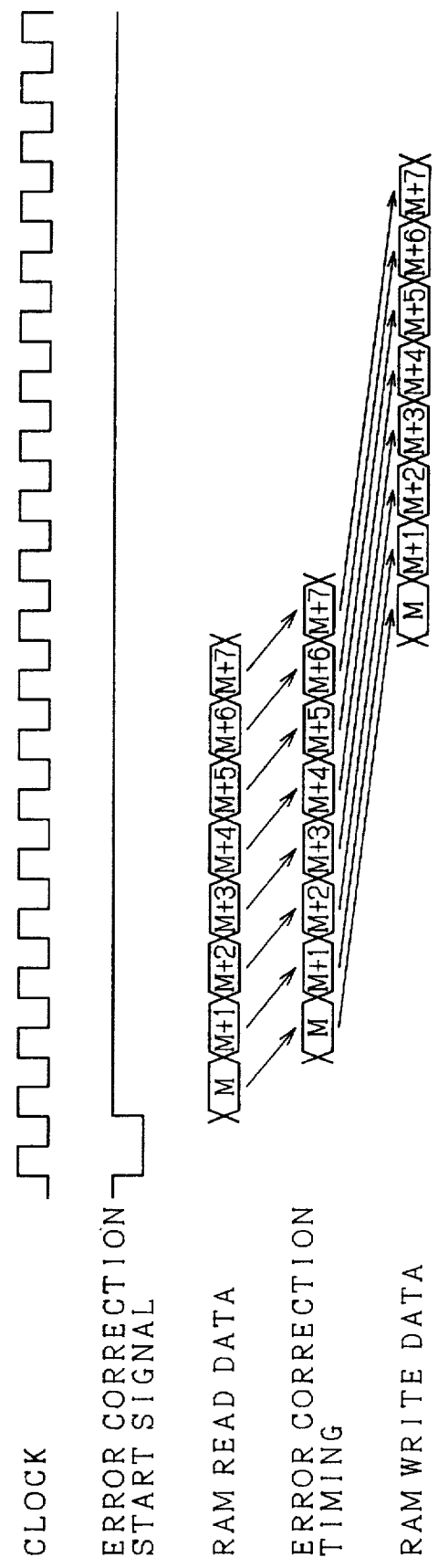
FIG. 24 is a timing chart illustrating the circuit operation of an error-correcting circuit.

Simultaneously with the output of the error correction start signal, the error-correcting controller 41 outputs the readout addresses and reading control signal for sequentially reading out erroneous data stored in the RAM 1, on the basis of the error position data from the chain search circuit 21. When eight errors are to be corrected, for example, eight erroneous data respectively corresponding to eight error position data are read out from the RAM 1. On the other hand, the error-correcting circuit 22 starts the error correction, on the basis of the input error correction start signal. At first, in the error-correcting circuit 22, an error value is obtained from the error value polynomial $\omega(z)$ output from the Euclidean arithmetic circuit 20, and the error position data output from the chain search circuit 21. The erroneous data read out from the RAM 1 are added by the respective error values and sequentially subjected to the error correction. When the process of reading out erroneous data from the RAM 1 is ended, the error-corrected data are replaced in sequence with the erroneous data in the RAM 1. FIG. 24 shows a timing chart of the error-correcting circuit 22.

Figure 17:
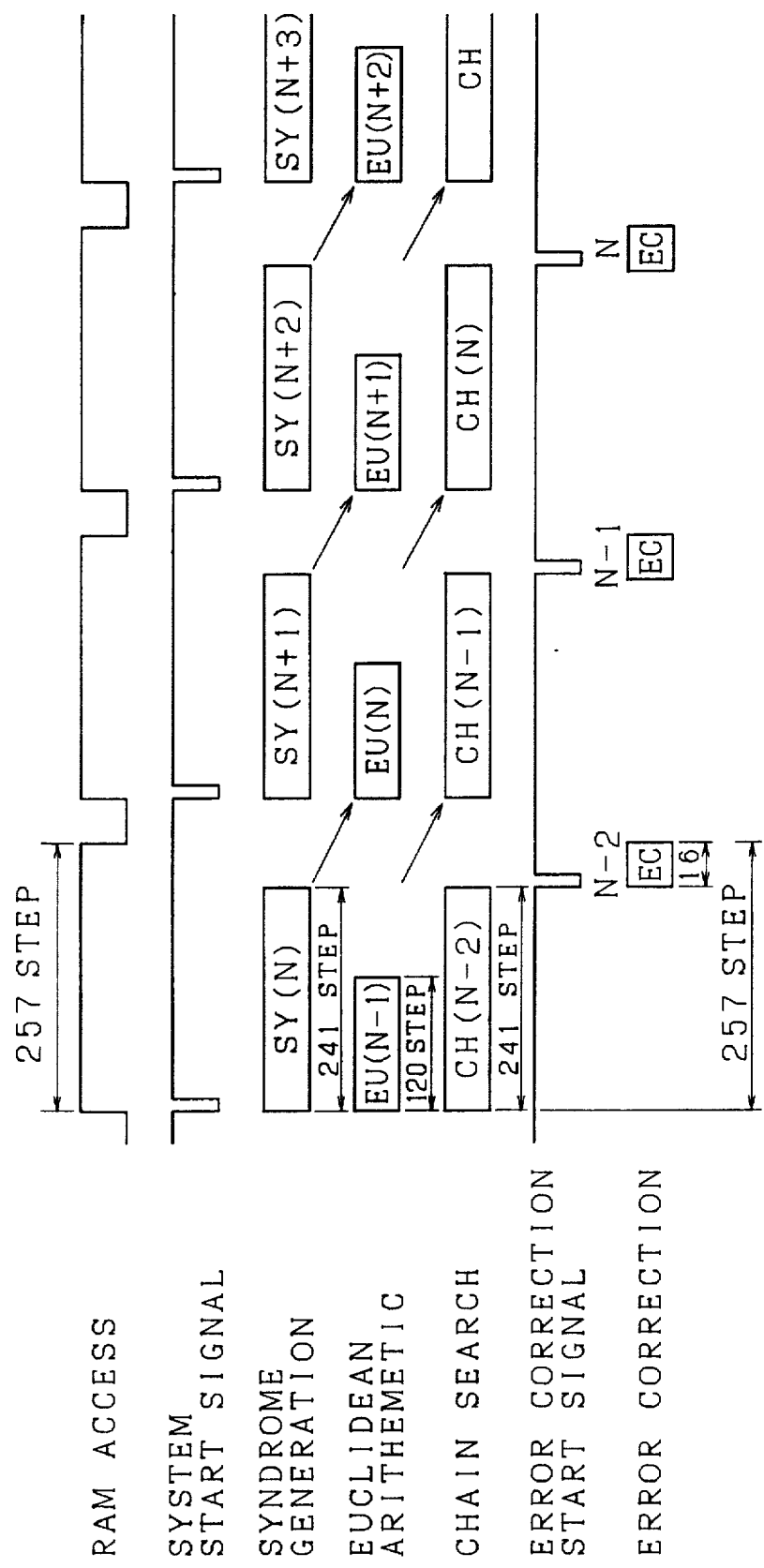
FIG. 17 is a timing chart illustrating the circuit operation of the error-correcting apparatus of FIG. 16.

Next, the signal process timing of each circuit portion in the case that the error correction is conducted using the First embodiment will be described with reference to FIG. 17. FIG. 17 shows the output timing of various control signals From the error-correcting controller 41, the operation timing of the circuits, and the data access state of the RAM 1. When the error correction is started, the error-correcting controller 41 outputs the system start signal to the syndrome generator 2, the Euclidean arithmetic circuit 20 and the chain search circuit 21, and outposts the readout addresses and reading control signal for sequentially reading out erroneous data stored in the RAM 1.

In response to the system start signal, the syndrome generator 2 sets the values of the registers 10 to be 0, and performs the predetermined arithmetic (division) process. As described above, the completion of the arithmetic in the syndrome generation requires 241 steps which correspond to the code length. This arithmetic time is indicated by portions SY in FIG. 17.

When the syndrome generation is ended, the syndrome generation end signal is output together with the syndrome data from the syndrome generator 2. In response to the syndrome generation end signal, the Euclidean arithmetic circuit 20 sets the initial values for the Euclidean arithmetic. When the arithmetic of the Euclidean arithmetic circuit 20 has not yet ended, the initial values will be set as soon as the Euclidean arithmetic is ended.

On the basis of the system start signal, the Euclidean arithmetic circuit 20 performs the division of the polynomials over a Galois field $GF(2^8)$ in the manner described above, and calculates an error position polynomial $\sigma(z)$ and an error value polynomial $\omega(z)$. The process of decoding in the Euclidean arithmetic circuit 20 a Reed-Solomon code having the minimum distance of 17 shown in FIG. 9 requires about 120 steps in the same manner as the prior art example. This arithmetic time is indicated by portions EU in FIG. 17.

The coefficient data of the error position polynomial $\sigma(z)$ and error value polynomial $\omega(z)$ which are calculated by the Euclidean arithmetic circuit 20 are temporarily stored in the register 40. When the Euclidean arithmetic is ended, the Euclidean arithmetic circuit 20 produces the Euclidean arithmetic end signal.

In response to the system share signal, in the chain search circuit 21, the coefficient counter 35 is set to be 0, and the coefficient data of the error position polynomial calculated by the Euclidean arithmetic circuit 20 are set to the respective feedback registers 31. The outputs of the feedback registers 31 are respectively multiplied by the multipliers which are previously set in the multipliers 32, and then latched again in the feedback registers 31. The coefficient counter 35 counts the number of feedbacks to the feedback registers 31. In the adder 33, the outputs of the feedback registers 31 are added with each other. The judging circuit 34 checks the result of this addition to judge whether it is 0 or not. If the result is 0, the value of the coefficient counter 35 is written into the register 36. As described above, in the chain search circuit 21, the maximum number of steps required for the calculation of the error position corresponds to the code length, or 241 steps. This arithmetic time is indicated by portions CH in FIG. 17.

When the chain search is ended, the chain search circuit 21 outputs a chain search end signal. In response to the chain search end signal, the Euclidean arithmetic end signal and the syndrome generation end signal, the error-correcting controller 41 outputs the error correction start signal. Upon receiving the error correction start signal, the error-correcting circuit 22 calculates an error value, using the error value polynomial $\omega(z)$ and the error position data From the chain search circuit 21. The data which has been read out from the RAM 1 and in which the error position has been calculated is subjected to the error correction by adding the error value to it. The error-corrected data is written into the RAM 1 at the same time the readout of erroneous data from the RAM 1 is completed. A timing chart of the error-correcting circuit 22 is shown in FIG. 24. In the embodiment, the process of correcting eight symbols requires 16 steps. The timing chart of the error-correcting circuit shown in FIG. 24 will be described in detail later.

The error-correcting controller 41 controls the above-described operations of the RAM 1, the syndrome generator 2, the Euclidean arithmetic circuit 20, the register 40, the chain search circuit 21 and the error-correcting circuit 22 in order to manage the parallel operation of the three circuits of the syndrome generator 2, the Euclidean arithmetic circuit 20 and the chain search circuit 21, the error-correcting controller 41 has an operation flag generation circuit therein which sets operation flags of the circuits when the system start signal is produced, and which resets the operation flags on the basis of the arithmetic end signal output from each of the circuits. Depending on the states of the flags, the error-correcting controller 41 controls the respective circuits. Specifically, depending on the states of the flags, the error-correcting controller 41 supplies the respective circuits with signals for performing controls such as the address control of the RAM 1, the transfer of data calculated in the respective circuits and the setting of initial values to the respective circuits. The operation flags are supplied also to the respective circuits.

At the same time when the access of the syndrome generator 2 and RAM 1 and the calculation of the error position in the chain search circuit 21 are ended, the error correction start signal is output. Simultaneously, on the basis of the error position data calculated in the chain search circuit 21, the readout address and reading control signal for reading out erroneous data stored in the RAM 1 are generated.

In the error-correcting apparatus of the embodiment, as shown in FIG. 17, the parallel operation of the three circuits of the syndrome generator 2, the Euclidean arithmetic circuit 20 and the chain search circuit 21 reduces the number of steps required for decoding one error-correcting block, to 257 steps. This enables the decoding speed to be increased by about 2.4 times (626/257) as compared with that of the prior art error-correcting apparatus. Even when compared with the device in which the syndrome generator 2 and error-correcting arithmetic circuit 3 are operated in parallel, the decoding speed is increased by 1.5 times (886/257). Therefore, the embodiment can increase the operation speed of the circuits without necessitating the parallel arrangement of error-correcting apparatus. Accordingly, as compared with an apparatus in which error-correcting apparatus are connected in parallel, the circuit scale can be greatly reduced.

Figure 8:
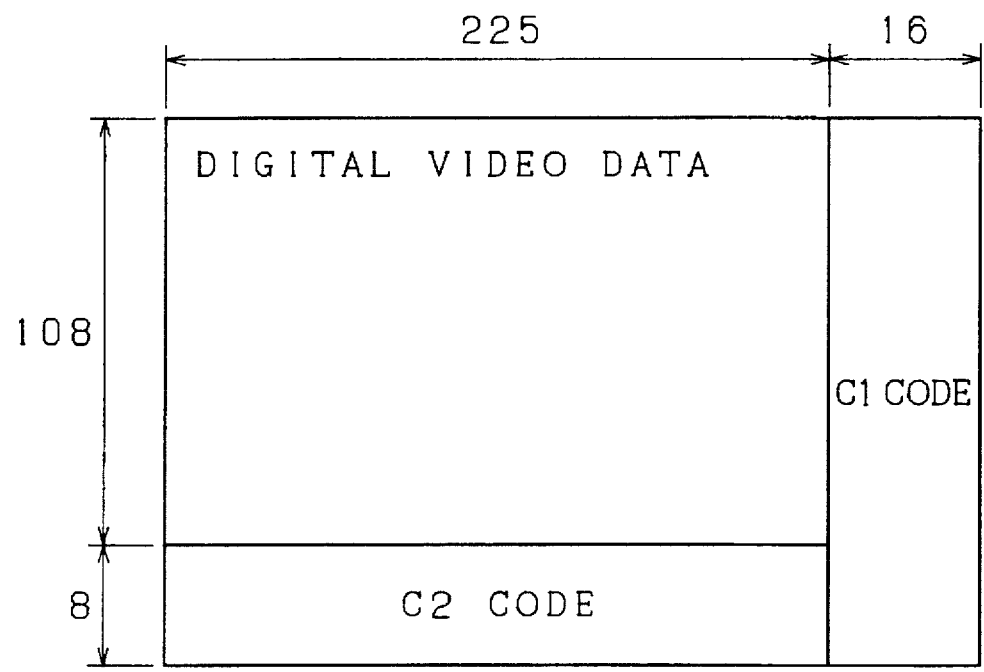
FIG. 8 is a diagram showing the configuration of an error-correcting code used in a home-use digital VTR.

In an error-correcting apparatus such as that of the embodiment in which concurrent processing is performed, the operation speed of the apparatus depends on the data access time of the RAM 1. Particularly, in the case where an error-correcting code having the form of a product code shown in FIG. 8 is to be decoded, the error correction is performed after data reproduced and including errors are temporarily stored in the RAM 1. Generally, in a process of decoding an error-correcting code having the form of a product code, the error correction in the recording direction is performed using C1 codes, and thereafter the error correction in the vertical direction is performed using C2 codes, so that data in which the error correction using C1 codes failed to correct the error are subjected to the further error correction using C2 codes. (When the error correction is to be performed using C1 codes added in the recording direction, a syndrome may be directly generated from reproduced data and the error correction may be performed, instead of temporarily storing data in the RAM 1. When the error correction is to be performed using C2 codes, however, it is required to read out data of the error-correcting block shown in FIG. 8 in the vertical direction. Therefore, the error correction of reproduced data using C2 codes is performed on data which have been temporarily stored in the RAM 1.)

The reproduced data which have been temporarily stored in the RAM 1 are read out from the RAM 1 to be subjected to the error correction using error-correcting codes. As described above, the error-correcting apparatus conducts on the data read out from the RAM 1 the generation of a syndrome, the calculation or an error position and the calculation of an error value. Then, the data at the address corresponding to the calculated error position is read out from the RAM 1, and is subjected to the error correction by adding the error value to the data. The error-corrected data is written at the address corresponding to the calculated error position of the RAM 1.

As the RAM 1, an SRAM or a DRAM in which data can be randomly accessed at a high speed may be used. In a RAM such a kind, generally, an I/O port for data and an address port for writing and reading data are not separately formed. Therefore, a process of the highest-speed in the error-correcting apparatus can be realized by the arrangement wherein the syndrome generator 2 and error-correcting circuit 22 which conduct the data access on the RAM 1 are operated independently of each other, and the Euclidean arithmetic circuit 20 and chain search circuit 21 which do not conduct the data access on the RAM 1 are operated parallel with the syndrome generator 2. That is, the error-correcting apparatus is operated in such a manner that the Euclidean arithmetic circuit 20 and chain search circuit 21 terminate their arithmetic during when the syndrome generator 2 and error-correcting circuit 22 are operated. When the error-correcting apparatus is operated in this way, the RAM 1 is always in the state where the RAM 1 is accessed by the syndrome generator 2 or the error-correcting circuit 22, whereby the error correction is allowed ho be performed in a shortest decoding time. A RAM access signal which indicates the operation state of the RAM 1 in the embodiment is shown in FIG. 17. Accordingly, an error-correcting apparatus having the configuration of the first embodiment (i.e., the configuration in which the three circuits of the syndrome generator 2, the Euclidean arithmetic circuit 20 and the chain search circuit 21 are operated in parallel) has the highest decoding speed.

Second embodiment

Figure 18:
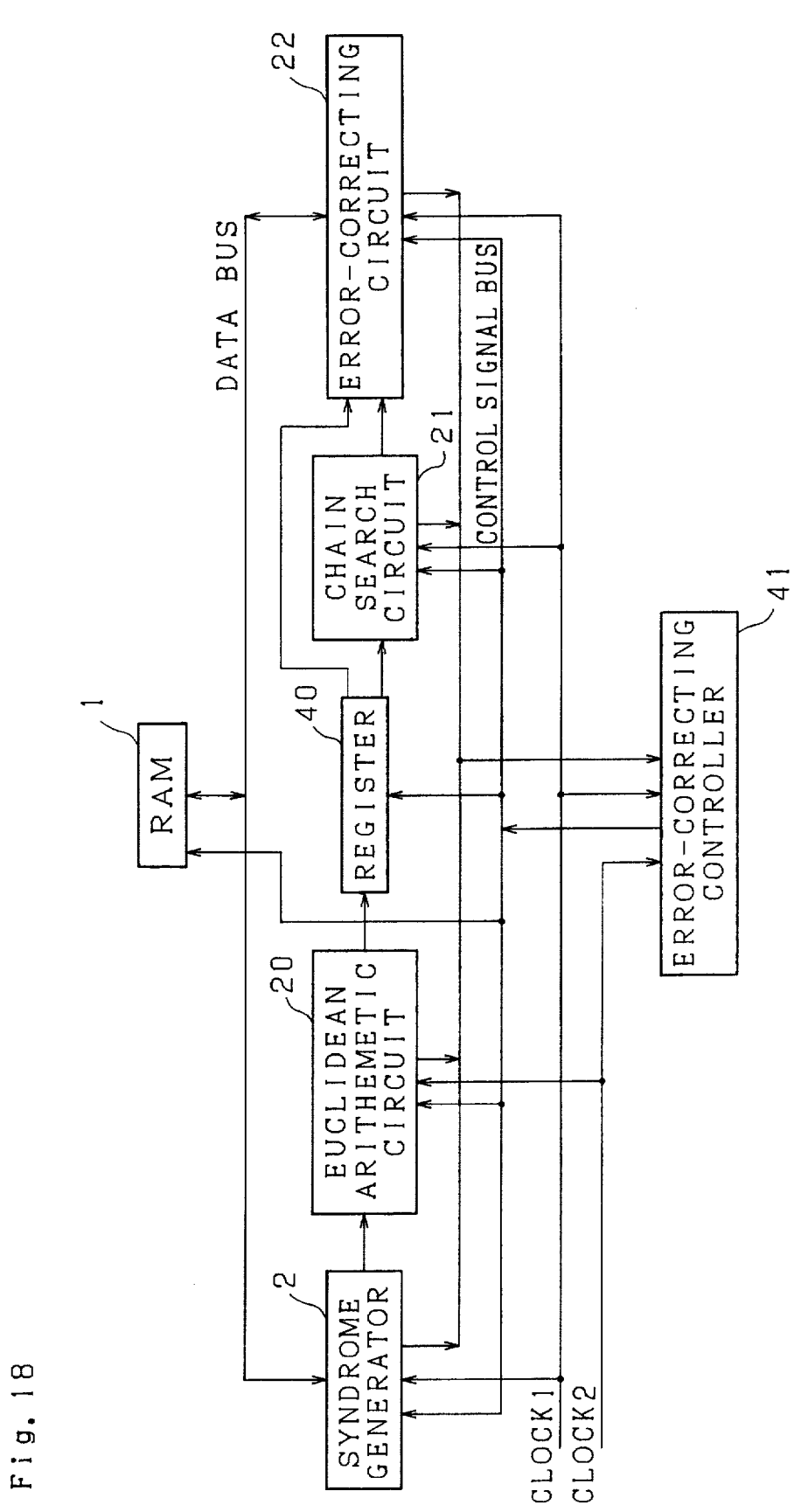
FIG. 18 is a block diagram showing the configuration of another error-correcting apparatus according to the invention.

Next, a second embodiment of the invention will be described. FIG. 18 is a block diagram showing the configuration of an error-correcting apparatus which is the second embodiment of the invention. In the figure, 1, 2, 20 to 22, 40 and 41 designate the same components as those of the first embodiment, and therefore their description is omitted. As seen from the Figure, in the embodiment, the syndrome generator 2, the chain search circuit 21 and the error-correcting circuit 22 are driven by clock 1. The Euclidean arithmetic circuit 20 is driven by clock 2 having a frequency other than that of clock 1. Using clock 1 and clock 2, the error-correcting controller 41 controls the 1, the syndrome generator 2, the Euclidean arithmetic circuit 20, the register 40, the chain search circuit 21 and the error-correcting circuit 22. The syndrome generator 2, the divider for polynomials over a Galois Field in the Euclidean arithmetic circuit, 20, and the chain search circuit, 21 have the same circuit configuration as those shown in FIGS. 3, 5 and 6, and therefore their description is omitted.

Figure 3:
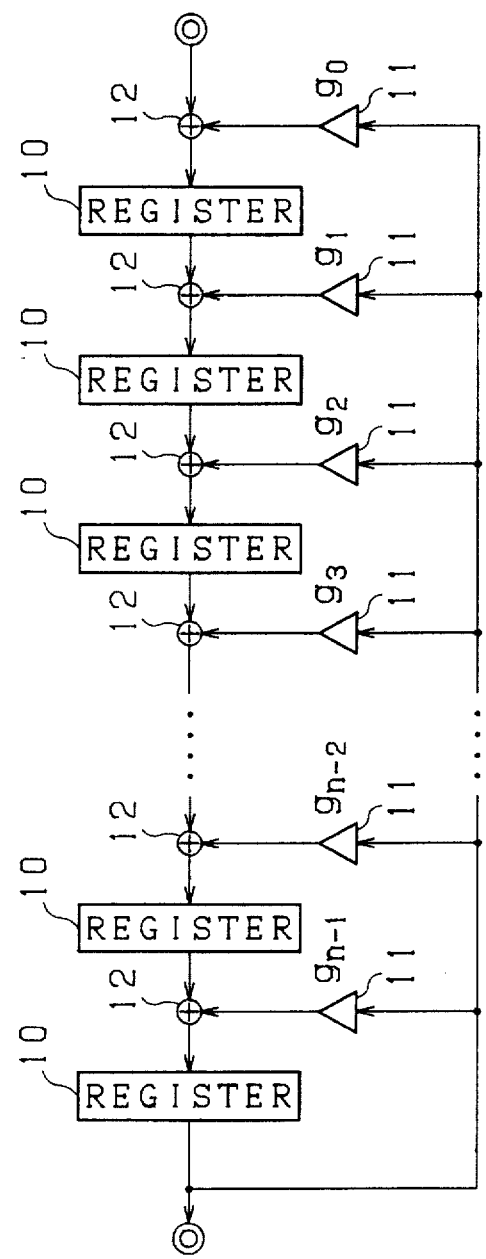
FIG. 3 is a block diagram showing the configuration of a syndrome generator.
Figure 4:
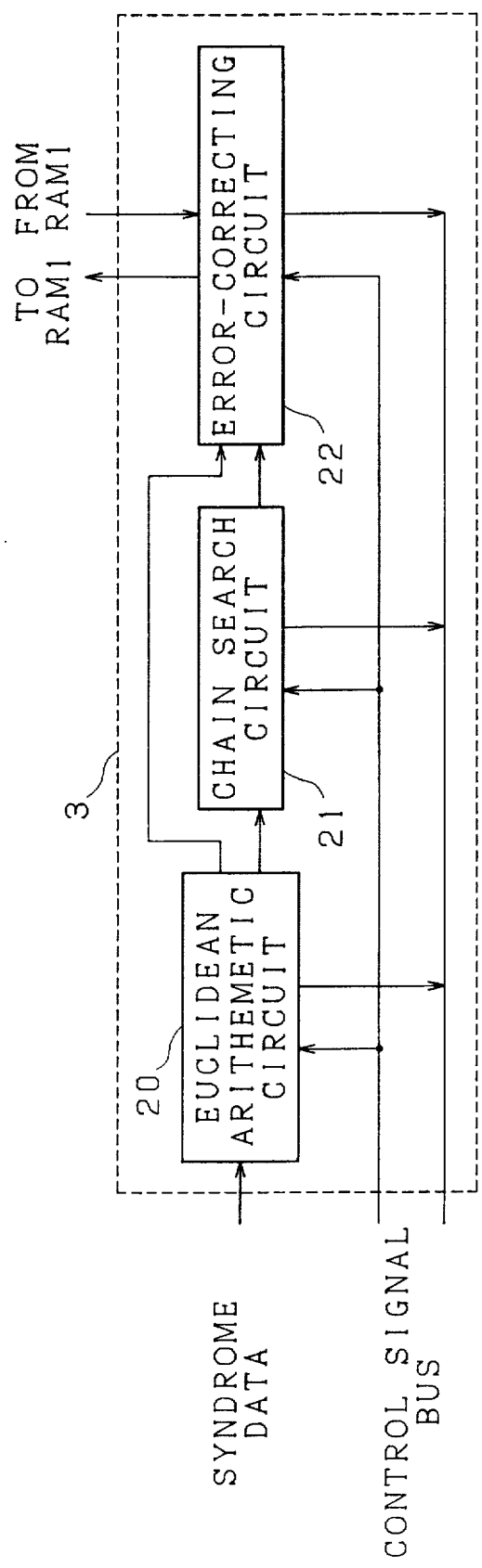
FIG. 4 is a block diagram showing the configuration of an error-correcting arithmetic circuit in the prior art.
Figure 6:
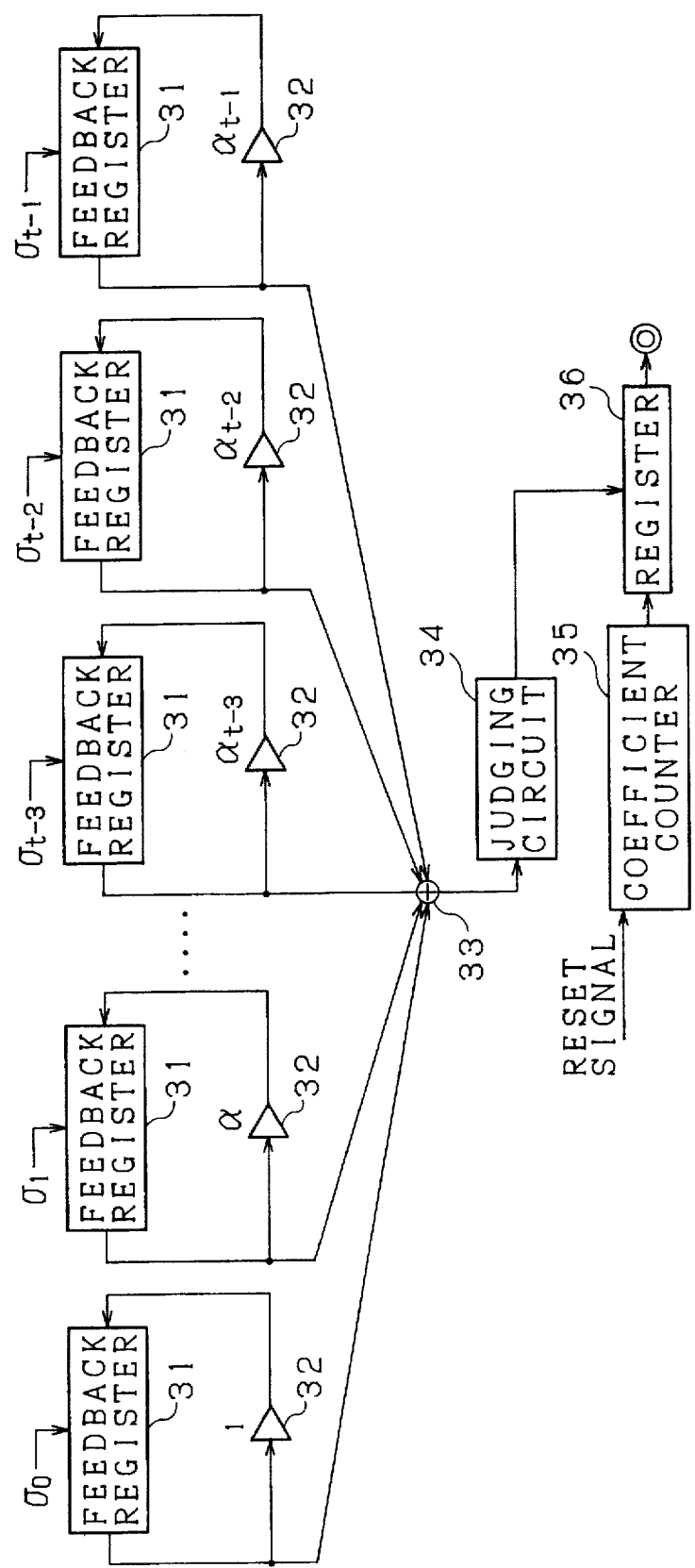
FIG. 6 is a block diagram showing the configuration of a chain search circuit.
Figure 7:
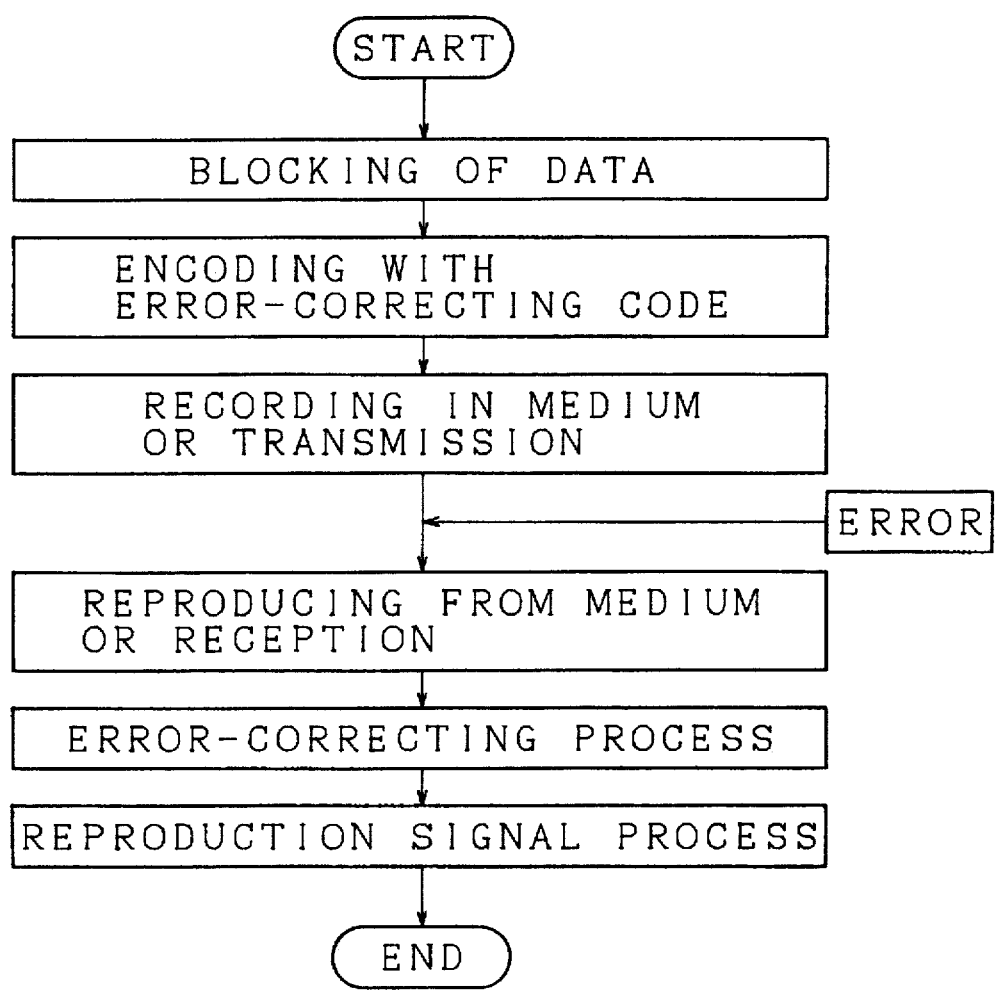
FIG. 7 is a flowchart illustrating encoding and decoding processes using error-correcting codes.

The operation of the error-correcting apparatus which is the second embodiment of the invention will be described. In this embodiment, the control is done while setting the frequency of clock 1 so as to be twice that of clock 2. As shown in FIGS. 3 and 6, in the syndrome generator 2 and the chain search circuit 21, the outputs of the registers are connected in series or parallel with the multipliers and adders for constants over a Galois field. From the view point of hardware, this means that data to be sent to the next register must pass through four stages of EX-OR gates at the maximum. By contrast, the Euclidean arithmetic circuit 20 consists of the multipliers and adders for variables, and hence data are latched in the next register after passing through about seven stages of EX-OR gales and several selectors (these stage numbers may vary depending on the hardware configuration). Therefore, the operation speed of the syndrome generator 2 and the chain search circuit 21 can be increased more easily as compared with that of the Euclidean arithmetic circuit 20. In order to simplify the description, the frequency of clock 2 is the same as that used for driving the circuits in Embodiment 1 described above. In this embodiment, C1 codes which are in the recording direction and have the minimum distance of 17 as shown in FIG. 9 are decoded in the same manner as the first embodiment.

When the error correction is started, received or reproduced data which are stored in the RAM 1 are read out therefrom in the unit of a C1 block (unit data block). The reading of the reproduced data from the RAM 1 is conducted according to the readout addresses and reading control signal generated in synchronization with clock 1 which drives the syndrome generator 2, on the basis of the system start signal from the error-correcting controller 41. The data read out from the RAM 1 are supplied to the syndrome generator 2.

The syndrome generator 2 generates a syndrome in the same manner as the first embodiment. This operation is the same as that of the first embodiment, and therefore its description is omitted. The generation of the syndrome requires 241 steps which correspond to the code length just like the first embodiment. However, since the clock signal for driving the syndrome generator 2 has the frequency which is twice that of the clock signal used in the first embodiment, the generation of the syndrome terminates within a period which is a half of the period required in the first embodiment. The Euclidean arithmetic circuit 20 starts the Euclidean arithmetic in synchronization witch clock 2 on the basis of the system start signal from the error-correcting controller 41, using the initial value which is previously set at the termination of the syndrome arithmetic. The operation of Euclidean arithmetic circuit 20 is the same as that of the first embodiment, and therefore its description is omitted. Thereafter, in the same manner as the first embodiment, the chain search circuit 21 calculates error positions. Since the clock signal for driving the chain search circuit 21 has the frequency which is twice as that used in the first embodiment, the calculation of the error position terminates within a period which is a half of the period required in the first embodiment. Then, in the same manner as the first embodiment, the error-correcting circuit 22 obtains an error value, and performs in sequence the error correction. The error-corrected data are sequentially replaced with erroneous data in the RAM 1.

Figure 19:
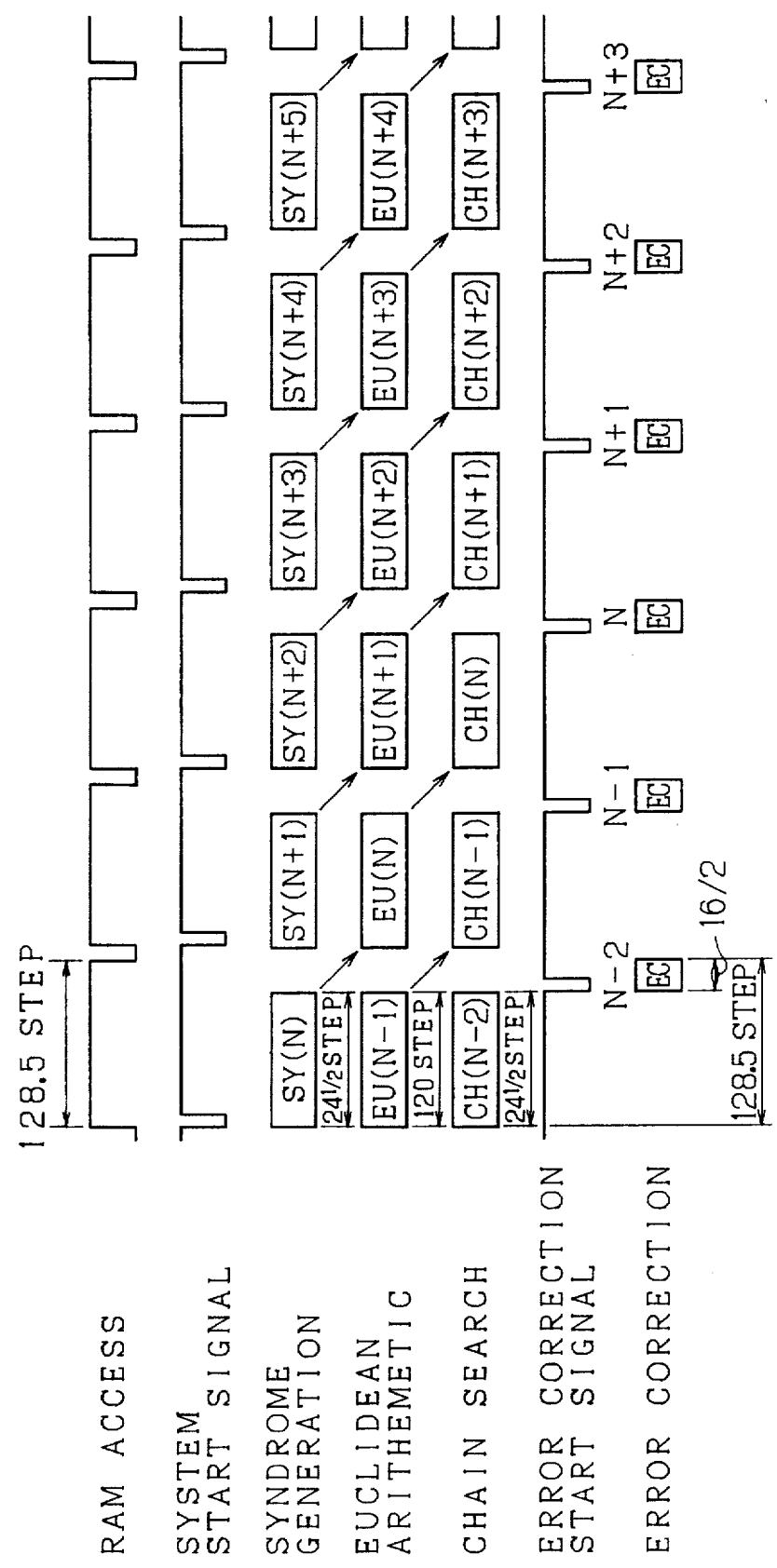
FIG. 19 is a timing chart illustrating the circuit operation of the error-correcting apparatus of FIG. 18.

FIG. 19 shows a timing chart of processing signals in the circuits when data of one line shown in FIG. 9 are to be decoded in the second embodiment. In FIG. 19, the portions identical with those of FIG. 17 are designated by the same symbols.

Although the completion of the arithmetic in the syndrome generation requires 241 steps corresponding to the code length, the time period required for the syndrome generation (the portions SY in FIG. 19) is shortened to the half (about 241/2 steps) because the frequency of clock 1 is twice that of the clock signal used in the first embodiment. Since the clock frequency in the Euclidean arithmetic section is equal to that of the first embodiment, the arithmetic time (portions EU in FIG. 17) is equal to that of the first, embodiment (about 120 steps). By contrast, in the same manner as the syndrome generation, the clock signal for driving the chain search circuit 21 has the frequency which is twice as that used in the first embodiment. Therefore, the arithmetic time in the chain search circuit 21 (the portions CH in FIG. 19) is shortened to a half (about 241/2 steps) as compared with the first embodiments. Since the error-correcting circuit 22 of the second embodiment is driven by clock 1, the operation is completed within a process time (about 8 steps) which is a half of that of the first embodiments.

In the second embodiment, the parallel operation of the three circuits of the syndrome generator 2, the Euclidean arithmetic circuit 20 and the chain search circuit 21 is controlled by the two clock systems of clock 1 and clock 2, and the frequency of the clock signal for driving the syndrome generator 2 and the chain search circuit 21 is set to be twice that of the clock signal for driving the Euclidean arithmetic circuit 20. Accordingly, as shown in FIG. 19, the number of steps required for decoding one error-correcting block is reduced to 128.5 steps, resulting in that the speed is increased by about 4.8 (626/128.5) times as compared with the prior art error-correcting apparatus. When compared with the apparatus where the syndrome generator 2 and the error-correcting arithmetic circuit 3 are operated in parallel, the decoding speed is increased by 3 times (386/128.5). Therefore, the embodiment can increase the operation speed of the circuits without necessitating the parallel arrangement of error-correcting apparatus. Accordingly, as compared with an apparatus in which error-correcting apparatus are connected in parallel, the circuit scale can be greatly reduced.

Also in the embodiment, in the same manner as the first embodiment, the Euclidean arithmetic circuit 20 and chain search circuit 21 which do not conduct the data access on the RAM 1 are operated in parallel with the syndrome generator 2, and the Euclidean arithmetic circuit 20 and chain search circuit 21 are operated so that the arithmetic is completed during when the syndrome generator 2 and error-correcting circuit 22 are operated, whereby the error correction is allowed to be performed in a shortest decoding time. Moreover, in the error-correcting apparatus of the embodiment, the clock signal for driving the syndrome generator 2 and chain search circuit 21 in which the increase of the operation speed is relatively easy has the frequency which is twice as that used in the first embodiment. Therefore, the error correction for one block can be performed while reducing the decoding time to a half of that of the first embodiment.

In the second embodiment, the frequency of clock 1 is set to be twice that of clock 2. The relationship between the frequencies is not limited to this. Even when the frequency of clock 1 may be selected so as to be an integer multiple such as thrice or quadruple, or a non-integer multiple such as 1.5 times or 3.2 times, for example, the same effect can be attained. The syndrome generator 2 and the chain search circuit 21 are driven by the same clock signal. The invention is not restricted to this configuration. The frequency of the clock signal for driving the syndrome generator 2 may be different from that of the clock signal for driving the chain search circuit 21, as far as both the frequencies are higher than that of the clock signal for driving the Euclidean arithmetic circuit 20. In the embodiment, the clock signal for driving the error-correcting circuit, 22 is clock 1. The error-correcting circuit 22 may be driven by clock 2 or a clock signal having another frequency.

Third embodiment

Figure 20:
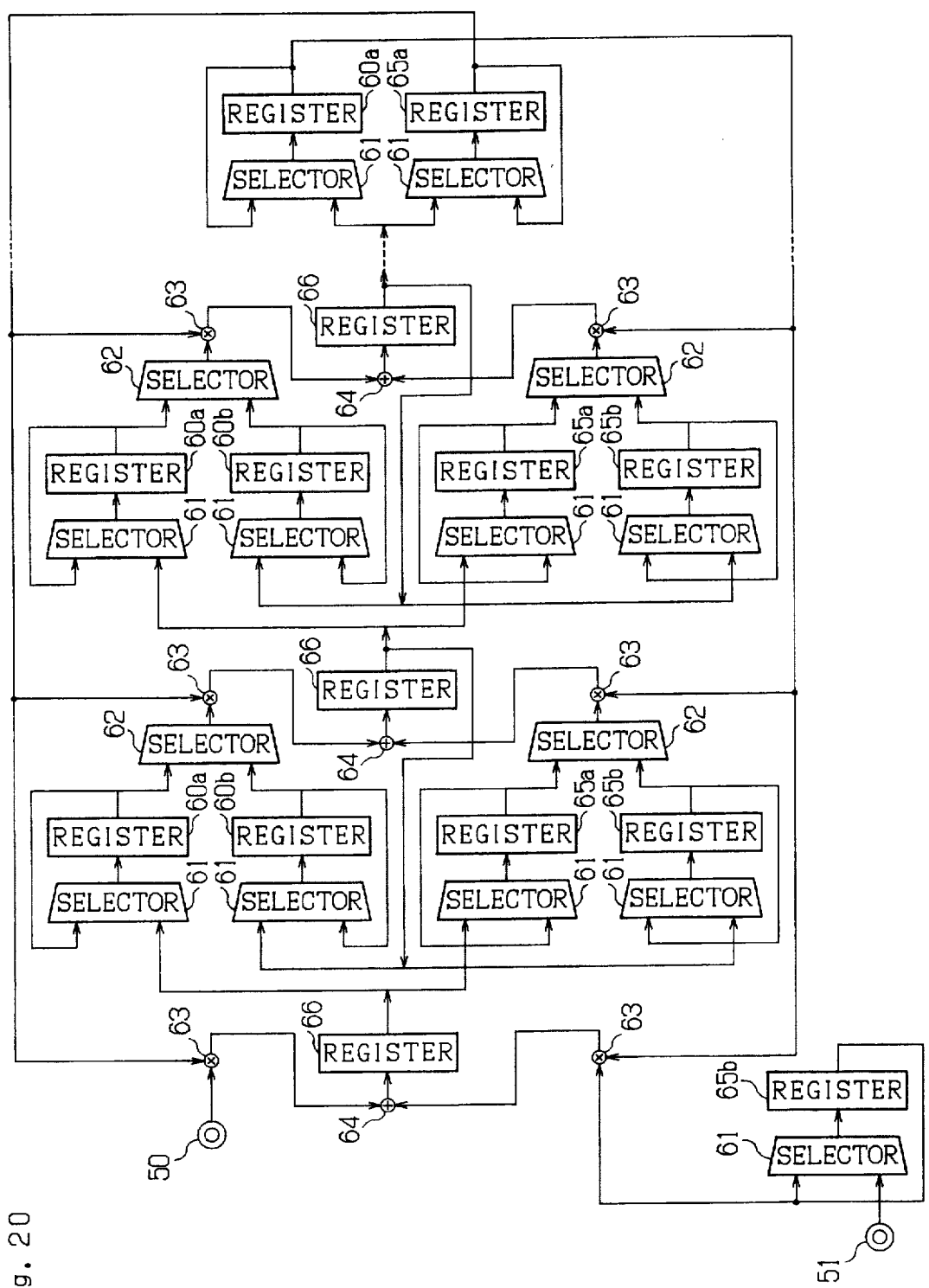
FIG. 20 is a block diagram showing the configuration of a divider for polynomials over a Galois Field in a Euclidean arithmetic circuit.

Next, a third embodiment will be described. The configuration of the embodiment which is represented in the form of a block diagram is the same as that of the first embodiment (FIG. 16). FIG. 20 is a block diagram showing the configuration of a divider section for polynomials over a Galois field in the Euclidean arithmetic circuit 20 of the third embodiment.

In FIG. 20, components indicated by 50 and 51 are identical with those shown in FIG. 5, and therefore their description is omitted. In the figure, 60, 65 and 66 designate registers, 61 and 62 designate selectors, 64 designates adders, and 63 designates multipliers. The registers 60, 65 and 66, the selectors 61 and 62, the adders 64 and the multipliers 63 constitute the Euclidean arithmetic circuit 20 in the third embodiment. Unlike the divider of the prior art Euclidean arithmetic circuit 20 shown in FIG. 5 in which a multiplier is connected to each of the registers, the divider of the prior are Euclidean arithmetic circuit 20 in the third embodiment shown in FIG. 20 is so configured that a multiplier is provided for each pair of the registers, to that the circuit scale is reduced. More specifically, although the selectors 62 and the registers 66 are increased in number, in the case such as the embodiment where a Reed-Solomon code having the minimum distance of 17 is to be decoded, sixteen multipliers (400×16=6,400 gates) can be eliminated, and eight registers 66 (56×8=448 gates) and sixteen selectors 62 (24×16=384 gates) are increased, with the result that the circuit scale can be reduced by about 5,500 gates.

The operation of the error-correcting apparatus of the third embodiment of the invention will be described. In this embodiment, just like the first embodiment, C1 codes which are in the recording direction and have the minimum distance of 17 as shown in FIG. 9 are decoded. The syndrome generator 2, chain search circuit 21 and error-correcting circuit 22 in the third embodiment operate in the same manner as those in the first embodiment. Therefore, their description is omitted, and only the operation of the Euclidean arithmetic circuit 20 which is the feature portion of this embodiment will be described in detail referring to FIG. 20.

When the syndrome generation end signal is input, the registers 60 and 65 are set to the respective initial values. More specifically, $Z^{2t}$ is set in the upper two rows, registers 60a and 60b shown in FIG. 20, and the coefficients of the syndrome polynomial calculated by the syndrome generator 2 are set in the lower two rows, registers 65a and 65b. In response to the system start signal, the division of the polynomial over a Galois field is executed while shifting the data of the dividend side (initially, the upper two rows of the registers 60 in which the data of $Z^{2t}$ are set). The division is repeated until the degree of the polynomial of the dividend side is reduced to a value less than that of the polynomial of the divisor side.

The division operation will be described specifically. In FIG. 20, the divider section is so configured that the selectors 61 connected to the registers 60 of the dividend side select the outputs of the respective registers 66, and that the selectors 61 connected to the registers 65 of the divisor side select the outputs of the respective registers 65. As a result, the data of the divisor side are retained in the registers 65, the data in the registers 60 of the dividend side are shifted, and the divisions are executed.

Figure 21:
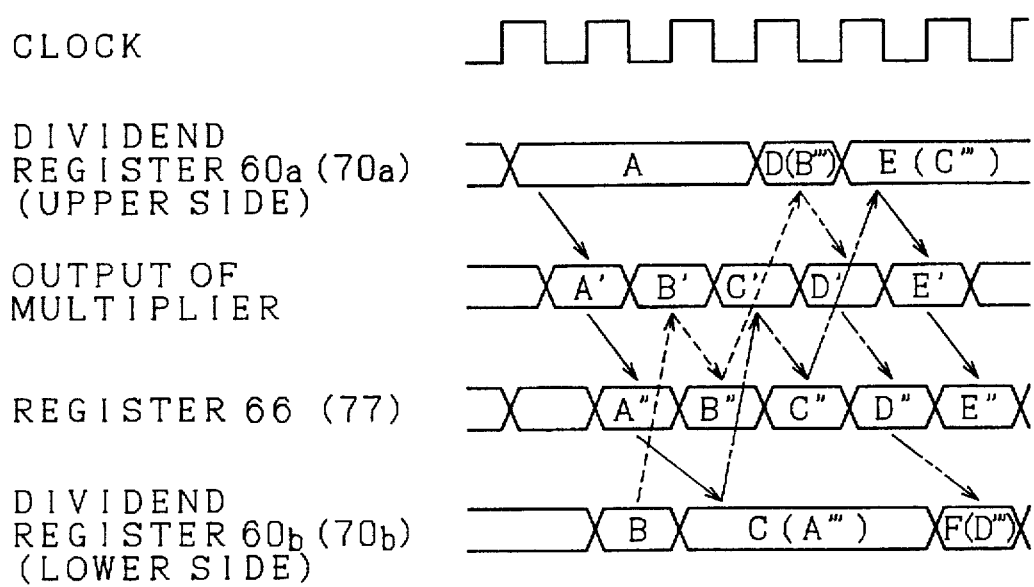
FIG. 21 is a timing chart illustrating the circuit operation of the divider of FIG. 20.

In this process, since the divider of the Euclidean arithmetic circuit 20 in the embodiment is so configured that the multipliers 63 are provided for every two registers, the divisions are executed while sequentially switching the selectors 62. Specifically, the selectors 61 are controlled so that, while data of one row of the registers of the dividend side are subjected to the division, the other row of the registers retain their respective data. FIG. 21 shows a timing chart illustrating the operations of the registers 60 of the dividend side, the registers 60 of the divisor side, the registers 66 and the multipliers 63. This timing chart illustrates the operations performed in the case where the dividend is stored in the registers 60 and the divisor in the registers 65. Even when the portions for storing the divisor and the dividend are replaced with each other, the control timing (the sequence of the arithmetic, and the number of steps) are not changed. The registers and selectors are controlled in accordance with the timing chart shown in FIG. 21. As illustrated, when the division over a Galois field is executed, the degree of the dividend is reduced by two in 4 steps. (In the prior art example, the degree of the dividend is reduced by two in 2 steps.) Accordingly, in the embodiment, the decoding in the Euclidean arithmetic circuit 20 requires about 240 steps.

As a result of the division, the registers of the dividend side store the remainder of the division. Thereafter a further division is performed while setting the polynomial stored in the divisor registers as the dividend, and the remainders of the above divisions as the divisor. This exchange of the dividend and divisor is done by switching the control of the selectors 61. This operation is repeated until the termination conditions of Euclidean algorithm shown in FIG. 1 are satisfied. When the conditions are satisfied, the Euclidean arithmetic circuit 20 calculates coefficient data of the error position polynomial and error value polynomial. The calculated coefficient data are temporarily stored in the register 40. When the Euclidean arithmetic is ended, the Euclidean arithmetic circuit 20 outputs the Euclidean arithmetic end signal to the error-correcting controller 41.

Figure 22:
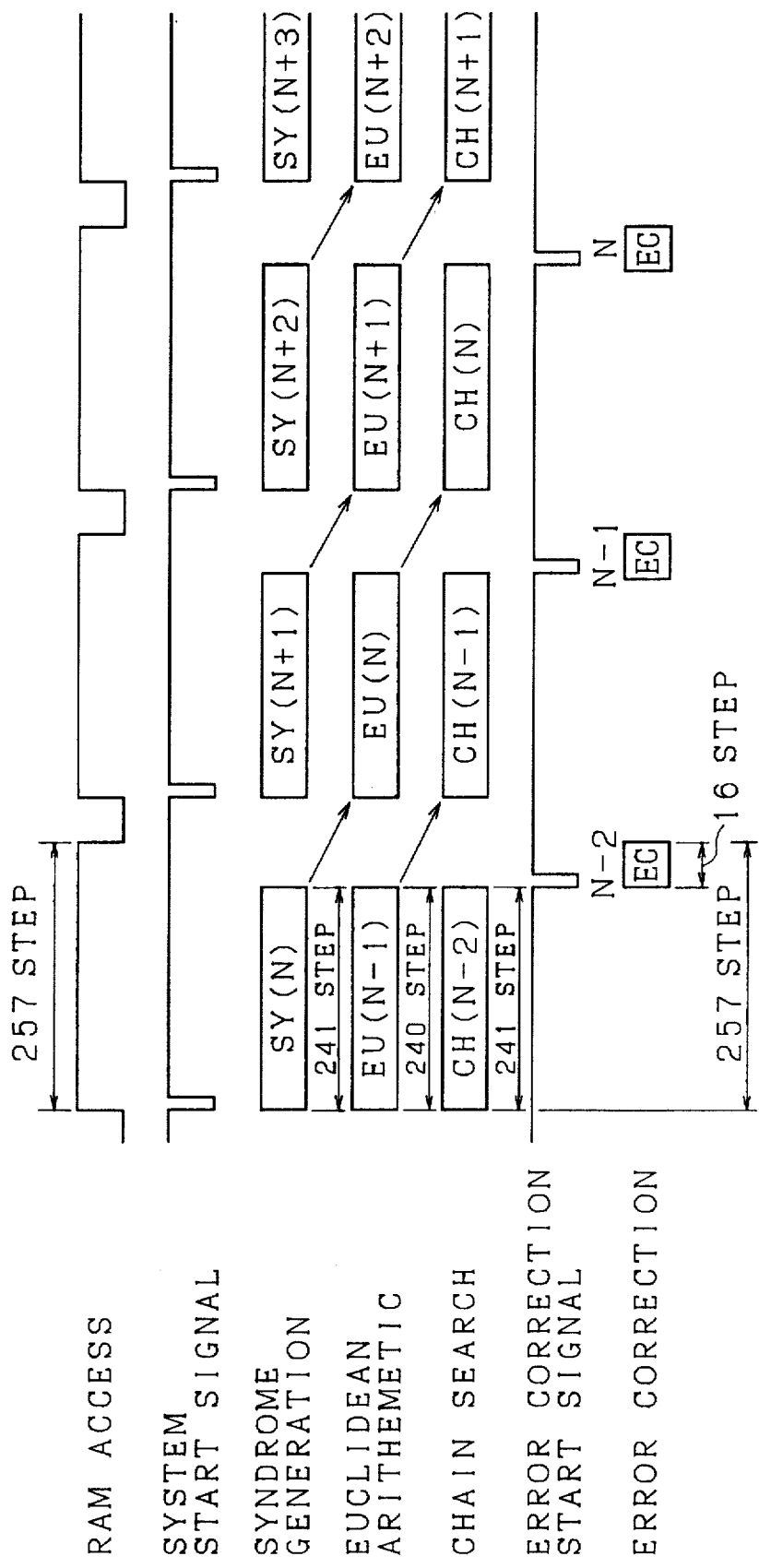
FIG. 22 is a timing chart illustrating the operation of the whole of the error-correcting apparatus.

FIG. 22 shows a timing chart of processing signals in the circuit sections when data of one line shown in FIG. 9 are to be decoded in the third embodiment. In FIG. 22, the portions identical with those of FIG. 17 are designated by the same symbols. In the embodiment, the process of decoding in the Euclidean arithmetic circuit 20 a Reed-Solomon code having the minimum distance of 17 shown in FIG. 9 requires the arithmetic time (Portions EU in FIG. 22) of about 240 steps. The other portions are the same as the first embodiment.

According to the embodiment, in the same manner as the first embodiment, the decoding speed can be increased as compared with the prior art example. Furthermore, the number of decoding steps in the Euclidean arithmetic circuit 20 is increased to a value in the vicinity of the number of steps required fox operating the syndrome generator 2 and the error-correcting circuit 22 (in this case, the number of steps is decided so as to be substantially equal to the number of steps required for the syndrome generation and error correction). This allows the circuit scale to be reduced without increasing the decoding time in the error-correcting apparatus. According to the embodiment, the circuit scale can be reduced by about 5,500 gates as compared with the prior art example. Therefore, the embodiment can increase the operation speed of the circuits without necessitating the parallel arrangement of error-correcting apparatus. Accordingly, as compared with a device in which error-correcting apparatus are connected in parallel, the circuit scale can be greatly reduced.

In the embodiment, the circuit scale of the Euclidean arithmetic circuit 20 is decided so that the maximum number of decoding steps is substantially equal to the number of steps required for the chain search or the syndrome generation. The manner of reducing the circuit scale is not limited to this. It is a matter of course that, widen a sufficient time may be used for the decoding process, this time margin can be diverted to the reduction of the circuit scale. Also in the embodiment, in the same manner as the first and second embodiments, the Euclidean arithmetic circuit 20 and chain search circuit 21 which do not conduct the data access on the RAM 1 may be operated in parallel with the syndrome generator 2, whereby the error correction is allowed to be performed in a shortest decoding time.

Fourth embodiment

Figure 13:
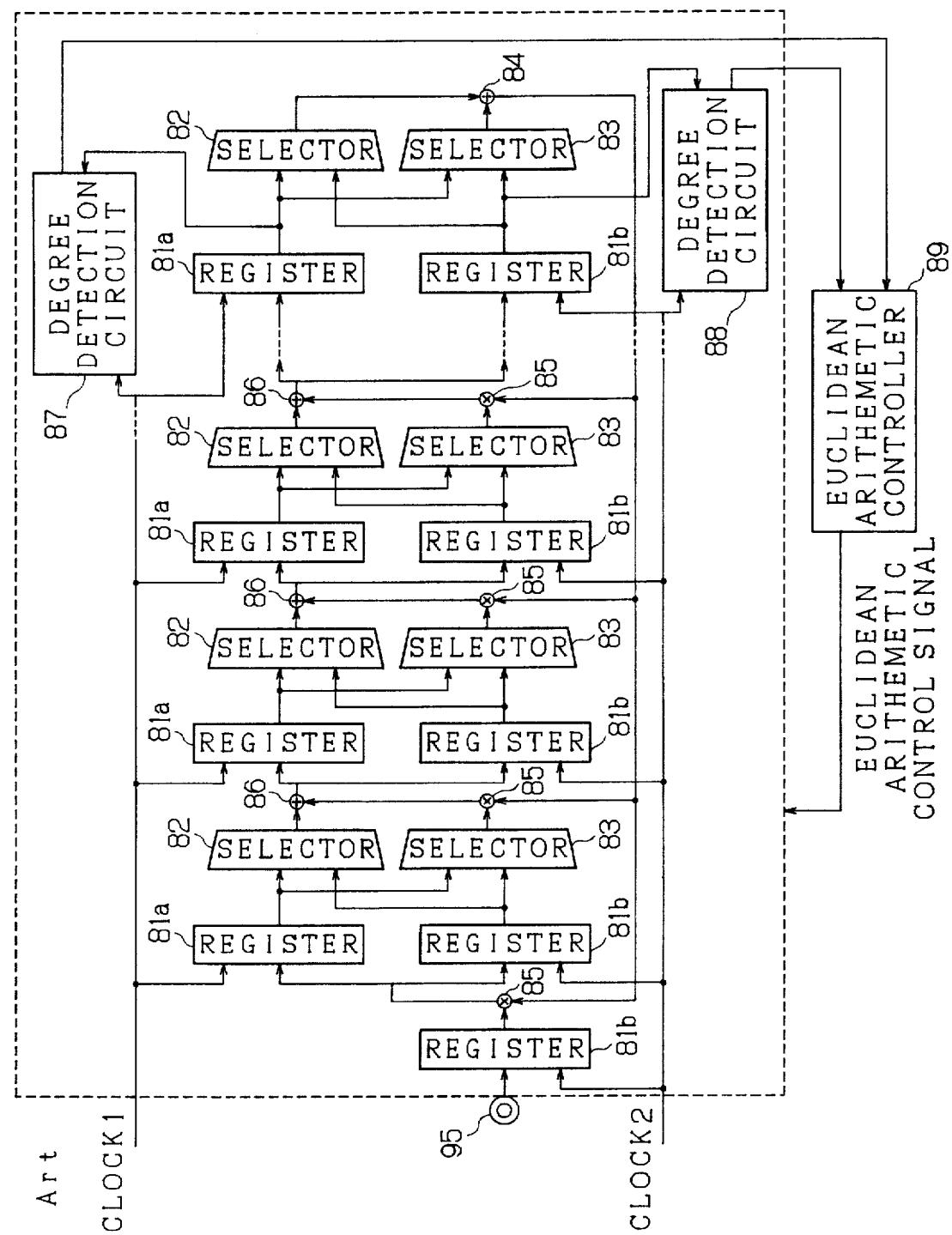
FIG. 13 is a block diagram showing the configuration of a divider For performing the division of polynomials over a Galois Field in the Euclidean arithmetic in the prior art error-correcting apparatus.
Figure 15C:
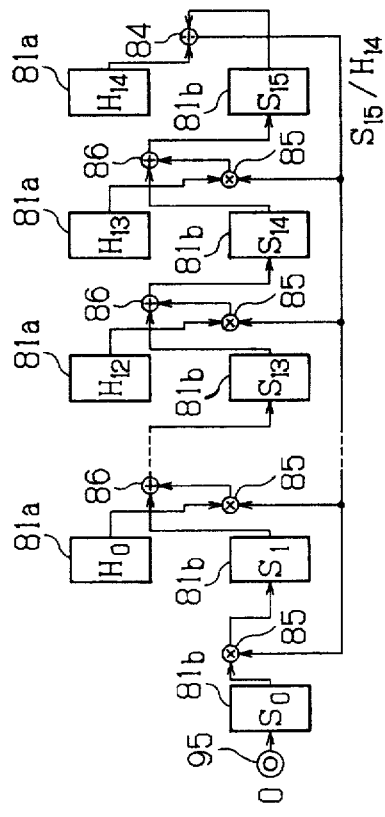
FIG. 15($a$)–($d$) are diagrams illustrating the operation of the divider for performing the division of polynomials over a Galois field in the Euclidean arithmetic in the prior art error-correcting apparatus.
Figure 15D:
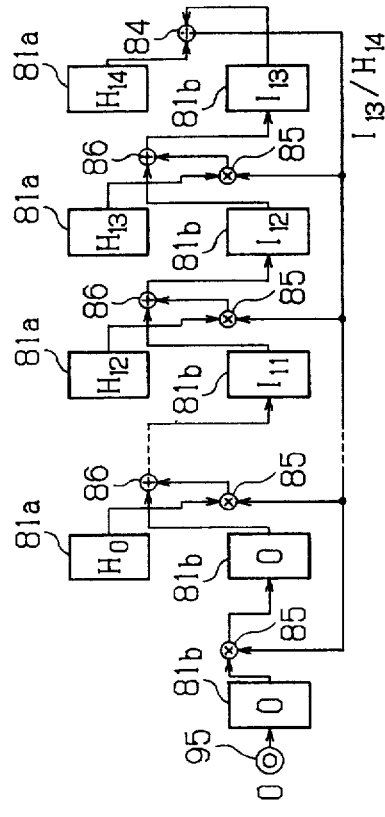
Figure 15A:
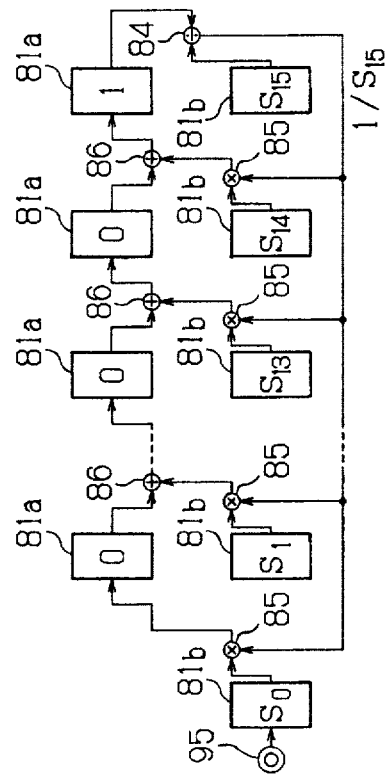
Figure 15B:
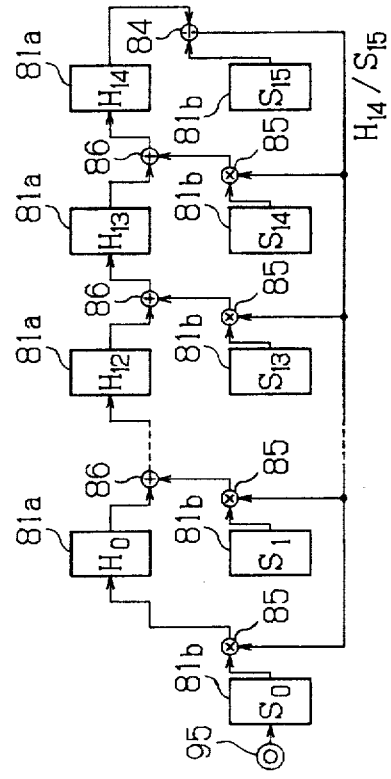
Figure 23:
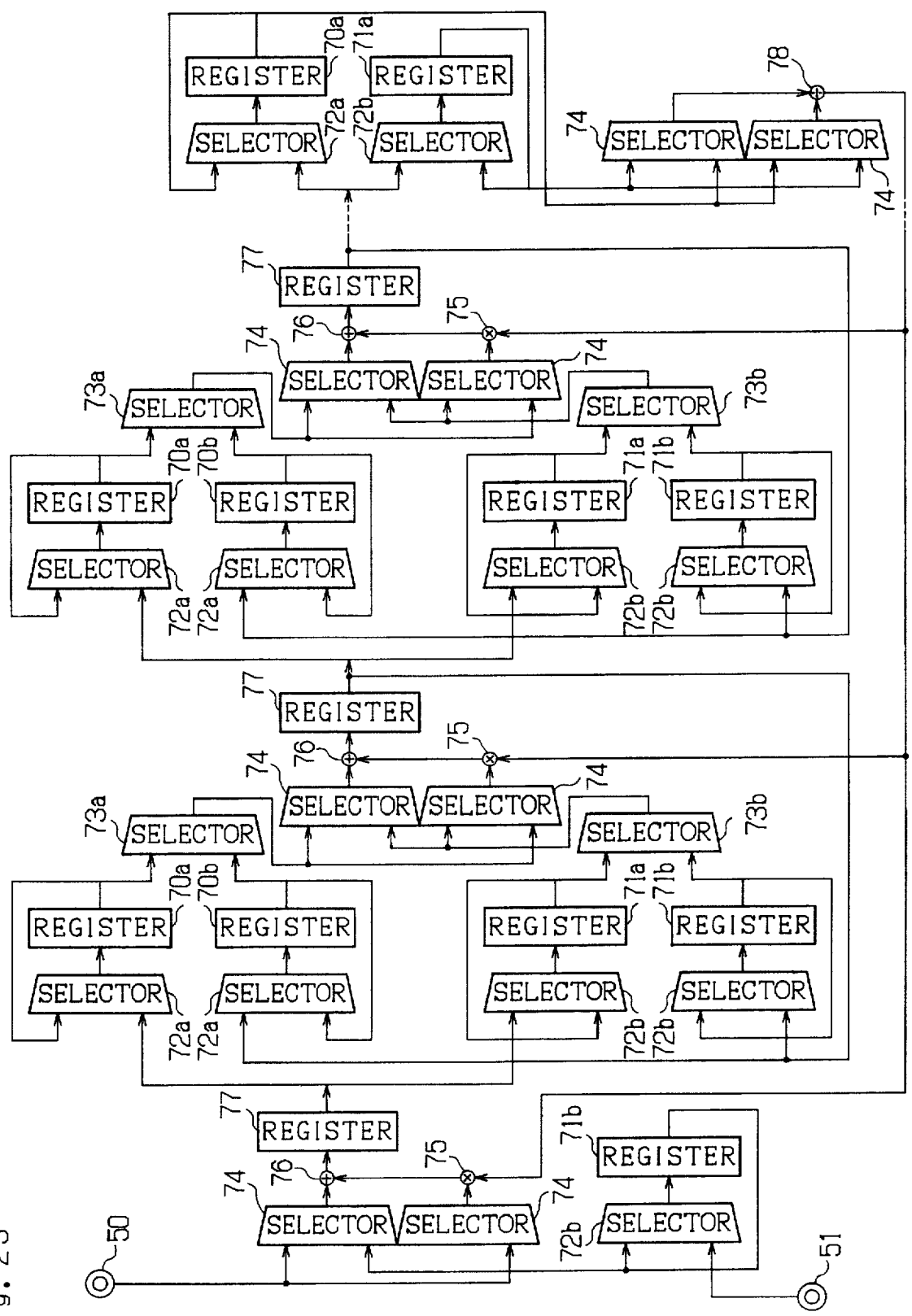
FIG. 23 is a block diagram showing the configuration of another divider for polynomials over a Galois Field in a Euclidean arithmetic circuit.

Next, a fourth embodiment will be described. The fourth embodiment includes a modification of the divider for executing the division of polynomials over a Galois field in the Euclidean arithmetic circuit 20 of the error-correcting apparatus of the third embodiment. FIG. 23 is a block diagram showing the configuration of the divider section of the Euclidean arithmetic circuit 20 according to the fourth embodiment. The embodiment has the basic configuration shown in FIG. 13.

In FIG. 23, components indicated by 50 and 51 are identical with those shown in FIG. 5, and therefore their description is omitted. In the figure, 70 and 71 designate registers, 72, 73 and 74 designate selectors, 75 designates multipliers, 76 designates adders, 77 designates registers, and 78 designates a divider. The registers 70 and 71, the selectors 72, 73 and 74, the multipliers 75, the adders 76, the registers 77 and the divider 78 constitute the divider for polynomials over a Galois field in the Euclidean arithmetic circuit 20. In the division of the embodiment, the coefficients of each divisor are multiplied by a result obtained by dividing the highest-degree coefficient of the dividend by the highest-degree coefficient of the divisor. The divider of the Euclidean arithmetic circuit 20 shown in FIG. 23 executes the division of polynomials over a Galois field in the following manner: After the dividend and divisor are selected by the selectors 74, the coefficient data of the divisor side are multiplied by the output of the divider 78, and then added with the coefficient data of the dividend side.

In the fourth embodiment, therefore, all the multipliers connected to the dividend side can be eliminated, and the multipliers connected to the registers of the divisor side are provided for every two registers, thereby reducing the circuit scale in the same fashion as the third embodiment. More specifically, although the selectors 74 and the registers 78 are increased in number as compared with the third embodiment, in the case where a Reed-Solomon code having the minimum distance of 17 is to be decoded, seven multipliers (400×7=2,800 gates) can be eliminated, and sixteen selectors 74 (24×16=384 gates) and one divider 78 (about 2,000 gates) are increased, with the result that the circuit scale can be reduced by about 400 gates.

The operation of the error-correcting apparatus of the fourth embodiment of the invention will be described. In this embodiment, just like the first embodiment, C1 codes which are in the recording direction and have the minimum distance of 17 as shown in FIG. 9 are decoded. The syndrome generator 2, chain search circuit 21 and error-correcting circuit 22 in the fourth embodiment operate in the same manner as those in the First embodiment. Therefore, their description is omitted, and only the operation of the Euclidean arithmetic circuit 20 which is the feature portion of the embodiment will be described in detail referring to FIG. 23.

When the syndrome generation end signal is input, the registers 70 and 71 are set to the respective initial values. More specifically, $Z^{2t}$ is set in the upper two rows, registers 70a and 70b shown in FIG. 23, and the coefficients of the syndrome polynomial calculated by the syndrome generator 2 are set in the lower two rows, registers 71a and 71b.

In response to the system start signal, the division of the polynomials over a Galois field is executed while shifting the data of the dividend side (initially, the upper two rows of the registers 70 in which the data of $Z^{2t}$ are set). The division is repeated until the degree of the polynomial of the dividend side is reduced to a value less than that of the polynomial of the divisor side.

The division operation will be described specifically. In FIG. 23, the divider section is so configured that the selectors 72a connected to the registers 70 of the dividend side select the outputs of the respective registers 77, and that the selectors 72b connected to the registers 71 of the divisor side select the outputs of the respective registers 71. As a result, the data of the divisor side are retained in the registers 71, the data in the registers 70 of the dividend side are sequentially shifted, and the divisions are executed.

In this process, the divider of the prior art Euclidean arithmetic circuit 20 in the embodiment operates so that the coefficients of the divisor are multiplied by the output data of the divider 78. Since the multipliers 75 are provided for every two registers, the divisions are executed by sequentially switching the selectors 73. Specifically, the selectors 72 are controlled so that, while data of one row of the registers of the dividend side are subjected to the division, the other row of the registers retains their respective data. The whole of the circuit is controlled in the same manner as the third embodiment (see FIG. 21). This timing chart illustrates the operation performed in the case where the dividend is stored in the registers 70 and the divisor in the registers 71.

The other operation manner and effects of the fourth embodiment such as that the circuit scale can be reduced without increasing the decoding time are the same as those of the third embodiment described above, and therefore their description is omitted.

In the third embodiment (fourth embodiment), in order to retain the data in the registers 60 and 65 (70 and 71), all the registers 60 and 65 (70 and 71) are provided with the selectors 61 (72). Another configuration may be employed. For example, a process may be done in which the clock signal that is to be supplied to the registers 60 and 65 (70 and 71) retaining the data is stopped. This modification can attain the same effects. It is needless to say that, since the data input through the input terminal 50 is 0, the multiplier 63 (75) and register 66 (77) of the first stage connected to the input, terminal 50 can be omitted. The circuit, configuration in which the number of steps of decoding the polynomials over a Galois field in the Euclidean arithmetic circuit 20 is doubled has been described. The circuit is not restricted to have this configuration, and may have another configuration in which the decoding can be done in steps of an arbitrary number such as a triple or quadruple number as far as the step number is substantially equal to the step number required for operating the syndrome generator 2 and the error-correcting circuit 22. Moreover, the step number for performing the decoding in the Euclidean arithmetic circuit 20 is set so as to be substantially equal to the step number required for operating the syndrome generator 2 and the error-correcting circuit 22. It is a matter of course that, when a sufficient time may be used for the decoding process, the step number for performing the decoding may be further increased while attaining the same effects.

Next, the operation of the error-correcting circuit 22 which is common to the above-described embodiments will be described with reference to FIGS. 24 and 25. As described above, on the basis of the error position data from the chain search circuit 21 and the error value polynomial calculated by the Euclidean arithmetic circuit 20, the error-correcting circuit 22 performs the error correction on data in the RAM 1 in which the error position has been calculated. Referring to a timing chart shown in FIG. 24, the operation of the error-correcting circuit 22 will be described. On the basis of the error position data from the chain search circuit 21, the error-correcting controller 41 outputs the readout addresses and reading control signal for reading out data in the RAM 1 in which the error position has been calculated. In this case, as shown in FIG. 24, eight erroneous data in the RAM 1 are continuously read out in sequence.

The erroneous data which have been continuously read out from the RAM 1 are respectively added with the error values calculated in the error-correcting circuit 22, at the error correction timing shown in FIG. 24. At the same time the readout of all the data having the calculated error position from the RAM 1 is completed, the error-corrected data are started to be sequentially written at the addresses where the erroneous data are stored. In the case that eight errors are to be corrected, the number of operation steps of the error-correcting circuit 22 is 16, resulting in that the operation speed is increased by 8 clocks as compared with the prior art apparatus in which at least 24 steps are required.

Similarly, the other operation of the error-correcting circuit 22 will be described with reference to the timing chart of FIG. 25. In this example, on the basis of the error position data from the chain search circuit 21, the error-correcting controller 41 outputs the readout addresses and reading control signal for reading out from the RAM 1 the data whose error position has been calculated. In this case, two erroneous data in the RAM 1 are continuously read out as shown in FIG. 25

Figure 25:
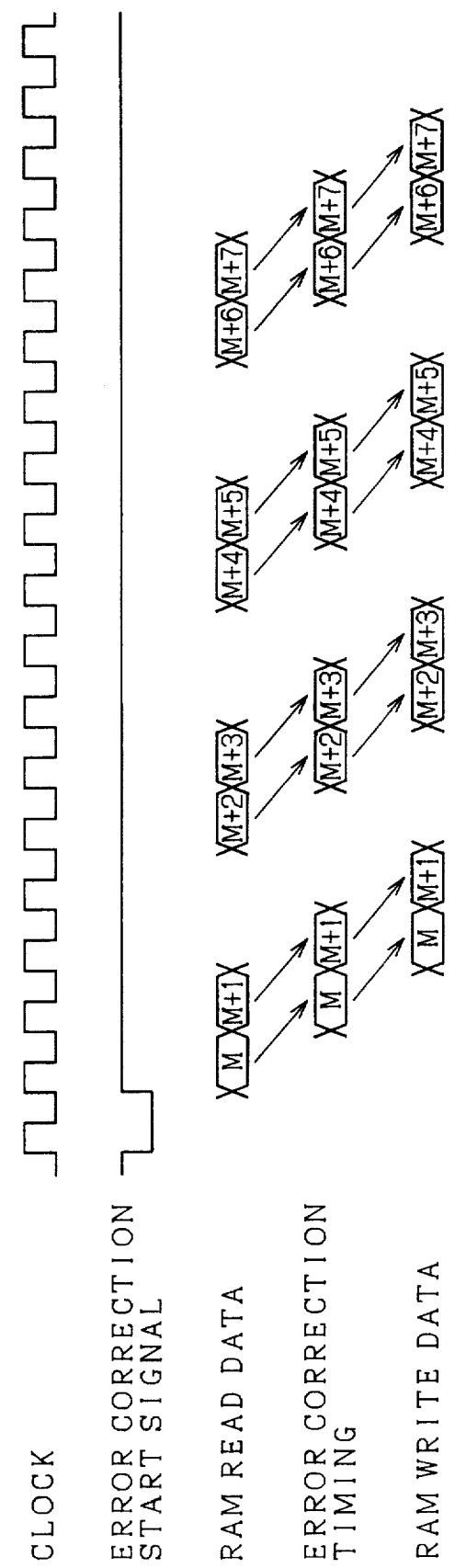
FIG. 25 is another timing chart illustrating the circuit operation of the error-correcting circuit.

The two erroneous data which have been continuously read out from the RAM 1 are respectively added with the error values calculated in the error-correcting circuit 22, at the error correction timing shown in FIG. 25. The two error-corrected data are continuously written at the addresses where the erroneous data are stored, at the timing shown in FIG. 25. This operation is repeated a number of times which is equal to the number of erroneous data to be corrected. In the case that eight errors are to be corrected as shown in FIG. 25, the number of operation steps of the error-correcting circuit 22 is 16, resulting in that the operation speed is increased by 8 clocks as compared with the prior art apparatus in which at least 24 steps are required.

In the acceleration of an error-correcting apparatus, generally, the time required for accessing data in the RAM 1 causes a bottleneck as described in the above embodiments. Although the decoding time in the other circuits can be shortened by conducting their operations in parallel as described in the above embodiments, the data access to the RAM 1 cannot be performed in a parallel manner. Therefore, the key point for realizing the high-speed operation is how many number of calculation steps in the syndrome generator 2 and the error-correcting circuit 22 which conduct data access to the RAM 1 can be reduced. When the error-correcting circuit 22 of the embodiment is employed, a process of decoding the C1 code shown in FIG. 9 and having the minimum distance of 17 requires at least about (241+16) steps. Although the embodiment has been described by illustrating the case where eight symbols are subjected to the error correction, the invention is not restricted to this. In the above, all or two erroneous data are successively read out from the RAM 1. The manner of reading out data is not limited to this. It is a matter of course that any manner of reading out data can attain the same effects as far as the number of data to be successively read out is two or more. For example, three erroneous data may be successively read out from the RAM 1, and then error-corrected data may be written to the RAM 1.

In the first to fourth embodiments described above, using the Euclidean algorithm, an error position polynomial and error value polynomial are obtained from a syndrome obtained in the syndrome generator 2. The invention is not restricted to this. It is needless to say that, even when an error position polynomial and error value polynomial are obtained by another method such as the Barlekamp's algorithm, an error-correcting code can be rapidly decoded by operating the syndrome generator 2, the Euclidean arithmetic circuit 20 and the chain search circuit 21 in parallel.

In the embodiments, a Reed-Solomon code is used as an error-correcting code. The invention is not restricted to this. The invention may be applied to an error-correcting apparatus for decoding another linear error-correcting code such as a BCH code.

The decoding of C1 codes shown in FIG. 9 has been described. The invention is not restricted to this. It is needless to say that C2 codes can be decoded by the same circuit configuration, while attaining the same effects. The configuration of an error-correcting code is not limited to those shown in FIGS. 8 and 9. The embodiments can decode an error-correcting code in the form of a double or more product code, while attaining the same effects. Also for a code in the form of a product, code in which a Reed-Solomon code is combined with a BCH code, the high speed operation of the decoder can be realized by the above-described arrangements.

The three circuits, the syndrome generator 2, the Euclidean arithmetic circuit 20 and the chain search circuit 21 are controlled so as to simultaneously operate, on the basis of the system start signal. The timing of controlling the parallel operation is not restricted to this. For example, immediately after the generation of a syndrome, the initial value of the Euclidean arithmetic circuit 20 may be set so that the Euclidean arithmetic circuit 20 operates. Alternatively, the chain search circuit 21 may operate immediately after the termination of the Euclidean arithmetic. The timing of outputting syndrome data from the syndrome generator 2, the timing of setting the initial value in the Euclidean arithmetic circuit 20, the timing of outputting the coefficient data of an error position polynomial and error value polynomial to the register 41, the timing of setting the initial value in the chain search circuit 21, and the control timing in the error-correcting circuit 22 are not restricted to those described above. The same effects may be attained by operating in parallel the three circuits, the syndrome generator 2, the Euclidean arithmetic circuit 20 and the chain search circuit 21.

The configurations of the syndrome generator 2, the divider for a Galois field in the Euclidean arithmetic circuit 20 and the chain search circuit 21 are not restricted to those shown in FIGS. 3, 5 and 6. For example, the arithmetic circuit section may be configured by an arithmetic circuit or the like such as a microcomputer, or a ROM of a large capacity.

The three circuits, the syndrome generator 2, the Euclidean arithmetic circuit 20 and the chain search circuit 21 are operated in parallel. The invention is not restricted to this. For example, four circuits including the error-correcting circuit 22 in addition to the three circuits may be operated in parallel, while attaining the same effects.

The operation of the error-correcting circuit 22 is not limited to the above. When a sufficient time may be used for the decoding process, for example, the operation may be repeated in which erroneous data are read out from the RAM 1 in accordance with error positions detected by the chain search circuit 21 as described in conjunction with the prior art example and subjected to the error correction, and the error-corrected data are written again to the RAM 1.

Although the output of the Euclidean arithmetic circuit 20 is temporarily stored in the register 40, a register for storing coefficients of an error position polynomial and error value polynomial is not essential, and may be omitted depending on the kind of an adopted control method.

The syndrome generator 2, the Euclidean arithmetic circuit 20 and the chain search circuit 21 are controlled so as to simultaneously start to operate. The invention is not restricted to this. Even when the three circuits start to operate at different timing, the same effects can be attained.

Next, other embodiments (fifth to ninth embodiments) of the invention will be described which are characterized in the configuration of the divider section for polynomials over a Galois field.

Fifth embodiment

Figure 26:
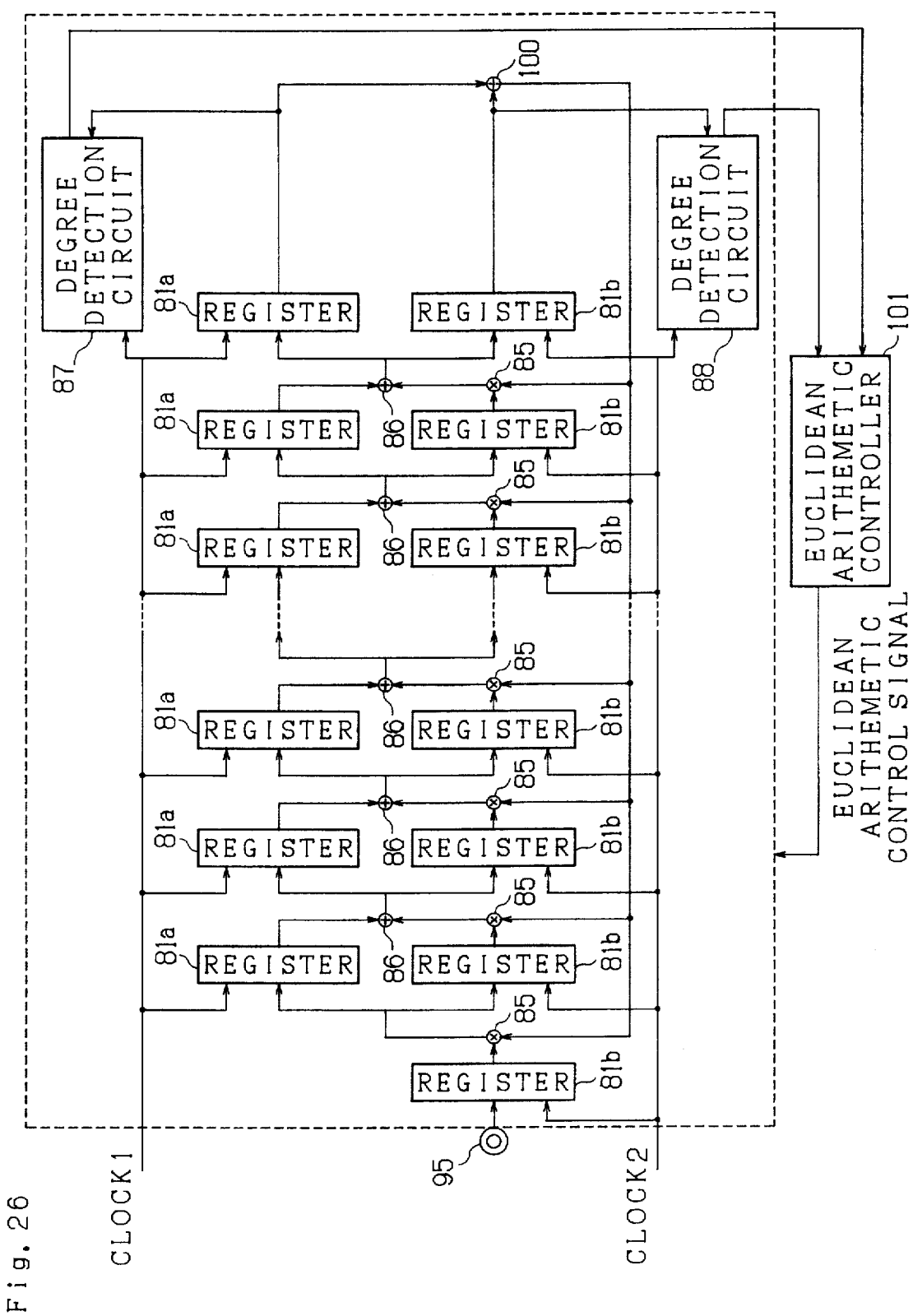
FIG. 26 is a block diagram showing the configuration of a divider for performing the division of polynomials over a Galois field in the Euclidean arithmetic in the error-correcting apparatus according to the invention.

FIG. 26 is a block diagram showing the configuration of a divider section for polynomials over a Galois field in an error-correcting apparatus which is the fifth embodiment of the invention. In the figure, components indicated by 81a, 81b, 85 to 88 and 95 are identical with those shown in FIG. 13, and therefore their description is omitted. In the figure, 100 designates a divider for performing the division in which the outputs of the registers 81a are used as the dividend and the outputs of the registers 81b as the divisor, and 101 designates a Euclidean arithmetic controller which controls the divider section for the Euclidean arithmetic, Next, the operation principle of the divider which has the configuration shown in FIG. 26 and executes a division will be briefly described. Just like the prior art example, a dividend polynomial and divisor polynomial are expressed as follows:

Dividend polynomial: $M1(Z)=A_n Z^n + A_{n-1} Z^{n-1} + \ldots + A_1 Z + A_0$

Divisor polynomial: $M2(Z)=B_m Z^M + B_{m-1} Z^{m-1} + \ldots + B_1 Z + B_0$ where n>m. A longhand calculation procedure of the division is shown in Eq. 4 below. In the embodiment, as the initial values, the coefficient data of the dividend polynomial are stored in the registers 81a, and the coefficient data of the divisor polynomial in the registers 81b. At first, as indicated in Eq. 4, the coefficient data of the highest degree of the divisor polynomial is made equal to the coefficient data of the highest degree of the dividend polynomial by multiplying the coefficient data of the dividend polynomial by the division result output from the divider 100, and the division (the operation for reducing the degree of the dividend polynomial by one) is conducted. In the same manner as the prior art example, the division is repeated until the degree of the remainder of the dividend polynomial becomes smaller than the degree of the divisor polynomial. In Eq. 4, the coefficient data of the last remainder polynomial are represented by $C_i$ (i=0, 1, 2, ..., m−1).

Step 1  $\{A_n Z^n + A_{n-1} Z^{n-1} + \ldots + A_1 Z + A_0\} +$  [Eq. 4]

Step 2  $\dfrac{A_n}{B_m} Z^{n-m} \times \{B_m Z^m + B_{m-1} Z^{m-1} + \ldots + B_1 Z + B_0\}$ $\left\{ \left(A_{n-1} + \dfrac{A_n}{B_m} B_{m-1}\right) Z^{n-1} + \ldots + \left(A_{n-m+1} + \dfrac{A_n}{B_m} B_1\right) Z^{n-m+1} + \left(A_{n-m} + \dfrac{A_n}{B_m} B_0\right) Z^{n-m} + \ldots + A_1 Z + A_0 \right\} +$   Arithmetic result of Step 1

$\dfrac{1}{B_m}\left(A_{n-1} + \dfrac{A_n}{B_m}\right) Z^{n-m-1} \times \{B_m Z^m + B_{m-1} Z^{m-1} + \ldots + B_1 Z + B_0\}$ Step 3  $C_{m-1} Z^{m-1} + C_{m-2} Z^{m-2} + \ldots + C_1 Z + C_0$   Arithmetic result of Step n + m + 2 n − m + 1

Ci: Coefficient of remainder Polynomial

In the Euclidean algorithm shown in FIG. 1, when the degree of the remainder polynomial:

Remainder polynomial: $R(Z) = C_{m-1} Z^{m-1} + C_{m-2} Z^{m-2} + \ldots + C_1 Z + C_0$ fails to satisfy the predetermined conditions, the division is repeated while setting the divisor polynomial M2(Z) as the dividend polynomial, and the remainder polynomial R(Z) as the divisor polynomial.

Eq. 5 shows the calculation procedure of dividing M2(Z) by R(Z). In this longhand calculation, for the sake of convenience, it is assumed that the highest degree $C_{m-1}$ of the remainder polynomial R(Z) is not 0. When the highest degree is 0, generally, the degree detection circuits 87 and 88 shown in FIG. 26 judge the degrees of the dividend polynomial and divisor polynomial in the same manner as the prior art example, the coefficient data of the divided polynomial are shifted until the highest degree of the dividend polynomial is not 0, and the division is executed. Also when the highest degree of the remainder polynomial during the division becomes 0, similarly, the coefficient data of the remainder polynomial are shifted until the highest degree of the remainder polynomial is not 0, and the division is executed.

those of the divisor polynomial. When the division is to be done, therefore, the coefficient data of the highest degree of the dividend polynomial is made equal to the coefficient data of the highest degree of the divisor polynomial by multiplying the coefficient data of the dividend polynomial by the division result output from the divider 100 indicated in Eq. 5, and the division (the operation for reducing the degree of the dividend polynomial by one) is conducted. In the same manner as the prior art example, the division is repeated until the degree of the remainder of the dividend polynomial becomes smaller than the degree of the divisor polynomial. The coefficient data of the resultant remainder polynomial (indicated by R″(Z)) are represented by $E_i$ (i=0, 1, 2, ..., m−2).

When the degree of the remainder polynomial R″(Z) ($R''(Z) = E_{m-2} Z^{m-2} + E_{m-3} Z^{m-3} + \ldots + E_1 Z + E_0$) fails to satisfy the conditions shown in FIG. 1, the division is repeated while setting R(Z) as the dividend polynomial, and R″(Z) as the divisor polynomial. Eq. 6 shows the longhand calculation. Also in this case, in order to simplify the illustration, it is assumed that the highest degree $E_{m-2}$ of the remainder polynomial is not 0. As described above, selectors for exchanging the coefficient data of the dividend polynomial with those of the divisor polynomial are not provided.

Step 1  $\dfrac{C_{m-1}}{B_m} \{B_m Z^m + B_{m-1} Z^{m-1} + \ldots + B_2 Z^2 + B_1 Z + B_0\}$ — Dividend +  [Eq. 5]

$Z\{C_{m-1} Z^{m-1} + C_{m-2} Z^{m-2} + \ldots + C_1 Z + C_0\}$ — Divisor

Step 2  $C_{m-1}/\left(\dfrac{C_{m-1}}{B_m} B_{m-1} + C_{m-2}\right) \times \left\{ \left(\dfrac{C_{m-1}}{B_m} B_{m-1} + C_{m-2}\right) Z^{m-1} + \ldots + \left(\dfrac{C_{m-1}}{B_m} B_2 + C_1\right) Z^2 + \left(\dfrac{C_{m-1}}{B_m} B_1 + C_0\right) Z + \dfrac{C_{m-1}}{B_m} B_0 \right\} +$ $\{C_{m-1} Z^{m-1} + C_{m-2} Z^{m-2} + \ldots + C_2 Z^2 + C_1 Z + C_0\}$ $E_{m-2} Z^{m-2} + E_{m-3} Z^{m-3} + \ldots + E_1 Z + E_0$ — Remainder Ei: Coefficient of remainder polynomial These controls are performed by the Euclidean arithmetic controller 101. Unlike the prior art example, the embodiment of FIG. 26 is not provided with selectors for exchanging the coefficient data of the dividend polynomial with Step 1 $\quad \{C_{m-1}Z^{m-1} + C_{m-2}Z^{m-2} + \ldots + C_2Z^2 + C_1Z + C_0\} \leftarrow$ Dividend + [Eq. 6]

$$\frac{C_{m-1}}{E_{m-2}} Z\{E_{m-2}Z^{m-2} + E_{m-3}Z^{m-3} + \ldots + E_1Z + E_0\} \leftarrow \text{Divisor}$$

Step 2 $\quad \left\{ \left(C_{m-2} + \frac{C_{m-1}}{E_{m-2}} E_{m-3}\right)Z^{m-2} + \ldots + \left(C_2 \frac{C_{m-1}}{E_{m-2}} E_1\right)Z^2 + \left(C_1 \frac{C_{m-1}}{E_{m-2}} E_0\right)Z + C_0 \right\} +$ $\left(C_{m-2} + \frac{C_{m-1}}{E_{m-2}} E_{m-3}\right)/E_{m-2} \times \left\{E_{m-2}Z^{m-2} + \ldots + E_2Z^2 + E_1Z + E_0\right\}$ $F_{m-3}Z^{m-3} + F_{m-4}Z^{m-4} + \ldots + F_1Z + F_0 \leftarrow$ Remainder
Fi: Coefficient of remainder polynomial When the division is to be executed in the same manner as Eq. 4, therefore, the coefficient data of the highest degree of the divisor polynomial is made equal to the coefficient data of the highest degree of the dividend polynomial by multiplying the coefficient data of the divisor polynomial by the division result output from the divider 100, and the division (the operation for reducing the degree of the dividend polynomial by one) is conducted.

In the same manner as the prior art example, the division is repeated until the degree of the remainder of the dividend polynomial becomes smaller than the degree of the divisor polynomial. The coefficient data of the resultant remainder polynomial (indicated by R'" (Z)) are represented by $F_i$ (i=0, 1, 2, ..., m–3). This operation is executed until the termination conditions of the Euclidean algorithm are satisfied. The reason why an error position polynomial $\sigma(z)$ and an error value polynomial $\omega(z)$ can be calculated by repeating the operation is that, when an error position or value is calculated, the polynomials are normalized by the highest degree of the respective polynomial. (For the details, refer to the above-mentioned "Code Theory"pp. 169–175.

Next, the operation of the divider section for the Euclidean arithmetic of the error-correcting apparatus for decoding a Reed-Solomon code in accordance with the Euclidean algorithm shown in FIG. 1 will be described with reference to FIG. 26. Just like the prior art example, the case that a Reed-Solomon code having the minimum Hamming distance of 17 which is employed in an optical disk or the like is decoded will be described. The syndrome polynomial S(Z) generated from a reproduced signal is expressed as follows:

$$S(Z)=S_{15}Z^{15}+S_{14}Z^{14}+S_{13}Z^{14}+ \ldots +S_1Z+S_0$$

When the Euclidean arithmetic is started, in response to the Euclidean arithmetic start signal from the Euclidean arithmetic controller 101, the coefficients of the dividend polynomial $Z^{2t}$ which is the initial value are stored in the registers 81a, and the coefficient data of the syndrome polynomial S(Z) which is the divisor polynomial are stored in the registers 81b. In the counters of the degree detection circuits 87 and 88, the values of 16 and 15 which are the initial values of the respective degrees are set, respectively. The degree detection circuits 87 and 88 are constructed so that their count values are decremented by one, each time the contents of the registers 81 storing the coefficient data of the dividend polynomial are shifted. In the embodiment, similarly with the prior art example, registers closer to the right end store the coefficient data of a higher degree.

At the same time, the degree detection circuit 88 checks the syndrome polynomial which is the divisor polynomial, to judge whether the coefficient data of the highest degree is 0 or not. When the coefficient data of the highest degree of the divisor polynomial (the syndrome polynomial) detected in the degree detection circuit 88 is 0, the Euclidean arithmetic controller 101 controls the registers 81b storing the coefficient data of the divisor polynomial, so that the contents of the registers 81b are shifted (in this case, the adders 86 do not perform the adding operation so that the contents of the registers 81b are shifted as they are) and this shifting operation is repeated until the data of the highest degree is not 0. In this case, the count value of the counter of the degree detection circuit 88 is decremented by one for each shift operation.

The registers 81a which store the coefficient data of the dividend polynomial latch the output of the respective adder 86 when the clock signal is input. The registers 81b which store the coefficient data of the divisor polynomial retain the coefficient data. (Although the specific control circuit is not shown in FIG. 26, the configuration for retaining the coefficient data of the divisor polynomial in the registers is realized by inhibiting the clock signals (clock 1 and clock 2) which are to be respectively supplied to the registers 81a and 81b, from being supplied to the registers which store the coefficient data of the divisor side.) The arithmetic circuits (the divider 100, the multipliers 85 and the adders 86) shown in the figure perform the arithmetic defined over a Galois field.

Figure 27A:
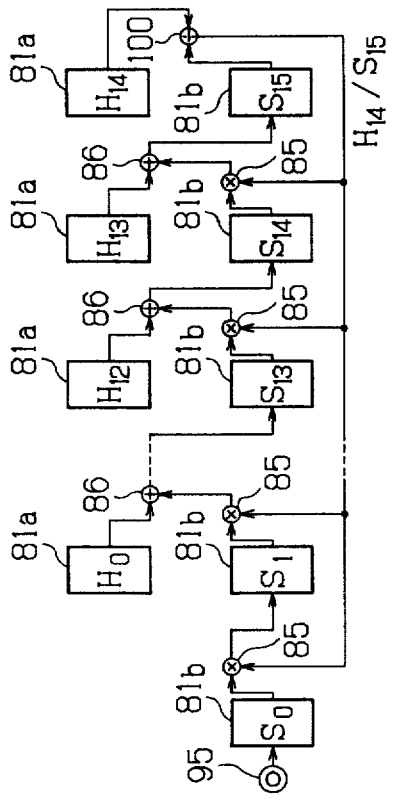
FIG. 27($a$)–($d$) are diagrams illustrating the circuit operation of the divider of FIG. 26.
Figure 27B:
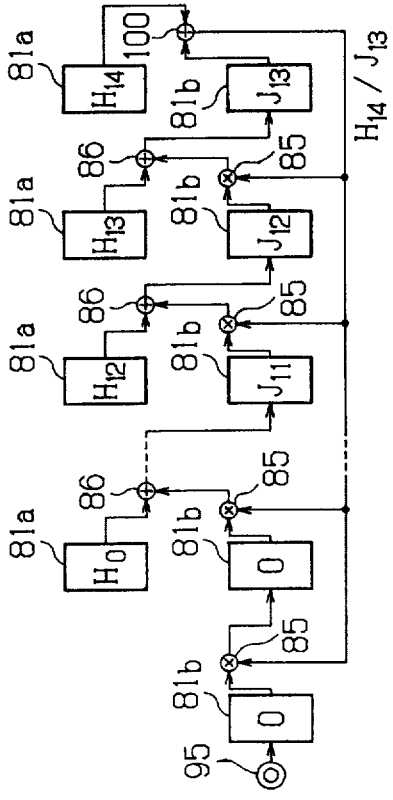
Figure 27C:
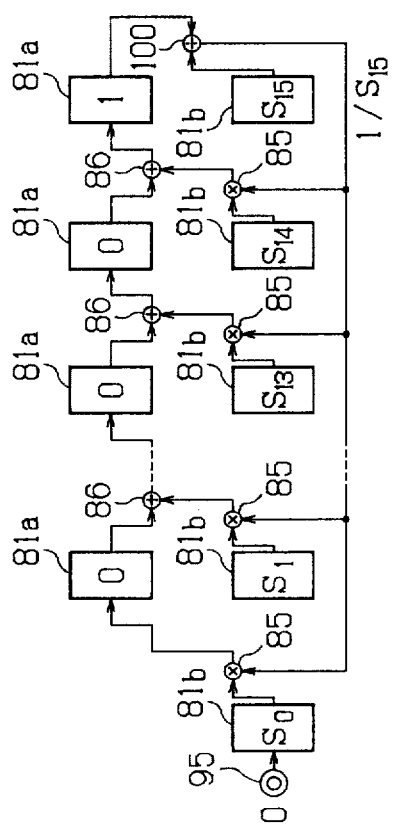
Figure 27D:
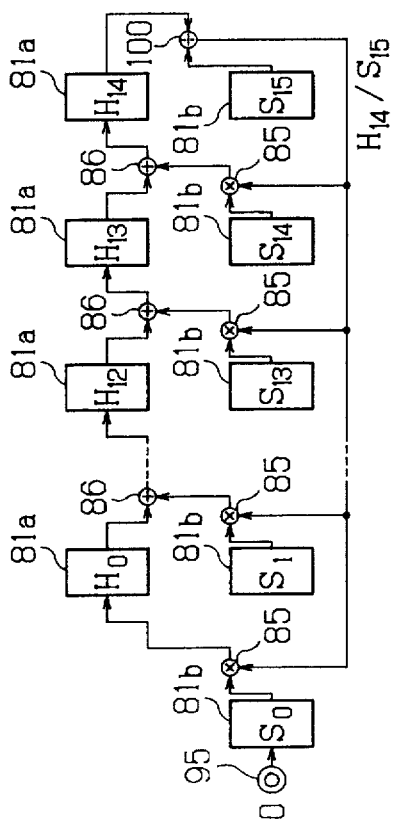

Hereinafter, referring to FIG. 27, the operation of the divider in the Euclidean arithmetic circuit of the embodiment will be described. FIG. 27(a) shows the state where $Z^{16}$ which is the initial value is set as the dividend polynomial in the registers 81a and the syndrome polynomial S(Z) is set as the divisor polynomial in the registers 81b. The numerals and symbols in the boxes representing the registers indicate the coefficient data stored in the respective registers. In order to simplify the description, it is assumed that, in the embodiment, the highest-degree coefficient of the syndrome polynomial is not 0, and that the highest-degree coefficient data of the polynomials stored in the registers are positioned at the right end. The divider 100 performs the division while setting the outputs of the registers 81a as the dividend and the outputs of the registers 81b as the divisor, and outputs the result of the division. In this case, clock 1 is supplied to the registers 81a which store the coefficient data of the dividend side.

The divider of FIG. 27 has the same configuration as that of the divider of FIG. 14, and repeats the shift operation until the degree of the remainder of the dividend polynomial becomes smaller than the degree of the divisor polynomial, thereby performing the division. The end of the division is judged by the Euclidean arithmetic controller 101 on the basis of information indicative of the degrees and output from the degree detection circuits 87 and 88. When the degree detection circuit, 87 (or 88) detects the highest degree of the remainder polynomial becoming 0 during the execution of the division, the Euclidean arithmetic controller 101 controls the divider so that the contents of the registers 81a (or 81b) which store the coefficient data of the remainder polynomial are shifted one place as they are. In this case, the count value of the counter of the degree detection circuit 87 (or 88) is decremented by one.

FIG. 27(*b*) shows the state of the coefficient data stored in the registers 81 at the completion of the division. In the figure, $H_{14}$ to $H_0$ stored in the registers 81a are the coefficient data of the remainder polynomial in the division. When the division operation is ended, the degree detection circuit 87 (or 88) detects the highest degree of the remainder polynomial. If the highest degree is 0, the coefficients of the remainder polynomial are shifted one place as they are, on the basis of the control signal from the Euclidean arithmetic controller 101. This operation is repeated until the coefficient data of the highest degree of the remainder polynomial is not 0. For each of the operations, as described above, the count value of the counter of the degree detection circuit, 87 (or 88) is decremented by one.

When the conditions (in the embodiment, the degree of the remainder polynomial is 7 or less) for terminating the Euclidean arithmetic are satisfied judging from information indicative of the degree of the remainder polynomial which is output from the degree detection circuit 87 (or 88), the Euclidean arithmetic controller 101 terminates the Euclidean arithmetic. When the termination conditions are not satisfied, the controller 101 performs the arithmetic while the polynomial which is the divisor polynomial in the previous arithmetic is set as the dividend polynomial and the remainder polynomial as the divisor polynomial. The coefficient data stored in the registers 81 in this case are shown in FIG. 27(*c*). Unlike the prior art example, the embodiment is not provided with exchange means. Therefore, the connection state in the circuit is not changed, but clock 1 supplied to the registers 81a is stopped and in contrast clock 2 is supplied to the registers 81b. Accordingly, the contents of the registers 81a are retained, and the coefficients of the remainder polynomial are sequentially stored in the registers 81b.

At this time, in the divider in the Euclidean arithmetic circuit, the degree detection circuit 88 judges whether the highest degree of the dividend polynomial (the remainder polynomial) is 0 or not. If 0, control signals are produced so that the contents of the dividend polynomial (the remainder polynomial) stored in the registers 81b are shifted one place as they are. The reason why this operation is done is as follows: The registers for storing a divisor and a dividend to be supplied to the divider 100 are previously determined. In the case that the coefficient data of a dividend polynomial are used as a divisor, when the highest-degree coefficient of the dividend polynomial is 0, the dividend (the highest-degree coefficient of the divisor polynomial) is caused to be divided by 0, with the result that the solution (output) is indeterminate.

The division is executed in the same manner as the above-described example by repeating the shift operation while calculating the contents of the registers storing the coefficient data of the dividend polynomial, until the degree of the remainder of the dividend polynomial becomes smaller than the degree of the divisor polynomial. FIG. 27(*d*) shows the state of the coefficient data stored in the register 81a and 81b at the completion of the division. In the figure, $J_{13}$ to $J_0$ stored in the registers 81b are the coefficient data of the remainder polynomial.

Then, the degree of the remainder polynomial is checked to judge whether or not the predetermined conditions are satisfied. If not, the clock signal supplied to the registers 81a and 81b is switched to another one, and the division operation in accordance with the Euclidean algorithm is conducted again. This division operation is repeated until the degree of the remainder polynomial is 7 or less. When a Reed-Solomon code is to be decoded, therefore, the division of polynomials over a Galois field in accordance with the Euclidean algorithm can be conducted for each polynomial, thereby improving the speed of the error-correcting process. Since no exchange means (selectors) is provided, the circuit scale can be reduced and the control of such selectors is not necessary.

Sixth embodiment

Figure 28:
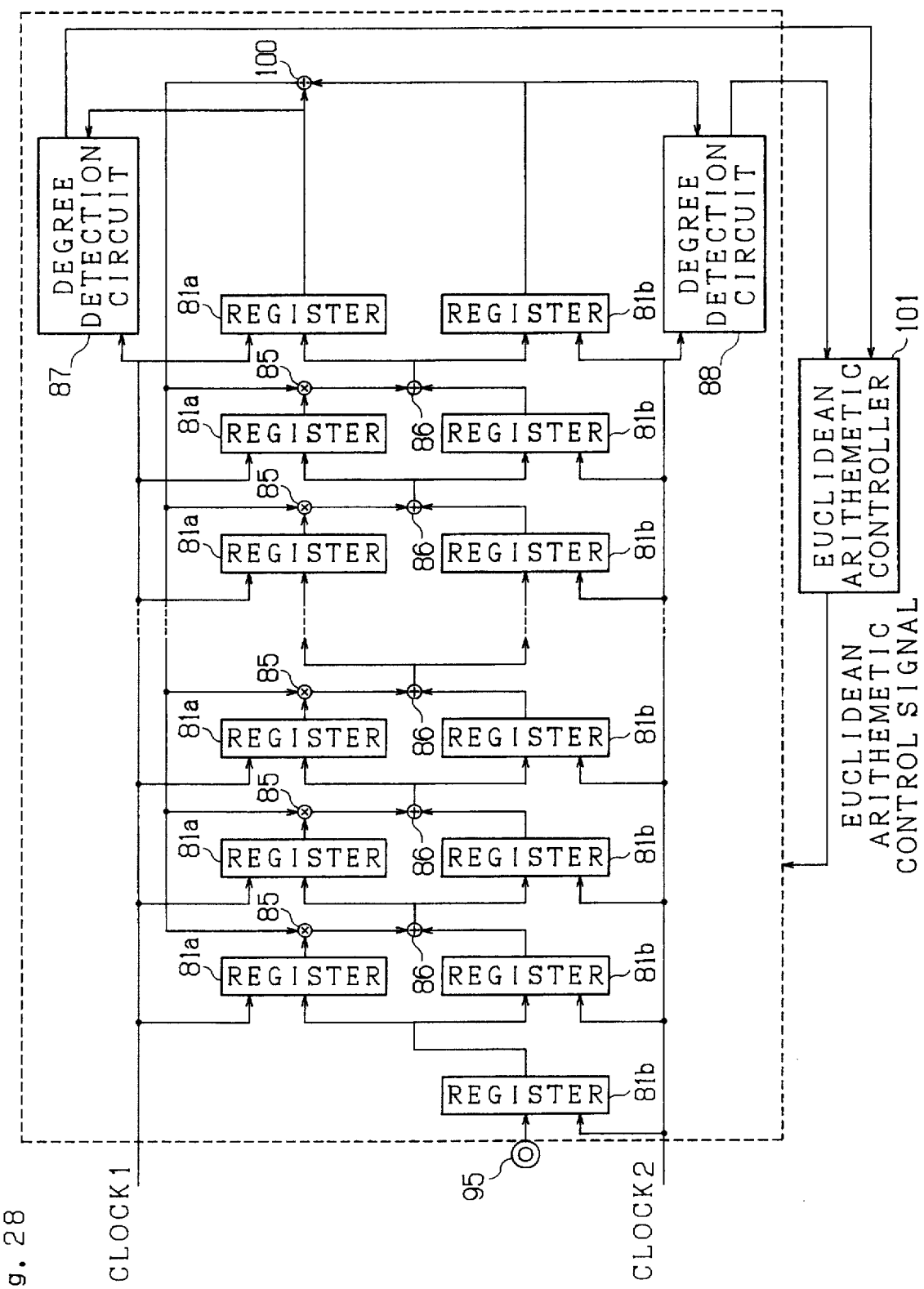
FIG. 28 is a block diagram showing the configuration of another divider for performing the division of polynomials over a Galois field in the Euclidean arithmetic in the error-correcting apparatus according to the invention.

FIG. 28 shows the sixth embodiment of the invention. The circuit configuration of FIG. 28 is the same as that of the fifth embodiment (FIG. 26) except the points described below, and therefore its detailed description is omitted. In the sixth embodiment, the multipliers 85 connected to the registers 81a and 81b are located at the positions different from those in the fifth embodiment. Moreover, the sixth embodiment is different from the fifth embodiment in that the multipliers 85 are connected to the registers to which $Z^{2t}$ is stored as the initial value at the start of the Euclidean arithmetic. This configuration allows the number of the multipliers 85 to be reduced by one as compared with the fifth embodiment, thereby reducing the circuit scale (reduction of about 400 gates).

Hereinafter, in the same manner as the fifth embodiment, the operation of the divider section for the Euclidean arithmetic of the error-correcting apparatus for decoding a Reed-Solomon code in accordance with the Euclidean algorithm shown in FIG. 1 will be described with reference to FIG. 28. In the same manner as the fifth embodiment, the case that a Reed-Solomon code having the minimum Hamming distance of 17 which is employed in an optical disk or the like is decoded will be described. The syndrome polynomial. S(Z) generated from a reproduced signal is expressed by $$S(Z)=S_{15}Z^{15}+S_{14}Z^{14}+S_{13}Z^{13}+\ldots+S_1Z+S_0$$

When the Euclidean arithmetic is started, in response to the Euclidean arithmetic start signal from the Euclidean arithmetic controller 101, the coefficients of the dividend polynomial $Z^{2t}$ which is the initial value are stored in the registers 81a, and the coefficient data of the syndrome polynomial S(Z) which is the divisor polynomial are stored in the registers 81b. In the counters of the degree detection circuits 87 and 88, the values of 15 and 16 which are the initial values of the respective degrees are set, respectively. The degree detection circuits 87 and 88 are constructed so that their count values are decremented by one each time the contents of the registers 81a and 81b storing the coefficient data of the dividend polynomial are shifted.

At the same time, the degree detection circuit 88 checks the syndrome polynomial which is the divisor polynomial to judge whether the coefficient data of the highest degree is 0 or not. When the coefficient data of the highest degree of the divisor polynomial (syndrome polynomial) detected in the degree detection circuit 88 is 0, the Euclidean arithmetic controller 101 controls the registers 81b storing the coefficient data of the divisor polynomial, so that the contents of the registers 81b are shifted (in this case, the adders 86 do not perform the adding operation so that the contents of the registers 81b are shifted as they are) and this shifting operation is repeated until the data of the highest degree is not 0. In this case, the count value of the degree counter of the detection circuit 88 is decremented by one for each shift operation.

The registers 81a which store the coefficient data of the dividend polynomial latch the output of the respective adder 86 when the clock signal is input. The registers 81b which store the coefficient data of the divisor polynomial retain the coefficient data. Although the specific control circuit is not shown in FIG. 28, the configuration for retaining the coefficient data of the divisor polynomial the registers is realized by controlling clock 1 and clock 2 which are to be respectively supplied to the registers 81a and 81b, in the same manner as the fifth embodiment. The arithmetic circuits shown in the figure perform the arithmetics defined over a Galois field.

Hereinafter, referring to FIG. 29, the operation of the divider in the Euclidean arithmetic circuit of the embodiment will be described. FIG. 29(a) shows the state where $Z^{16}$ which is the initial value is set as the dividend polynomial in the registers 81a and the syndrome polynomial S(Z) is set as the divisor polynomial in the registers 81b. The numerals and symbols in the boxes representing the registers indicate the coefficient data stored in the respective registers. In order to simplify the description, it is assumed that, in the embodiment, the highest-degree coefficient of the syndrome polynomial is not 0, and that coefficient data of the highest degree of the polynomials stored in the registers are positioned at the right end. The divider 100 performs the division while setting the outputs of the registers 81a as the divisor and the outputs of the registers 81b as the dividend, and outputs the result of the division. In this case, the clock is supplied to the registers 81a which store the coefficient data of the divisor side.

FIG. 29(b) shows the state where the contents of the registers 81a are shifted once from the state shown in FIG. 29(a). Since the initial value of the dividend side is $Z^{16}$ as indicated in the Euclidean algorithm shown in FIG. 1, the coefficient of the lowest degree of the dividend polynomial is 0. In the circuit configuration of FIG. 28, therefore, the coefficient data of the lowest degree of the remainder polynomial of the dividend polynomial side obtained by the first division is expressed by $$S_0 + 0 \times S_{15} = S_0$$

Hence, it will be noted that the multiplier 85 may be omitted. FIG. 29(b) shows the coefficient data stored in the registers 81a and 81b after the first, division. In the figure, $K_{14}$ to $K_1$ and $S_0$ indicate the coefficient data of the remainder polynomial.

In the same manner as the fifth embodiment, the division is executed by repeating the shift operation until the degree of the remainder of the dividend polynomial becomes smaller than the degree of the divisor polynomial. The end of the division is judged by the Euclidean arithmetic controller 101 on the basis of information indicative of the degrees and output from the degree detection circuits 87 and 88. When the degree detection circuit 87 (or 88) detects the highest degree of the remainder polynomial becoming 0 during the execution of the division, the Euclidean arithmetic controller 101 controls the divider so that the contents of the registers 81a (or 81b) which store the coefficient data of the remainder polynomial are shifted one place as they are. In this case, the count value of the degree counter of the degree detection circuit 87 (or 88) is decremented by one. The reason why this operation is done is as follows: The registers for storing a divisor and a dividend to be supplied to the divider 100 are previously determined. In the case that the coefficient data of a dividend polynomial are used as a divisor, when the highest-degree coefficient of the dividend polynomial is 0, the dividend (the highest-degree coefficient of the divisor polynomial) is caused to be divided by 0, with the result that the solution (output) is indeterminate.

FIG. 29(c) shows the state of the coefficient data stored in the registers 81a and 81b at the completion of the division.

In the figure, $L_{14}$ to $L_c$ stored in the registers 81a are the coefficient data of the remainder polynomial in the division. In the embodiment, $L_0=S_0$. When the division operation is ended, the degree detection circuit 87 (or 88) detects the highest degree of the remainder polynomial. If the highest degree is 0, the coefficients of the remainder polynomial are shifted one place as they are, on the basis of the control signal from the Euclidean arithmetic controller 101. This operation is repeated until the coefficient data of the highest degree of the remainder polynomial is not 0. For each of the operations, as described above, the count value of the degree counter of the degree detection circuit 87 (or 88) is decremented by one.

When the conditions (in the embodiment, the degree of the remainder polynomial is 7 or less) for terminating the Euclidean arithmetic are satisfied judging from information indicative of the degree of the remainder polynomial which is output from the degree detection circuit 87 (or 88), the Euclidean arithmetic controller 10 terminates the Euclidean arithmetic. When the termination conditions are not satisfied, the controller 101 performs the arithmetic while the polynomial which is the divisor polynomial in the previous arithmetic is set as the dividend polynomial and the remainder polynomial as the divisor polynomial. The coefficient data stored in the registers 81a 81b in this case are shown in FIG. 29(d). Unlike the prior art example, the embodiment is not provided with exchange means. Therefore, the connection state in the circuit is not changed, but clock 1 supplied to the registers 81a is stopped and in contrast clock 2 is supplied to the registers 81b. Accordingly, the contents of the registers 81a are retained, and the coefficients of the remainder polynomial are sequentially stored in the registers 81b.

At this time, in the divider in the Euclidean arithmetic circuit, the degree detection circuit 88 judges whether the highest degree of the dividend polynomial (the remainder polynomial) is 0 or not. If 0, control signals are produced so that the contents of the dividend polynomial (the remainder polynomial) stored in the registers 81b are shifted one place as they are.

Figure 29E:
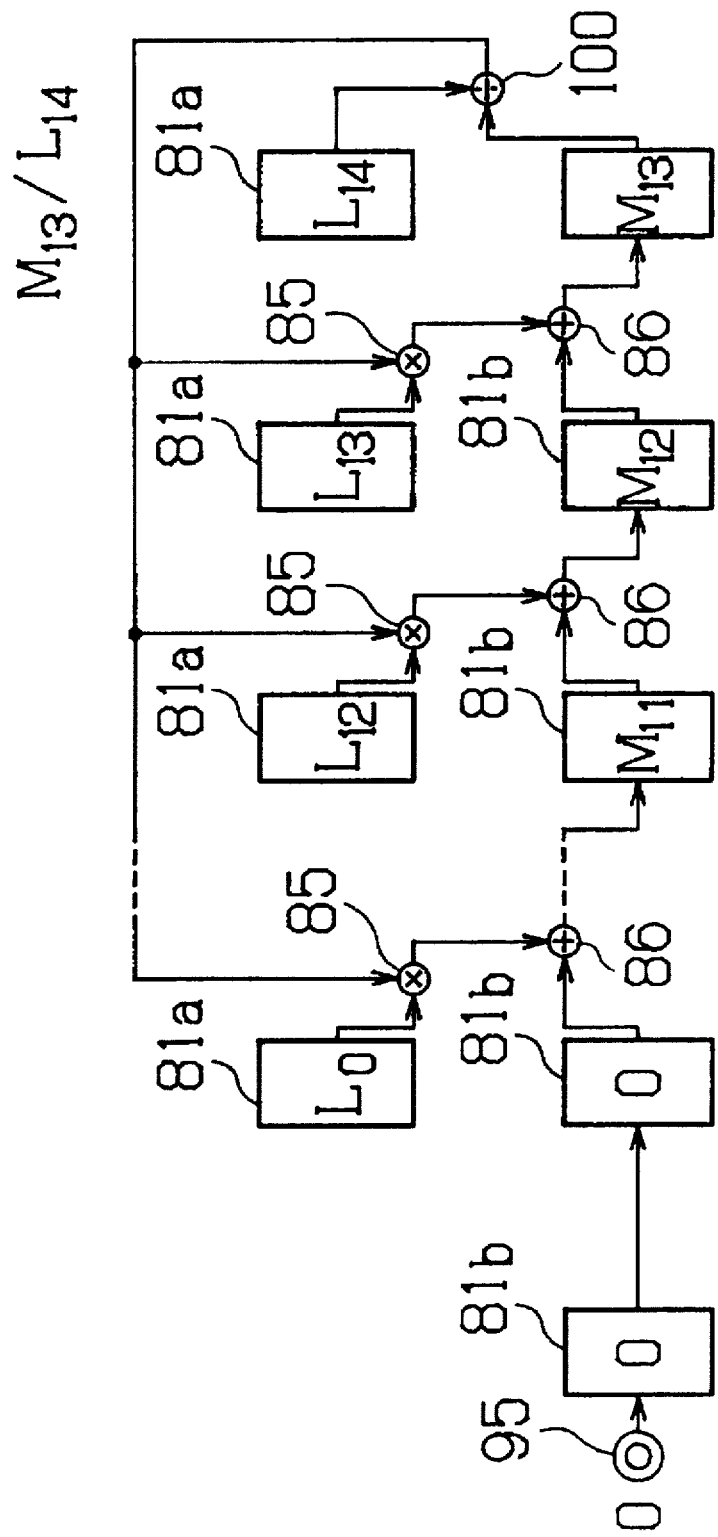
FIG. 29($a$)–($e$) are diagrams illustrating the circuit operation of the divider of FIG. 28.

The division is executed in the same manner as the fifth embodiment by repeating the shift operation while calculating the contents of the registers storing the coefficient data of the dividend polynomial, until the degree of the remainder of the dividend polynomial becomes smaller than the degree of the divisor polynomial. FIG. 29(e) shows the state of the coefficient data stored in the registers 81a and 81b at the completion of the division. In the figure, $M_{13}$ to $M_0$ stored in the registers 81b are the coefficient data of the remainder polynomial.

Then, the degree of the remainder polynomial is checked to judge whether or not the predetermined conditions are satisfied. If not, the clock signal supplied to the registers 81a and 81b is switched to another one, and the division operation in accordance with the Euclidean algorithm is conducted again. This division operation is repeated until the degree of the remainder polynomial is 7 or less. When a Reed-Solomon code is to be decoded, therefore, the division of polynomials over a Galois field in accordance with the Euclidean algorithm can be conducted for each polynomial, thereby improving the speed of the error-correcting process. Since no exchange means (selectors) is provided, the circuit scale can be reduced and the control of such selectors is not necessary. Furthermore, one of the multipliers 85 can be omitted from the configuration of the fifth embodiment, thereby further reducing the circuit scale.

Seventh embodiment

Figure 30:
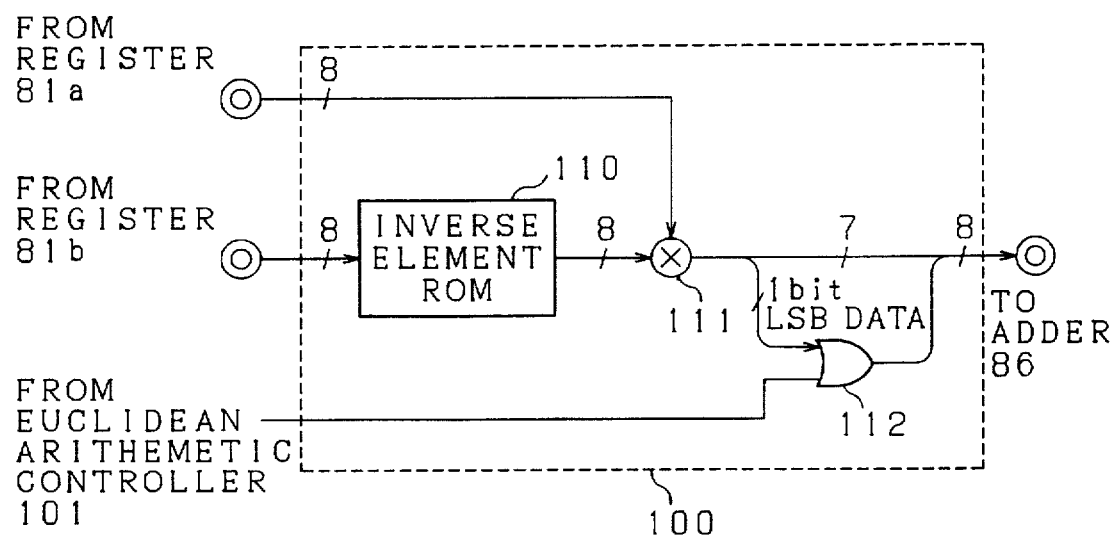
FIG. 30 is a block diagram showing the configuration of a divider in the error-correcting apparatus according to the invention.
Figure 31:
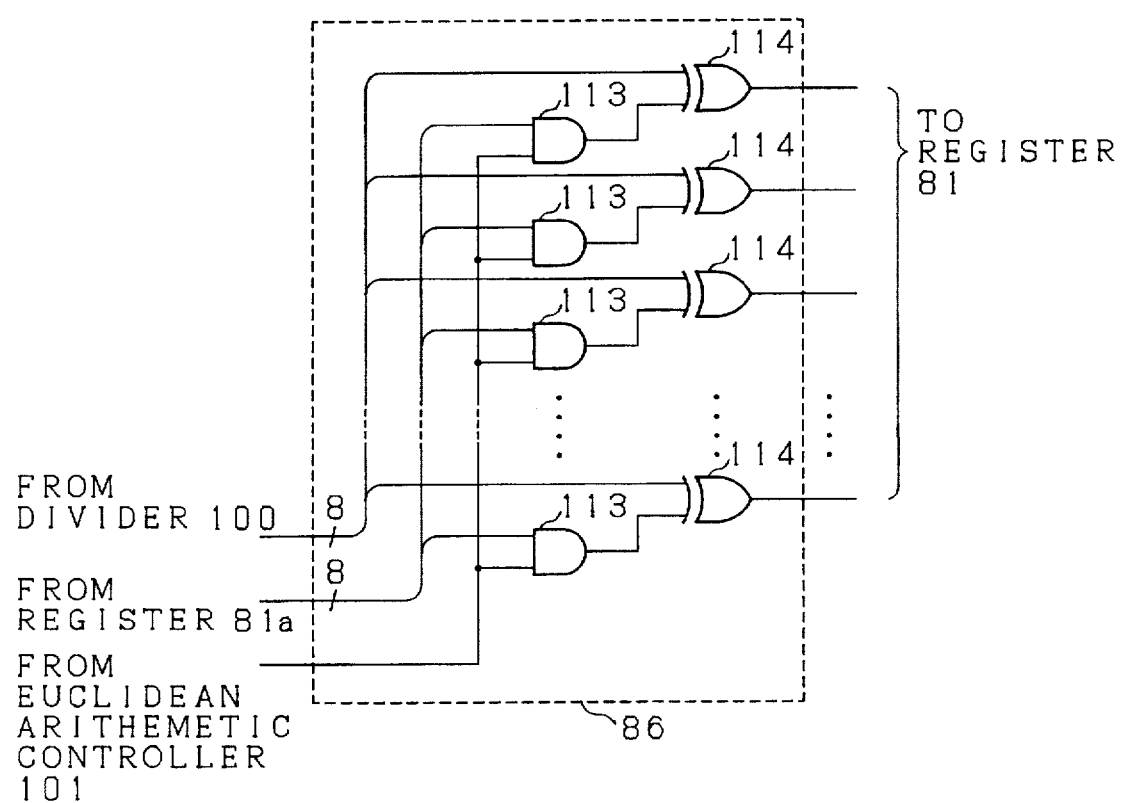
FIG. 31 is a block diagram showing the configuration of an adder in the error-correcting apparatus according to the invention.

The seventh embodiment of the invention is different from the fifth and sixth embodiments in the configuration of the adders 86 and the divider 100 and also in the control method of the Euclidean arithmetic controller 101. Therefore, the seventh embodiment will be described using the divider for the Euclidean arithmetic shown in FIG. 26. FIG. 30 is a diagram showing specifically the configuration of the divider 100. The reference numeral 110 designates an inverse element ROM for outputting the reciprocal of an input coefficient, 111 designates a multiplier, and 112 designates an OR gate. The inverse element ROM 110 is configured so as to output the reciprocals of elements over a Galois field. FIG. 31 shows the configuration of the adder 86. In the figure, 113 designates AND gates, and 114 designates EX-OR gates. The contents of the inverse element ROM 110 of the embodiment are listed in Table 1 below. The symbol α in the table represents an element over a Galois field of a primitive polynomial G(Z). As shown in the table, the inverse element ROM 110 of the embodiment is configured so as to output 0 when 0 is input. The symbol α in the table represents an element over a Galois field defined by GF($2^8$).

[TABLE 1]

| Contents of inverse element ROM | |
|---|---|
| Input data | Output data |
| 0 | 0 |
| 1 | 1 |
| $\alpha^1$ | $\alpha^{254}$ |
| $\alpha^2$ | $\alpha^{253}$ |
| $\alpha^3$ | $\alpha^{252}$ |
| $\alpha^4$ | $\alpha^{251}$ |
| $\alpha^5$ | $\alpha^{250}$ |
| . | . |
| . | . |
| . | . |
| $\alpha^{250}$ | $\alpha^5$ |
| $\alpha^{251}$ | $\alpha^4$ |
| $\alpha^{252}$ | $\alpha^3$ |
| $\alpha^{253}$ | $\alpha^2$ |
| $\alpha^{254}$ | $\alpha^1$ |

Hereinafter, the circuit operation of the seventh embodiment will be described with reference to FIG. 26. In the same manner as the fifth embodiment, the syndrome polynomial S(Z) generated from a reproduced signal is expressed by $$S(Z) = S_{15}Z + S_{14}Z^{14} + S_{13}Z^{13} + \ldots + S_1Z + S_0$$

When the Euclidean arithmetic is started, in response to the Euclidean arithmetic start signal from the Euclidean arithmetic controller 101, the coefficients of the dividend polynomial $Z^{2t}$ which is the initial value are stored in the registers 81a, and the coefficient data of the syndrome polynomial S(Z) which is the divisor polynomial are stored in the registers 81b. In the counters of the degree detection circuits 87 and 88, the values of 16 and 15 which are the initial values of the respective degrees are set, respectively.

At the same time, the degree detection circuit 88 checks the syndrome polynomial which is the divisor polynomial to detect the coefficient data of the highest degree. When the degree of the divisor polynomial (syndrome polynomial) detected in the degree detection circuit 88 is 0, the Euclidean arithmetic controller 101 controls the registers 81b storing the coefficient data of the divisor polynomial, so that the contents of the registers 81b are shifted and this shifting operation is repeated until the data of the highest degree is not 0. In this case, the count value of the degree counter of the degree detection circuit 88 is decremented by one for each shift operation.

At this time, 0 is input as the data of the divisor side to the divider 100. As shown in Table 1, when 0 is input, the inverse element ROM 110 outputs 0. The data output from the inverse element ROM 110 are multiplied by the dividend in the multiplier 111. In this case, since the output data from the inverse element ROM 110 is 0, the output of the multiplier 111 is 0. The OR gate 112 carries out the logical OR of the LSB data from the multiplier 111 and a control signal from the Euclidean arithmetic controller 101. The Euclidean arithmetic controller 101 is configured so as to output "H" when the coefficient data of the highest degree of the polynomial detected by the degree detection circuit 88 is 0. Therefore, the divider 100 outputs 1.

One input terminal of each of the AND gates 113 of the adder 86 is coupled with each bit of the coefficient data output from the registers 81a in which the coefficient data of the dividend side are stored. To the other input terminals of the AND gates 113, input is a control signal from the Euclidean arithmetic controller 101. The control signal has the level of "L", when the coefficient data of the divisor side of the divider 100 detected by the degree detection circuit 88 is 0. According to this configuration, the coefficient data of the divisor side (the side of the registers 81b) input to the divider 100 are subjected to the following arithmetic:

$$1 \times S_j + 0 = S_j (j=0, 1, \ldots, 15)$$

and the shift operation is repeated. The shift operation is repeated until the coefficient data of the highest degree of the divisor polynomial is not 0. Accordingly, the Euclidean arithmetic controller 101 which performs the operation of shifting the coefficient data does not require a special control, and it is necessary to consider only the registers for performing the operation of shifting the coefficients.

When the highest degree of the syndrome polynomial is detected, the division based on the Euclidean algorithm is started. In the same manner as the fifth embodiment, the registers 81a which store the coefficient data of the dividend polynomial latch the output of the respective adders 86 when the clock signal is input. The registers 81b which store the coefficient data of the divisor polynomial retain the coefficient data.

The division operation is repeated until the degree of the remainder of the dividend polynomial becomes smaller than the degree of the divisor polynomial. The end of the division is judged by the Euclidean arithmetic controller 101 on the basis of information indicative of the degrees and output from the degree detection circuits 87 and 88. Even when the degree detection circuit 87 detects the highest degree of the remainder polynomial becoming 0 during the execution of the division, the divider 100 outputs 0. Therefore, the multipliers 85 and the adders 86 conduct the arithmetic of $$0 \times S_i + X_i = X_i$$

and $X_i$ ($X_i$ is the coefficient data stored in the registers 81a) is shifted to the registers 81a as it is and stored therein. Accordingly, the Euclidean arithmetic controller 101 is allowed to repeat the shift operation without changing the manner of control.

When the division operation is ended, the degree detection circuit 87 (or 88) detects the highest degree of the remainder polynomial. If the highest degree is 0, the contents of the registers 81a are shifted as they are. For each of the operations, as described above, the count value of the counter of the degree detection circuit 87 (or 88) is decremented by one.

When the conditions (in the embodiment, the degree of the remainder is 7 or less) for terminating the Euclidean arithmetic are satisfied judging from information indicative of the degree of the remainder polynomial which is output from the degree detection circuit 87 (or 88), the Euclidean arithmetic controller 101 terminates the Euclidean arithmetic. When the termination conditions are not satisfied, the controller 101 performs the arithmetic while the polynomial which is the divisor polynomial in the previous arithmetic is set as the dividend polynomial and the remainder polynomial as the divisor polynomial. Unlike the prior art example, the embodiment is not provided with exchange means. Therefore, the connection state in the circuit is not changed, but clock 1 supplied to the registers 81a is stopped and in contrast clock 2 is supplied to the registers 81b. Accordingly, the contents of the registers 81a are retained, and the coefficients of the remainder polynomial are sequentially stored in the registers 81b.

As described above, the Euclidean arithmetic controller 101 is so configured that, even when the degree detection circuit 88 detects the highest degree (the output of the registers 81b) of the dividend polynomial (the remainder polynomial) being 0, the contents of the registers 81b are shifted only by respectively outputting the control signals of "L" and "H" to the respective adders 86 and the divider 100. Therefore, the divider in the Euclidean arithmetic circuit can be controlled without particularly considering whether the highest-degree coefficient is 0 or not. That is, when the degree detection circuit 88 judges that the coefficient data of the highest degree of the polynomial stored in the registers 81b is 0, the divider 100 outputs 1 as a division result. On the other hand, in the adder 86, the output of the AND gate 113 is turned to "L" in accordance with the control signal from the Euclidean arithmetic controller 101 (namely, 0 is input to the adder 86). Therefore, the multiplier 85 and the adder 86 conduct the arithmetic of $$1 \times Y_i + 0 = Y_i$$

and $Y_i$ ($Y_i$ is the coefficient data stored in the registers 81b) is shifted to the registers 81a as it is and stored therein.

The division is executed in the same manner as the above-described example by repeating the shift operation while calculating the contents of the registers storing the coefficient data of the dividend polynomial, until the degree of the remainder of the dividend polynomial becomes smaller than the degree of the divisor polynomial. The degree of the remainder polynomial is checked to judge whether or not the predetermined conditions are satisfied. If not, the clock signal supplied to the registers 81a and 81b is switched, and the division operation in accordance with the Euclidean algorithm is conducted again. This division operation is repeated until the degree of the remainder polynomial is 7 or less. When a Reed-Solomon code is to be decoded, therefore, the division of polynomials over a Galois field in accordance with the Euclidean algorithm can be conducted for each polynomial, thereby improving the speed of the error-correcting process. The control of the Euclidean arithmetic controller 101 can be greatly simplified so that the circuit scale is reduced.

In the seventh embodiment, the divider 100 has the inverse element ROM 110 and the multiplier 111. The invention is not restricted to this. As far as the divider 100 is configured so as to output 1 when the input divisor is 0, the divider 100 may be composed of logic gates, a microcomputer or the like while attaining the same effects. In the seventh embodiment, the inverse elements of input data are obtained using the ROM. It is needless to say that the inverse elements of input data may be obtained using a RAM or logic gates. The configuration of the adders 86 is not limited to that shown in FIG. 31. The same effects can be attained by configuring the adders 86 so as to output the output of the registers 81b as it is, on the basis of a control signal from the Euclidean arithmetic controller 101. The case for arithmetic over a Galois field defined by $GF(2^8)$ has been described above. The invention is not limited to this, and can attain the same effects for any kind of arithmetic over a Galois field defined by GF (q) (where q is a prime number, or a prime number expressed in a power form). The embodiment wherein the divider has the configuration shown in FIG. 26 has been described. The arrangement wherein the divider has the configuration shown in FIG. 28 can attain the same effects. The seventh embodiment may be applied to the divider 84 and the adders 86 used in the prior art example. It is a matter of course that, also in this case, the control of the Euclidean arithmetic controller 89 can be simplified. In the case that, when the initial value is set, the coefficient data of the highest degree of a syndrome polynomial is 0, the circuit configuration and control for shifting data in the registers 81b until the coefficient data of the highest degree is not 0.

Eighth embodiment

Figure 32:
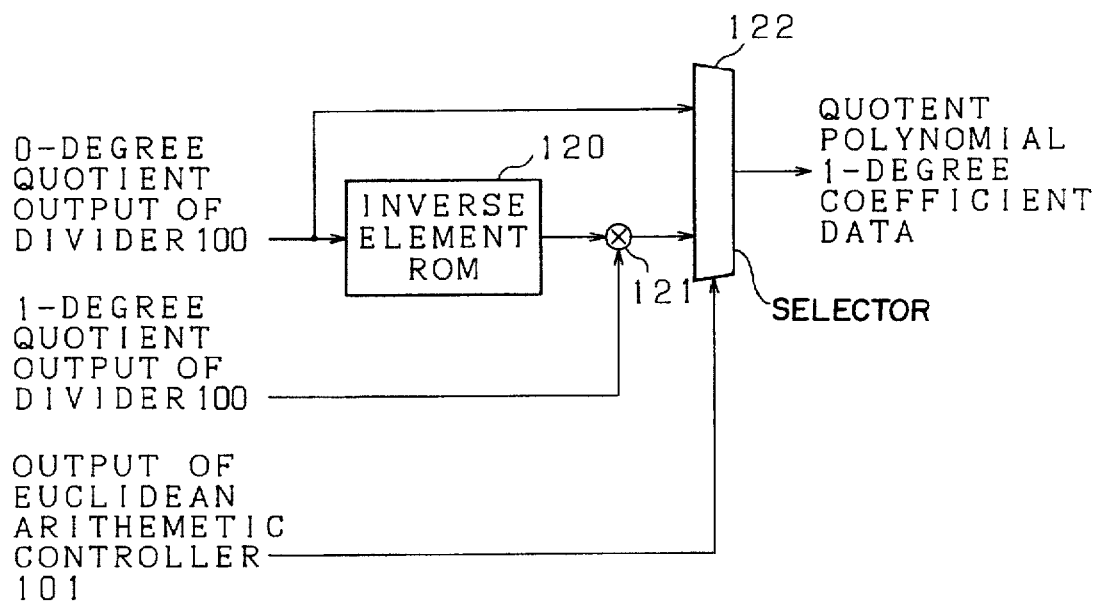
FIG. 32 is a block diagram showing the configuration of error position calculation means in the error-correcting apparatus according to the invention.

Next, the eighth embodiment of the invention will be described. In the embodiment, the divider 100 of the error-correcting apparatus of FIG. 26 is constructed so as to have the configuration shown in FIG. 30. FIG. 32 shows a part of an error position calculating circuit which calculates an error position polynomial using a division result and control signal from the division 100 and the Euclidean arithmetic controller 101. In the figure, 120 designates an inverse element ROM, 121 designates a multiplier, and 122 designates a selector. In the eighth embodiment, in order to simplify the description, it is assumed that, in the process of executing a division over a Galois field, the difference in degree between the dividend polynomial and the division polynomial is one.

When a division of polynomials is performed in the error-correcting apparatus of FIG. 26, data are output as a quotient from the divider 100 in the following two patterns. In one of the patterns, the coefficient data of a dividend polynomial are stored in the registers 81a. In the other pattern, the coefficient data of a dividend polynomial are stored in the registers 81b. The dividend polynomial and divisor polynomial are expressed by Dividend polynomial: M1 $(Z)=A_n Z^n + A_{n-1} Z^{n-1} + \ldots + A_1 Z + A_0$ Divisor polynomial: $M2(Z)=B_{n-1} Z^{n-1} + B_{n-2} Z^{n-2} + \ldots + B_1 Z + B_0$ A division result in the case where the coefficient data of the dividend polynomial are stored in the registers 81a is shown in Eq. 7. A division result in the case where the coefficient data of the dividend polynomial are stored in the registers 81b is shown in Eq. 8.

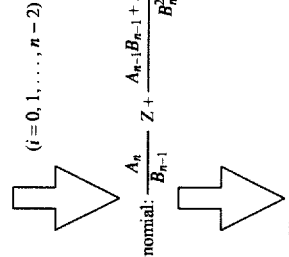

-continued
Coefficient obtained by arithmetic:
$$\frac{B_{n-1}}{A_n} \text{ And } B_{n-1}A_n / \left\{ A_n B_{n-2} + A_{n-1}B_{n-1} \right\}$$
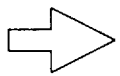
In obtaining coefficient data of error position polynomial
$$\frac{A_n B_{n-1}}{A_{n-1}B_{n-1} + B_{n-2}A_n} Z + 1$$

In the case where the coefficient data of the dividend polynomial are stored in the registers 81a, the division is executed as shown in Eq. 7. When the coefficient data of the error position polynomial are to be calculated, the 0-degree term is normalized (normalized to 1), and then the coefficient data of the error position polynomial are obtained in accordance with the algorithm shown in FIG. 1. In this case, the division result output from the divider 100 corresponds as it is to the coefficient data of the quotient polynomial. A quotient polynomial obtained by normalizing the result is indicated by the expression shown at the bottom of Eq. 7. Similarly, the case where the coefficient data of the dividend polynomial are stored in the registers 81b will be described using Eq. 8 in which the arithmetic procedure at each step is shown. In the right side of Eq. 8, the output of the divider 100 at each step is shown. In this case, the coefficient data from the divider 100 do not coincide with the coefficient data of the quotient polynomial. In comparison with Eq. 7, however, the following will be seen. In the case that an expression normalized in the calculation of the coefficient data of an error position polynomial according to the calculation method of Eq. 8, when the quotient polynomial is a 1-degree polynomial, the output of the divider 100 at step 2 becomes as it is the 1-degree coefficient of the quotient polynomial. On the basis of this, the operation of the circuit of FIG. 32 will be described.

In FIG. 32, to the inverse element ROM 120, input are the coefficients of the 0-degree quotient polynomial which is output from the divider 100 of FIG. 26. One input terminal of the multiplier 121 is coupled to the output of the inverse element ROM 120, and the other input terminal is coupled to the coefficient of the 1-degree quotient polynomial which is output from the divider 100. On the basis of the control signal from the Euclidean arithmetic controller 101, the selector 122 selects the output of the multiplier 121 when the coefficients of the dividend polynomial are stored in the registers 81a, and outputs the coefficient data of the 0-degree quotient polynomial when the coefficient data of the dividend polynomial are stored in the registers 81b.

According to this configuration, in the case (corresponding to Eq. 7) where the coefficient data of the dividend polynomial are stored in the registers 81a, the division result becomes the 1-degree coefficient of the quotient polynomial which is used in the calculation of the error position polynomial, and, in the case (corresponding to Eq. 8) where the coefficient data of the dividend polynomial are stored in the registers 81b, the 0-degree coefficient data output from the divider 100 are output as the 1-degree coefficient data of the quotient polynomial. This allows the quotient polynomial to be normalized, and an error-position polynomial can be calculated by a simple circuit configuration to which only the selector 122 is added. As shown in Eq. 8, when the coefficient data of the dividend polynomial are stored in the registers 81b, the coefficient data can be calculated without performing the division operation, thereby reducing the number of decoding steps.

In the above description, the embodiment deals with a 1-degree polynomial. Although the configuration becomes somewhat complicated, it is possible to deal with a quotient polynomial of degree 2, 3 or more in a relatively simple circuit. Hereinafter, the case of dealing with a quotient polynomial of degree 2 or more will be described. Table 2 below shows a result of a division conducted in the case that the coefficient data of the dividend polynomial are stored in the registers 81a (the case that the coefficient data of the highest degree of the divisor polynomial is dealt as the divisor in the divider 100, or the case of the usual division shown in the prior art example), and a result of a calculation conducted in the case that the coefficient data of the dividend polynomial are stored in the registers 81b (the case that the coefficient data of the highest degree of the divisor polynomial is dealt as the dividend in the divider 100). In both the cases, the dividend and divisor polynomials are expressed by Dividend polynomial: $M1(Z)=A_nZ^n+A_{n-1}Z^{n-1}+ \ldots +A_1Z+A_0$ Divisor polynomial: $M2(Z)=B_{n-2}Z^{n-2}+B_{n-3}Z^{n-3}+ \ldots +B_1Z+B_0$ Also in the embodiment, the divider section for performing the Euclidean arithmetic has the circuit configuration shown in FIG. 26.

[TABLE 2]

| Quotient degree | 2-Degree | 1-Degree | 0-Degree |
| --- | --- | --- | --- |
| ① | $A_n$ | $A_{n-1}B_{n-2} + A_nB_{n-3}$ | $B_{n-2}\{A_{n-2}B_{n-2} + A_nB_{n-4}\} + B_{n-3}\{A_{n-1}B_{n-2} + A_nB_{n-3}\}$ |
|   | $\overline{B_{n-2}}$ | $\overline{\{B_{n-2}\}^2}$ | $\overline{\{b_{n-2}\}^3}$ |
| ② | $B_{n-2}$ | $A_nB_{n-2}$ | $B_{n-2}\{A_{n-1}B_{n-2} + A_nB_{n-3}\}$ |
|   | $\overline{A_n}$ | $\overline{A_{n-1}B_{n-2} + A_nB_{n-3}}$ | $\overline{B_{n-2}\{A_{n-2}B_{n-2} + A_nB_{n-4}\} + B_{n-3}\{A_{n-1}B_{n-2} + A_nB_{n-3}\}}$ |

①: Divisor polynomial is at divisor side of divider 100
②: Divisor polynomial is at dividend side of divider 100

The coefficient data obtained by normalizing the quotient polynomial which has been subjected to the above-mentioned normal division are shown in Eq. 9 below. From this, the followings will be seen when the normalized quotient polynomial is to be obtained in the case that the coefficient data of the dividend polynomial are stored in the registers 81b (the case that the coefficient data of the highest degree of the divisor polynomial is dealt as the dividend in the divider 100). If the quotient data output from the divider 100 are represented by $P_i$ (i=0, 1, . . . k, where k is the degree of the quotient polynomial), and the coefficient data of the quotient polynomial are represented by $Q_i$ (i=0, 1, . . . , where k is the degree of the quotient polynomial), they can be expressed by $$Q_0 = 1$$

$$Q_1 = Q_0 \times P_0$$

$$Q_2 = Q_1 \times P_1$$

.
.
.

$$Q_k = Q_{k-1} \times P_{k-1}$$

A result obtained by calculating the data of the highest degree in the case of a 2-degree polynomial (the case that the coefficient data of the highest degree of the divisor polynomial is dealt as the dividend in the divider 100) is shown in Eq. 10 below.

$$\frac{A_n B_{n-2}^2}{B_{n-2}\{A_{n-2}B_{n-2}+A_n B_{n-4}\}+B_{n-3}\{A_{n-1}B_{n-2}+A_n B_{n-3}\}} x^2 + \quad \text{[Eq. 9]}$$

$$\frac{B_{n-2}\{A_{n-1}B_{n-2}+A_n B_{n-3}\}}{B_{n-2}\{A_{n-2}B_{n-2}+A_n B_{n-4}\}+B_{n-3}\{A_{n-1}B_{n-2}+A_n B_{n-3}\}} x+1$$

$$\frac{B_{n-2}\{A_{n-1}B_{n-2}+A_n B_{n-3}\}}{B_{n-2}\{A_{n-2}B_{n-2}+A_n B_{n-4}\}+B_{n-3}\{A_{n-1}B_{n-2}+A_n B_{n-3}\}} \times \quad \text{[Eq. 10]}$$

$$\frac{A_n B_{n-2}}{A_{n-1}B_{n-2}+A_n B_{n-3}} =$$

$$\frac{A_n B_{n-2}^2}{B_{n-2}\{A_{n-2}B_{n-2}+A_n B_{n-4}\}+B_{n-3}\{A_{n-1}B_{n-2}+A_n B_{n-3}\}}$$

Figure 33:
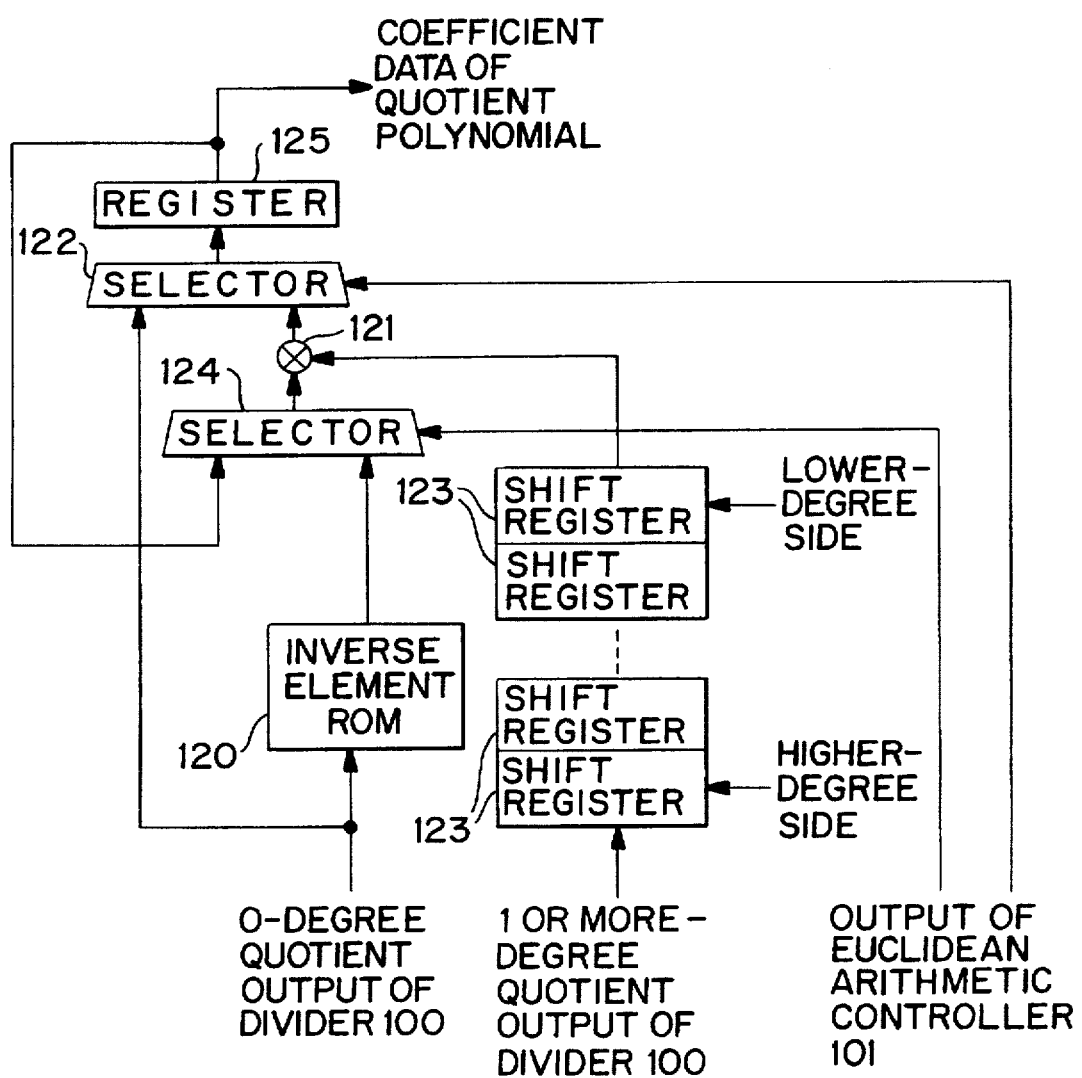
FIG. 33 is a block diagram showing the configuration of other error position calculation means in the error-correcting apparatus according to the invention.

FIG. 33 shows a part of an error position calculating circuit which calculates an error position polynomial and which is designed in due consideration of the calculation of a quotient polynomial of degree 2 or more. In the figure, 120 to 122 designate the components same as those shown in FIG. 32, and therefore their description is omitted. The reference numeral 123 designates a shift register in which the coefficient data (division result) of a quotient polynomial output from the divider 100 are stored according to degree, 124 designates a selector, and 125 designates a register. The inverse element ROM 120, the multiplier 121, the selectors 122 and 124, the shift register 123, and the register 125 constitute the part of the error position calculating circuit.

Next, the operation will be described. In FIG. 33, to the inverse element ROM 120, input is the coefficient of a 0-degree quotient polynomial output from the divider 100 of FIG. 26. In the shift register 123, the coefficient data of a quotient polynomial of degree 1 or more output from the divider 100 of FIG. 26 are stored according to degree. The selector 124 switches the output of the inverse element ROM 120 and that of the register 125, depending on a control signal output from the Euclidean arithmetic controller 101. In the multiplier 121, the output of the shift register 123 is multiplied by that of the selector 124. Each time the multiplier 121 performs the multiplication, in the shift register 123, the data are shifted in sequence.

On the basis of a control signal output from the Euclidean arithmetic controller 101, the selector 122 selects the output of the multiplier 121 in the case that the coefficients of the dividend polynomial are stored in the registers 81a. By contrast, in the case that the coefficients of the dividend polynomial are stored in the registers 81b, the selector 122 allows the coefficient data of a 0-degree polynomial to be output as they are, and selects the output of the multiplier 121 when the coefficients of degree 2 or more of the quotient polynomial are to be calculated. The output of the selector 122 is stored in the register 125. The selector 124 selects the output of the inverse element ROM 120 when the registers 81a shown in FIG. 26 are dealt as the dividend polynomial, and selects that of the register 125 when the registers 81b are dealt as the dividend polynomial.

According to this configuration, when the coefficient data of the dividend polynomial are stored in the registers 81a, results of the division in which the coefficient data of quotient polynomials output from the divider 100 are normalized by 0-degree coefficient data become the quotient polynomial used in the calculation of the error position polynomial. In contrast, when the coefficient data of the dividend polynomial are stored in the registers 81b, the selectors 122 and 124 are controlled in the manner described above so that the above-mentioned arithmetic is executed, thereby allowing the coefficient data of the dividend polynomial to be calculated. Therefore, the error position polynomial can be calculated by a simple circuit configuration in which only the selectors 122 and 124 are added.

The embodiment for dealing with a quotient polynomial of degree 2, 3 or more has been described. Occasionally, coefficient data of a quotient polynomial include 0. A simple circuit configuration can cope with such a case. Although the description may be somewhat complicated, this circuit configuration will be described by illustrating the case where the 1-degree term of a quotient polynomial of degree 2 is 0. Table 3 below shows results of a division conducted in the case that the coefficient data of the dividend polynomial are stored in the registers 81a (the case that the coefficient data of the highest degree of the divisor polynomial is dealt as the divisor in the divider 100, or the case of the usual division shown in the prior art example), and results of a calculation conducted in the case that the coefficient data of the dividend polynomial are stored in the registers 81b (the case that the coefficient data of the highest degree of the divisor polynomial is dealt as the dividend in the divider 100). In both the cases, the dividend and divisor polynomials are expressed as follows:

Dividend polynomial: $M1(Z)=A_n Z^n + A_{n-1}Z^{n-1}+ \ldots +A_1 Z + A_0$

Divisor polynomial: $M2(Z)=B_{n-2}Z^{n-2}+B_{n-3}Z^{n-3}+ \ldots +B_1 Z + B_0$

Also in the embodiment, the division circuit section for performing the Euclidean arithmetic has the circuit configuration shown in FIG. 26. In the description of the embodiment, it is assumed that the 1-degree term of the quotient polynomial is 0.

[TABLE 3]

| Quotient degree | 2-Degree | 1-Degree | 0-degree |
|---|---|---|---|
| Divisor polynomial is at divisor side of divider 100 | $\dfrac{A_n}{B_{n-2}}$ | 0 | $\dfrac{A_{n-2}B_{n-2}+B_{n-4}A_n}{\{B_{n-2}\}^2}$ |
| Divisor polynomial is at dividend side of divider 100 | $\dfrac{B_{n-2}}{A_n}$ | 0 | $\dfrac{A_n B_{n-2}}{A_{n-2}B_{n-2}+B_{n-4}A_n}$ | where $A_{n-1}B_{n-2} + A_n B_{n-3} = 0$

The coefficient data obtained by normalizing the quotient polynomial which has been subjected to the above-mentioned normal division are shown in Eq. 11 below.

$$\text{Quotient polynomial } \frac{A_n B_{n-2}}{A_{n-2}B_{n-2}+B_{n-4}A_n} x^2 + 1 \quad \text{[Eq. 11]}$$

From this, the followings will be seen when the normalized quotient polynomial is to be obtained in the case that, the coefficient data of the dividend polynomial are stored in the registers 81b (the case that the coefficient data of the highest degree of the divisor polynomial is dealt as the dividend in the divider 100). If the quotient data output from the divider 100 are represented by $P_i$ (i=0, 1, . . . , k where k is the degree of the quotient polynomial), the coefficient data of the quotient, polynomial are represented by $Q_i$ (i=0, 1, . . . , k, where k is the degree of the quotient polynomial), and data of $P_j$ to $P_m (0<j \leq m<k)$ are 0, these data can be expressed by $$Q_o = 1$$

$$Q_1 = Q_o \times P_o$$

$$Q_2 = Q_1 \times P_1$$

$$\vdots$$

$$Q_j = 0$$

$$\vdots$$

$$Q_{m+1} = Q_{j-1} \times P_{j-1}$$

$$\vdots$$

$$Q_k = Q_{k-1} \times P_{k-1}$$

Figure 34:
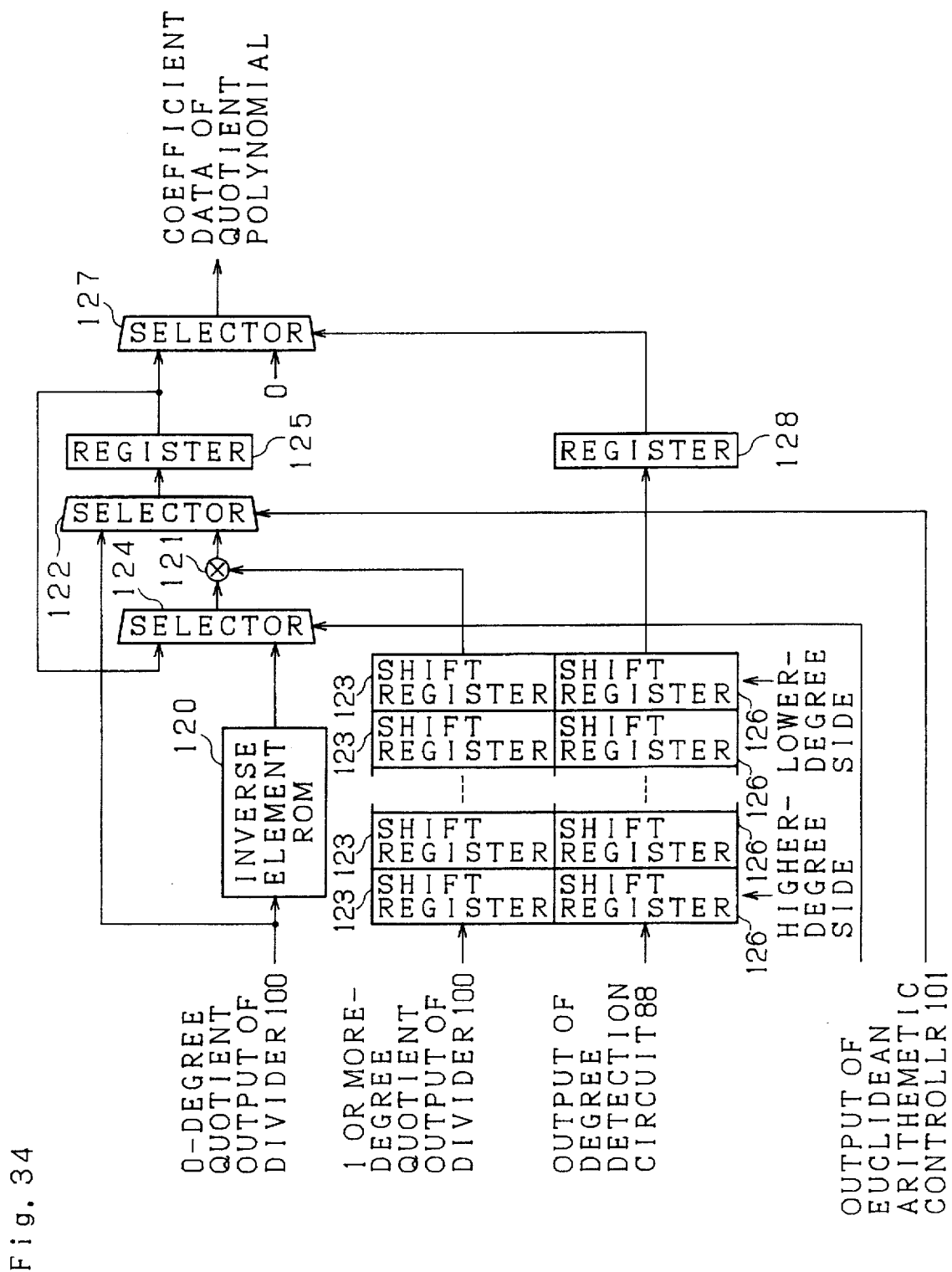
FIG. 34 is a block diagram showing the configuration of further error position calculation means in the error-correcting apparatus according to the invention.

FIG. 34 shows a part of an error position calculating circuit which can cope with a case where the coefficients of the quotient polynomial include 0. In the figure, 120 to 125 designate the components same as those shown in FIG. 33, and therefore their description is omitted. The reference numeral 126 designates a shift register which stores flag data indicating whether the coefficient data of the highest degree detected by the degree detection circuit 88 is 0 or not, when the coefficient data of the dividend polynomial are stored in the registers 81b. The reference numeral 128 designates a register which latches the output of the shift register 126 so that the output is in adequate timing with the data, and 127 designates a selector for selecting either of 0 and the output of the register 125 on the basis of a signal From the register 128. The inverse element ROM 120, the multiplier 121, the selectors 122, 124 and 127, the shift registers 123 and 126, and the registers 125 and 128 constitute the part of the error position calculating circuit. In the description of the embodiment, it is assumed that the divider 100 of FIG. 26 has the configuration shown in FIG. 30, or that, when 0 is input as the data of the divisor side of the divider 100, the divider 100 outputs 1.

Next, the operation will be described. In FIG. 34, to the inverse element ROM 120, input is the coefficient of a 0-degree quotient polynomial output from the divider 100 of FIG. 26. In the shift register 123, the coefficient data of a quotient polynomial of degree 1 or more output from the divider 100 of FIG. 26 are stored according to degree. At the same time, in the case that the registers 81b are dealt as the dividend polynomial, a 0-detection flag (in this embodiment, when 0 is detected, the flag is set to be "H") which is detected in the degree detection circuit 88 is stored in the shift register 126. In the case that the coefficient data stored in the registers 81b are used as the dividend polynomial, the 0-detection flag is output when the highest-degree coefficient of the dividend polynomial is 0. The selector 124 switches the output of the inverse element ROM 120 and that of the register 125, depending on the control signal output from the Euclidean arithmetic controller 101. In the multiplier 121, the output of the shift register 123 is multiplied by that of the selector 124.

Each time the multiplier 121 performs the multiplication, in the shift registers 123 and 126, the data are shifted in sequence. On the basis of the control signal output from the Euclidean arithmetic controller 101, the selector 122 selects the output of the multiplier 121 in the case that the coefficient data of the dividend polynomial are stored in the registers 81a. By contrast, in the case that the coefficient data of the dividend polynomial are stored in the registers 81b, the selector 122 allows the coefficient data of a 0-degree polynomial to be output as they are, and selects the output of the multiplier 121 when the coefficients of degree 2 or more of the quotient polynomial are to be calculated. The output of the selector 122 is stored in the register 125. The selector 124 selects the output of the inverse element ROM 120 when the registers 81a shown in FIG. 26 are dealt as the dividend polynomial, and selects that of the register 125 when the registers 81b are dealt as the dividend polynomial. The register 128 outputs the 0-flag data which have been output from the shift register 126, at the timing coincident with the output timing of the coefficient data of the quotient polynomial.

At first, the case that the coefficient data of the dividend polynomial are stored in the registers 81a will be described. Among the quotient data output from the divider 100, 0-degree quotient data are input to the inverse element ROM 120 and the selector 122, and 1 or more-degree quotient data are stored in the shift register 123. It is assumed that the shift register 126 stores "L", and that, when the data input to the inverse element ROM 120 is 0, this is treated as the error detection in the embodiment (and also in the embodiment described above). The selector 124 selects the output of the inverse element ROM 120, the selector 122 selects the output of the multiplier 121, and the selector 127 selects the output of the register 125. In this case, even when 0 is stored as the coefficient data of the quotient polynomial, the division of 0/(output of the inverse element ROM 120) is executed so that the normalization is executed without requiring any particular operation, thereby executing the normalization in the case that the coefficient data of the dividend polynomial are stored in the registers 81a.

Similarly, the case that the coefficient data of the dividend polynomial are stored in the registers 81b will be described. Among the quotient data output from the divider 100, 0-degree quotient data are input to the inverse element ROM 120 and the selector 122, and 1 or more-degree quotient data are stored in the shift register 123. In this case, the shift register 126 stores the 0-flag data detected by the degree detection circuit 88. In this embodiment, it is assumed that, when the coefficient data of the highest degree of the dividend polynomial stored in the registers 81b is 0, "H" is output. Furthermore, it is assumed that, when the coefficient data of the 0-degree term of the quotient polynomial is 0, the error-correcting apparatus is controlled so as to treat this as the error detection. The selector 124 is controlled so as to select the output of the register 125. On the basis of the control signal from the Euclidean arithmetic controller 101, the selector 122 allows the coefficient data of a 0-degree polynomial to be output as they are, and selects the output of the multiplier 121 when the coefficients of a quotient polynomial degree 1 or more are to be calculated. The output of the selector 122 is stored in the register 125. This allows the multiplier 121 to sequentially execute the multiplication of $Q_i \times P_i$ after the 1-degree coefficient data of the quotient polynomial are output from the selector 122 as the initial value, thereby obtaining the quotient polynomial.

By contrast, in the case that the coefficient data of the quotient polynomial is 0 (namely, the case that the coefficient data of the dividend polynomial input to the divider 100 as the divisor is 0), as described above, the divider 100 outputs 1 as the division output. At the same time, the degree detection circuit 88 outputs the 0-detection flag. When the coefficient data of the quotient polynomial are to be obtained, therefore, the multiplier 121 executes the multiplication of $Q_i \times 1$ and the register 125 stores $Q_i$. The register 128 outputs the 0-flag data which have been output from the shift register 126, at the timing coincident with the output timing of the coefficient data of the quotient polynomial. The shift register 126 outputs the 0-flag data so that the selector 127 selects 0. Then, in the calculation of the next quotient polynomial, the multiplication of $Q_i \times P_i + 1$ is executed.

According to this configuration, the above-described control of the shift register 126 which stores the 0-flag data, and the selectors 122, 124 and 127 allows the above arithmetic to be executed, thereby calculating the coefficient data of the quotient polynomial. Therefore, the error position polynomial can be calculated by a simple circuit configuration in which only the shift register 126 and selectors 122, 124 and 127 are added.

In the eighth embodiment, the error position polynomial calculating circuit for calculating an error position polynomial has the circuit for normalizing a quotient polynomial which has the circuit configuration shown in FIGS. 32 to 34. The portion including the inverse element ROM 120 and the multiplier 121 may serve also as the divider 100, thereby reducing the circuit scale. Alternatively, the shift register 123 may serve also as the registers 81a and 81b so that the circuit scale is reduced.

In the eighth embodiment, the error position polynomial calculating circuit for calculating an error position polynomial has the circuit configuration shown in FIGS. 32 to 34. The invention is not restricted to this. The same effects can be attained in an error-correcting apparatus which has the circuit configuration shown in FIG. 26 or 28, and in which the method of performing the arithmetic in the error position calculating circuit for calculating an error position polynomial is switched depending on whether the polynomial to be input as the dividend to the divider 100 has been a divisor polynomial or a dividend polynomial. In the embodiment, 0-degree coefficient data of a quotient polynomial, is normalized to 1. When the highest-degree coefficient of a quotient polynomial is to be normalized to 1, for example, the quotient polynomial can be obtained in a similar manner by switching the method of performing the arithmetic in the error position calculating circuit for calculating an error position polynomial as described above. The detailed description of the manner of obtaining the quotient polynomial is omitted.

In the eighth embodiment, the circuit configuration shown in FIG. 33 or 34 calculates a quotient polynomial even in the case that the quotient polynomial is of degree 2 or in the case that the division result output from the divider 100 is 0. When the quotient polynomial is of degree more than a certain value, or when the coefficient data output From the divider 100 include 0, the quotient polynomial may not be calculated, and the error detection may be done, whereby the control is simplified and the circuit scale is reduced.

Ninth embodiment

Next, the ninth embodiment of the invention will be described. In the embodiment, the error-correcting apparatus of FIG. 26 is constructed so as to have the configuration which is shown in the block diagram of FIG. 35. The core circuit of the error-correcting apparatus of FIG. 26 is added with selectors to be used in the calculation of a modified syndrome which is required in the erasure correction. In the figure, 81a, 81b, 85 to 88, 95, 100 and 101 designate the same components as those of FIG. 26, and therefore their description is omitted. The reference numerals 130, 131 and 132 designate selectors, and 133 designates an input terminal through which an erasure position is input. In the erasure correction, the coefficient data of a modified syndrome must be stored. Therefore, in order to store the dividend polynomial and the divisor polynomial, the registers 81a and 81b of a number of (the highest degree of the modified syndrome +1) must be provided for each of the dividend and the divisor.

The erasure correction is a method which is used in an error correction in such a case that an error position is known but an error value is not known. In brief, a modified syndrome is calculated from error position data, and the Euclidean algorithm of FIG. 1 is executed on the basis of the modified syndrome to execute an error correction. In this case, the Euclidean algorithm is executed in the same manner as described above except that the termination conditions are changed and a syndrome polynomial is replaced with a modified syndrome polynomial. (For the details of the Euclidean algorithm including an erasure, refer to the above-mentioned "Code Theory" pp. 173–175.

The method of calculating the modified syndrome will be briefly described. The syndrome polynomial S(Z) generated from a reproduced or received signal is expressed by $$S(Z) = S_{15}Z^{15} + S_{14}Z^{14} + S_{13}Z^{13} + \ldots S_1Z + S_0$$

and erasure positions are represented by $\alpha_0 \ldots \alpha_k$. In this case, the modified syndrome S(z)' can be calculated by $$S(z)' = S(z) \times \{(Z+\alpha_0) \times (Z+\alpha_1) \times \ldots \times (Z+\alpha_k)\}$$

Hereinafter, the circuit operation for obtaining the modified syndrome S(Z)' will be described with reference to FIG. 35. When the syndrome generation is ended, the coefficient data of the syndrome polynomial are set to the registers 81b in the core circuit of the Euclidean arithmetic. In this case, depending on the erasure number, the position of the register to which the highest-degree coefficient of the syndrome polynomial is stored is changed. After the coefficient data of the syndrome polynomial are set to the registers 81b, in accordance with control signals output From the Euclidean arithmetic controller 101, the selector 130 is controlled so as to select the error position data, the selectors 131 are controlled so as to select the output of the respective registers 81b, and the selectors 132 are controlled so as to select the coefficient data stored in the registers 81b of the adjacent higher degree. Then, the contents of the registers 81b are shifted to the right, thereby executing the following:

$$S(Z) \times Z + S(Z) \times \alpha_0$$

(where $\alpha_0$ represents the error positions data). Eq. 12 shows a result of a specific longhand calculation.

$$\begin{array}{r} \{S_{15}Z^{15} + S_{14}Z^{14} + S_{13}Z^{13} + \ldots + S_1Z + S_0\} \times Z + \\ \underline{\{S_{15}Z^{15} + S_{14}Z^{14} + S_{13}Z^{13} + \ldots + S_1Z + S_0\} \times \alpha_0} \\ S_{16}'Z^{16} + S_{15}'Z^{15} + S_{14}'Z^{14} + \ldots S_2'Z^2 + S_1'Z^1 + S_0' \end{array} \quad \text{[Eq. 12]}$$

The highest degree $S_{15}$ is not changed even when it is subjected to the arithmetic. Hence, its coefficient is shifted as it is. For the 0-degree coefficient, $S_0 \times \alpha_0$ only is executed. The above operations are sequentially conducted, thereby calculating the modified syndrome. FIG. 36 shows the connection state of the selectors 131 and 132 in the case of calculating a modified syndrome. It should be noted that FIG. 36 shows the connection state of only one part of the circuit of FIG. 35. As seen from the figure, in the embodiment, the registers 81a do not operate in the case of calculating a modified syndrome.

Figure 35:
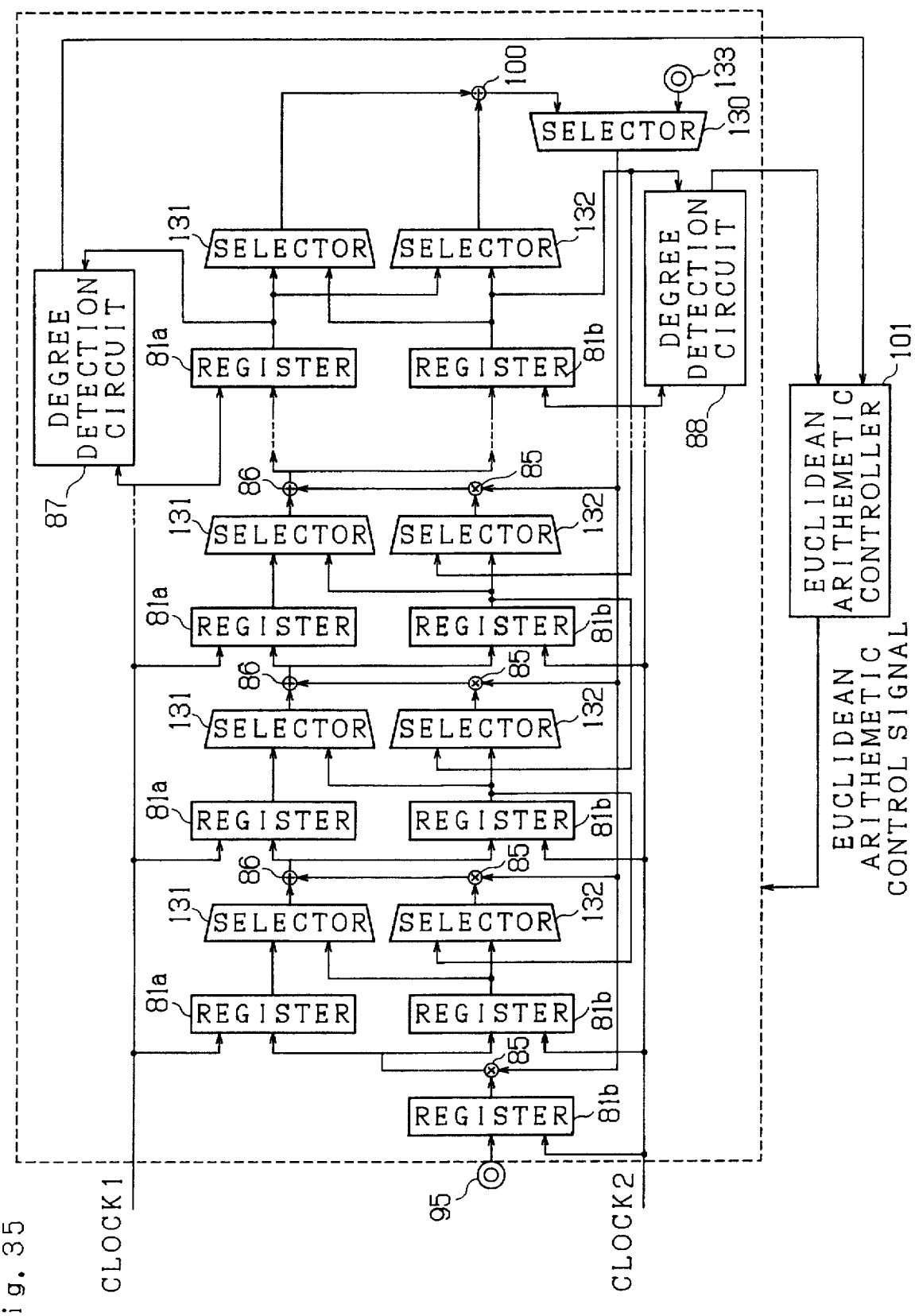
FIG. 35 is a block diagram showing the configuration of a divider for performing the division of polynomials over a Galois field in the Euclidean arithmetic in the error-correcting apparatus according to the invention wherein the erasure correction is considered.
Figure 36:
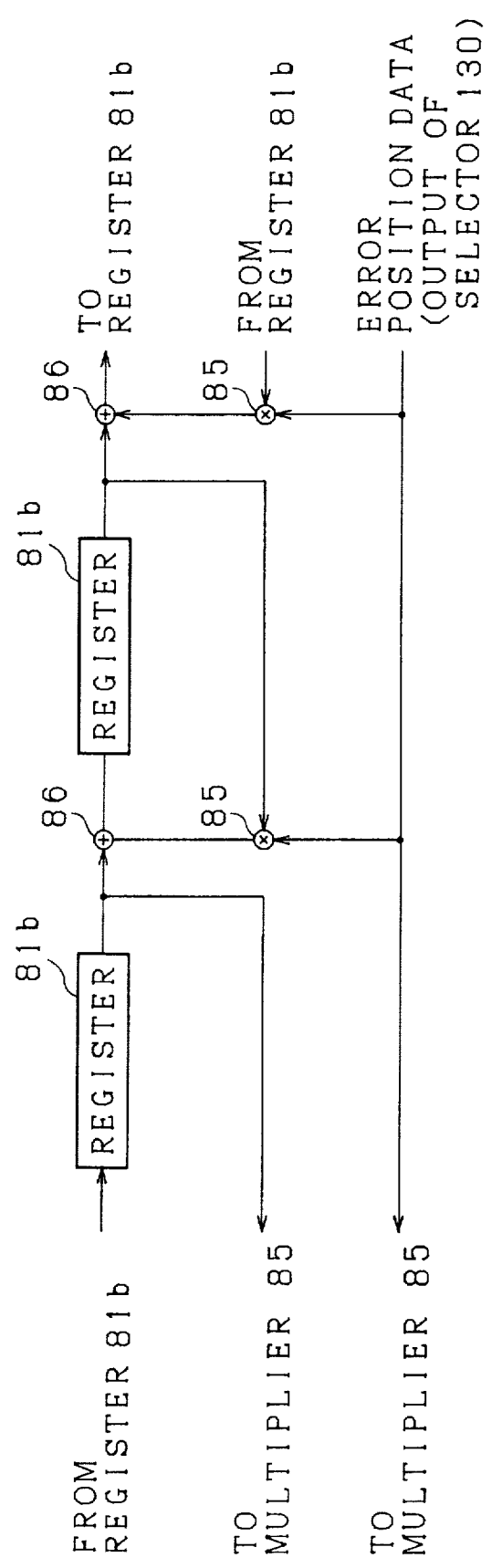
FIG. 36 is a diagram illustrating the circuit operation of the error-correcting apparatus according to the invention.

When the calculation of the modified syndrome is ended, in the core circuit of the error-correcting apparatus of FIG. 35, the selector 130 is switched so as to select the output of the divider 100, and the selectors 131 are switched so as to select the output of the respective registers 81a. Each of the selectors 132 is switched so as to select the output of the register 81b of the same degree, so that the connection state of the components becomes identical with that shown in FIG. 26. In the Euclidean arithmetic controller 101, when the modified syndrome is to be calculated, the termination conditions u is set depending on the erasure number, from $u=t$ to $u=(2\times t+k)/2$ where k is the number of symbols to be subjected to the erasure correction.

When the Euclidean arithmetic is started, in response to a Euclidean arithmetic start signal from the Euclidean arithmetic controller 101, the coefficients of the dividend polynomial $Z^{2t}$ which is the initial value are stored in the registers 81a, and the coefficient data of the modified syndrome polynomial S(Z)' which is the divisor polynomial are stored in the registers 81b. In the counters of the degree detection circuits 87 and 88, the values of 16 and 15 which are the initial values of the respective degrees are set, respectively. The degree detection circuits 87 and 88 are constructed so that their count values are decremented by one, each time the contents of the registers 81 storing the coefficient data of the dividend polynomial are shifted. At the same time, the degree detection circuit 88 checks the modified syndrome polynomial which is the divisor polynomial to judge whether the coefficient data of the highest degree is 0 or not. When the coefficient data of the highest degree of the divisor polynomial (syndrome polynomial) detected in the degree detection circuit 88 is 0, the Euclidean arithmetic controller 101 controls the registers 81b storing the coefficient data of the divisor polynomial, so that the contents of the registers 81b are shifted (in this case, the adders 86 do not perform the adding operation so that the contents of the registers 81b are shifted as they are) and this shifting operation is repeated until the data of the highest degree is not 0. In this case, the count value of the counter of the degree detection circuit 88 is decremented by one for each shift operation.

In the same manner as the fifth embodiment, the registers 81a which store the coefficient data of the dividend polynomial latch the output of the respective adders 86 when the clock signal is input. The registers 81b which store the coefficient data of the divisor polynomial retain the coefficient data. This operation is repeated until the degree of the dividend polynomial becomes smaller than that of the divisor polynomial.

When the conditions for terminating the Euclidean arithmetic which are newly set in the erasure correction are satisfied judging from information indicative of the degree of the remainder polynomial which is output from the degree detection circuit 87 (or 88), the Euclidean arithmetic controller 101 terminates the Euclidean arithmetic. When the termination conditions are not satisfied, the controller 101 performs the arithmetic while the polynomial which is the divisor polynomial in the previous arithmetic is set as the dividend polynomial and the remainder polynomial as the divisor polynomial. Unlike the prior art example, the embodiment is not provided with exchange means. Therefore, the connection state in the circuit is not changed, but clock 1 supplied to the registers 81a is stopped and in contrast clock 2 is supplied to the registers 81b. Accordingly, the contents of the registers 81a are retained, and the coefficients of the remainder polynomial are sequentially stored in the registers 81b.

At this time, in the divider in the Euclidean arithmetic circuit, the degree detection circuit 88 judges whether the highest degree of the dividend polynomial (the remainder polynomial) is 0 or not. If 0, control signals are produced so that the contents of the dividend polynomial (the remainder polynomial) stored in the registers 81b are shifted one place as they are. The reason why this operation is done is as follows: The registers for storing a divisor and dividend to be supplied to the divider 100 are previously determined. In the case that the coefficient data of a dividend polynomial are used as a divisor, when the highest-degree coefficient of the dividend polynomial is 0, the dividend (the highest-degree coefficient of the divisor polynomial) is caused to be divided by 0, with the result that the solution (output) is indeterminate. Since the divider 100 has the configuration shown in FIG. 30, the division operation can be performed without particularly considering whether the highest-degree coefficient is 0 or not.

The division is executed in the same manner as the above-described example by repealing the shift operation while calculating the contents of the registers storing the coefficient data of the dividend polynomial, until the degree of the remainder of the dividend polynomial becomes smaller than the degree of the divisor polynomial. The degree of the remainder polynomial is checked to judge whether or not the predetermined conditions are satisfied. If not, the clock signal supplied to the registers 81a and 81b is switched, and the division operation in accordance with the Euclidean algorithm is conducted again. When a Reed-Solomon code is to be decoded, therefore, the division of polynomials over a Galois field in accordance with the Euclidean algorithm wherein the erasure correction is considered can be conducted for each polynomial, thereby improving the speed of the error-correcting process. Since no exchange means (selectors) is provided, the circuit scale can be reduced and the control of such selectors is not necessary.

In the above-described embodiments 5 to 9, a Reed-Solomon code having the minimum Hamming distance of 17 which is employed in an optical disk or the like is decoded. The invention is not restricted to this. The same effects can be attained for a code having the minimum Hamming distance other than 17. In the circuit configuration shown in the embodiments, Reed-Solomon codes of two or more kinds having the different minimum Hamming distances can be decoded. For example, a Reed-Solomon code having the form of a product code can be decoded by a circuit which has the same configuration but in which only the initial value and termination conditions of the Euclidean algorithm are changed.

In the embodiments, a Reed-Solomon code is used as an error-correcting code. Another linear error-correcting code such as a BCH code may be decoded using the above-described divider, while attaining the same effects.

In the embodiments, the shifting and data retaining operations of the registers 81a and 81b during the division are executed by controlling clock 1 and 2. The invention is not restricted to this. For example, selectors may be connected at the inputs of the registers 81a and 81b, and the selectors are controlled so that the registers of the divisor side latch the outputs of themselves and the registers of the dividend side latch the outputs of the adders 86.

The manner of conducting the decision about the exchange of a dividend and a divisor is not limited to the method in which the difference between the degrees of polynomials output From the degree detection circuits 87 and 88 is detected. For example, another method may be employed in which the difference between the degree of a dividend polynomial and that of a divisor polynomial is previously obtained before the start of the division, and, on the basis of this information, the number of shifting operations of the divider is uniquely decided to perform the division without detecting the difference between the degrees.

In the embodiments, when the degree of a syndrome polynomial, a remainder polynomial or the like is to be detected, the degree detection circuits 87 and 88 are connected only to those of the registers 81$a$ and 81$b$ which store the highest-degree coefficient. The invention is not restricted to this. For example, each of the registers 81 which store coefficient data may be provided with a coefficient judging circuit (for judging whether the coefficient data is 0 or not), thereby judging the degree.

It is a matter of course that the above-described circuit configuration may be applied to a method other than the Euclidean algorithm, such as the remainder decoding. The detailed description of the alternative is omitted.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An error-correcting apparatus for performing error correction using an error-correcting code which is a linear code added to an input signal, comprising:

syndrome generation means for generating a syndrome from the input signal;

arithmetic means for calculating an error position polynomial and an error value polynomial based on the syndrome generated by said syndrome generation means;

error position calculation means for calculating an error position from the error position polynomial calculated by said arithmetic means;

correction means for deriving an error value from the error position calculated by said error position calculation means and the error value polynomial calculated by said arithmetic means, and for performing the error correction on erroneous data in the input signal using the error position and the error value; and control means for controlling at least said syndrome generation means, said arithmetic means and said error position calculation means to operate in parallel.

2. The error-correcting apparatus of claim 1, wherein a frequency of a clock signal for driving said syndrome generation means and said error position calculation means is higher than a frequency of a clock signal for driving said arithmetic means.

3. The error-correcting apparatus of claim 1, wherein a number of decoding steps performed by said arithmetic means is substantially equal to a number of decoding steps performed by said syndrome generation means or performed by said error position calculation means.

4. An error-correcting apparatus for performing error correction using an error-correcting code which is a linear code added to an input signal, comprising:

storage means for temporarily storing the input signal;

syndrome generation means for generating a syndrome based on the input signal;

arithmetic means for calculating an error position polynomial and an error value polynomial based on the syndrome generated by said syndrome generation means;

error position calculation means for calculating an error position from the error position polynomial calculated by said arithmetic means;

correction means for deriving an error value from the error position calculated by said error position calculation means and the error value polynomial calculated by said arithmetic means, and for performing the error correction on erroneous data in the input signal using the error position and the error value; and control means for, when said correction means performs the error correction, controlling said correction means so that an operation is repeated until all the erroneous data is corrected, such that more than two erroneous data positions are successively read out from said storage means and the at least two erroneous data positions are thereafter sequentially replaced with error-corrected data.

5. The error-correcting apparatus of claim 1, wherein said syndrome generation means, said arithmetic means for calculating an error position polynomial and an error value polynomial, said error portion calculation means, and said error correction means operate in parallel".

6. The error-correcting apparatus of claim 1, further comprising storage means for storing the input signal;

said syndrome generating means reading the input signal from said storage means prior to generation of the syndrome.

7. The error-correction apparatus of claim 1, wherein said syndrome generation means, said arithmetic means, and said error position calculation means begin operation virtually simultaneously.

8. The error-correcting apparatus of claim 6, wherein said storage means is one of a RAM, SRAM, and DRAM.

9. A method of performing error correction using an error-correcting code which is a linear code added to an input signal, comprising the steps of:

(a) generating a syndrome from the input signal;

(b) determining an error position polynomial and an error value polynomial based on the syndrome;

(c) determining an error position from the error position polynomial; and (d) deriving an error value from the error position and the error value polynomial, and for performing the error correction on erroneous data in the input signal using the error position and the error value;

wherein at least steps (a), (b), and (c) are performed concurrently.

10. The method of claim 9, wherein a frequency of a clock signal for performing said step (a) and said step (c) is higher than a frequency of a clock signal for performing said step (b).

11. The method of claim 9, wherein a number of decoding steps performed by said step (b) is substantially equal to a number of decoding steps performed by said step (a) or performed by said step (c).

12. The method of claim 9, wherein said steps (a), (b), and (c) are performed concurrently in a single error-correcting apparatus.

13. A method of performing error correction using an error-correcting code which is a linear code added to an input signal, comprising the steps of:

(a) storing the input signal;

(b) generating a syndrome from the input signal;

(c) determining an error position polynomial and an error value polynomial based on the syndrome;

(d) determining an error position from the error position polynomial; and (e) deriving an error value from the error position and the error value polynomial and for performing the error correction on erroneous data in the input signal using the error position and the error value;

wherein said step (e) is performed so that an operation is repeated until all the erroneous data is corrected, such that more than two erroneous data positions are successively read out and the more than two erroneous data positions are thereafter sequentially replaced with error-corrected data.

* * * * *

UNITED STATES PATENT AND TRADEMARK OFFICE
CERTIFICATE OF CORRECTION

PATENT NO. : 5,504,758
DATED : April 2, 1996
INVENTOR(S) : Inoue et al.

It is certified that error appears in the above-indentified patent and that said Letters Patent is hereby corrected as shown below:

Column 60,

Claim 5, line 18, delete "parallel"." and insert --parallel.--

Claim 6, line 21, delete "generating" and insert --generation--.

Signed and Sealed this

Tenth Day of December, 1996

Attest:

BRUCE LEHMAN

Attesting Officer

Commissioner of Patents and Trademarks